(12) United States Patent  (10) Patent No.: US 7,605,029 B2
Nakamura et al.  (45) Date of Patent: Oct. 20, 2009

(54) METHOD OF MANUFACTURING SEMICONDUCTOR DEVICE

(75) Inventors: Osamu Nakamura, Atsugi (JP); Shunpei Yamazaki, Setagaya (JP); Koji Dairiki, Atsugi (JP); Masayuki Kajiwara, Atsugi (JP); Junichi Koezuka, Atsugi (JP); Satoshi Murakami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/410,274

(22) Filed: Apr. 25, 2006

(65) Prior Publication Data

US 2006/0270128 A1 Nov. 30, 2006

Related U.S. Application Data

(62) Division of application No. 11/061,780, filed on Feb. 22, 2005, now Pat. No. 7,033,871, which is a division of application No. 10/046,893, filed on Jan. 17, 2002, now Pat. No. 6,858,480.

(30) Foreign Application Priority Data

Jan. 18, 2001 (JP) ............................. 2001-010890
Jan. 29, 2001 (JP) ............................. 2001-019357
Jan. 30, 2001 (JP) ............................. 2001-022398

(51) Int. Cl.
*H01L 21/00* (2006.01)
(52) U.S. Cl. .................... 438/162; 438/166; 438/473; 438/486; 257/E21.4; 257/E21.475

(58) Field of Classification Search ................ 438/162, 438/166, 473, 486
See application file for complete search history.

(56) References Cited

U.S. PATENT DOCUMENTS 3,535,775 A 10/1970 Garfinkel et al.
4,371,403 A 2/1983 Ikubo et al.

(Continued)

FOREIGN PATENT DOCUMENTS

EP 0 651 431 5/1995

(Continued)

OTHER PUBLICATIONS

A. Ourmazd, *Gettering of Impurities in Silicon*, Mat. Res. Soc. Symp. Proc., vol. 59, 1986, pp. 331-340.

(Continued)

*Primary Examiner*—Hsien-ming Lee
(74) *Attorney, Agent, or Firm*—Eric J. Robinson; Robinson Intellectual Property Law Office, P.C.

(57) ABSTRACT

According to the present invention, an impurity region, to which a rare gas element (also called a rare gas) and one kind or a plurality of kinds of elements selected from the group consisting of H, $H_2$, O, $O_2$, and P are added, are formed in a semiconductor film having a crystalline structure, using a mask, and gettering for segregating a metal element contained in the semiconductor film to the impurity region by heat treatment. Thereafter, patterning is conducted using the mask, whereby a semiconductor layer made of the semiconductor film having a crystalline structure is formed.

18 Claims, 36 Drawing Sheets

U.S. PATENT DOCUMENTS

| | | |
|---|---|---|
| 4,477,308 A | 10/1984 | Gibson et al. |
| 4,529,621 A | 7/1985 | Ballard |
| 4,534,820 A | 8/1985 | Mori et al. |
| 5,244,819 A | 9/1993 | Yue |
| 5,270,264 A | 12/1993 | Andideh et al. |
| 5,275,896 A | 1/1994 | Garofalo et al. |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,712,203 A | 1/1998 | Hsu |
| 5,744,824 A | 4/1998 | Kousai et al. |
| 5,753,560 A | 5/1998 | Hong et al. |
| 5,767,530 A | 6/1998 | Ha |
| 5,773,327 A | 6/1998 | Yamazaki et al. |
| 5,789,284 A | 8/1998 | Yamazaki et al. |
| 5,814,540 A | 9/1998 | Takemura et al. |
| 5,821,562 A | 10/1998 | Makita et al. |
| 5,840,590 A | 11/1998 | Myers, Jr. et al. |
| 5,843,225 A | 12/1998 | Takayama et al. |
| 5,843,833 A | 12/1998 | Ohtani et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 5,994,172 A | 11/1999 | Ohtani et al. |
| 6,013,544 A | 1/2000 | Makita et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,057,557 A | 5/2000 | Ichikawa |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,245 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,157,421 A | 12/2000 | Ishii |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,335,541 B1 | 1/2002 | Ohtani et al. |
| 6,337,259 B1 | 1/2002 | Ueda et al. |
| 6,355,509 B1 | 3/2002 | Yamazaki |
| 6,376,336 B1 | 4/2002 | Buynoski |
| 6,383,852 B2 | 5/2002 | Zhang et al. |
| 6,391,690 B2 | 5/2002 | Miyasaka |
| 6,396,147 B1 | 5/2002 | Adachi et al. |
| 6,426,276 B1 | 7/2002 | Ohnuma et al. |
| 6,461,943 B1 | 10/2002 | Yamazaki et al. |
| 6,465,288 B1 | 10/2002 | Ohnuma |

| | | |
|---|---|---|
| 6,478,902 B2 | 11/2002 | Koenigsmann et al. |
| 6,479,333 B1 | 11/2002 | Takano et al. |
| 6,504,174 B1 | 1/2003 | Yamazaki et al. |
| 6,518,102 B1 | 2/2003 | Tanaka et al. |
| 6,528,358 B1 | 3/2003 | Yamazaki et al. |
| 6,542,143 B1 | 4/2003 | Ozawa |
| 6,551,907 B2 | 4/2003 | Ohtani |
| 6,555,448 B2 | 4/2003 | Fukushima |
| 6,592,771 B1 | 7/2003 | Yamanaka et al. |
| 6,599,785 B2 | 7/2003 | Hamada et al. |
| 6,605,497 B2 | 8/2003 | Yamazaki et al. |
| 6,620,711 B2 | 9/2003 | Yamazaki |
| 6,670,225 B2 | 12/2003 | Ohnuma |
| 6,713,323 B2 | 3/2004 | Yamazaki et al. |
| 6,756,608 B2 | 6/2004 | Kasahara et al. |
| 6,787,407 B2 | 9/2004 | Nakamura et al. |
| 6,787,807 B2 * | 9/2004 | Yamazaki et al. ............ 257/65 |
| 6,821,827 B2 | 11/2004 | Nakamura et al. |
| 6,825,532 B2 | 11/2004 | Linn et al. |
| 6,830,617 B1 | 12/2004 | Ohtani et al. |
| 6,855,580 B2 | 2/2005 | Tanaka et al. |
| 6,858,480 B2 | 2/2005 | Nakamura et al. |
| 6,890,805 B2 | 5/2005 | Yamazaki et al. |
| 7,033,871 B2 | 4/2006 | Nakamura et al. |
| 7,045,444 B2 * | 5/2006 | Yamazaki et al. ........... 438/471 |
| 7,115,452 B2 | 10/2006 | Yamazaki et al. |
| 7,384,860 B2 | 6/2008 | Nakamura et al. |
| 2001/0026964 A1 | 10/2001 | Yamazaki et al. |
| 2001/0034088 A1 | 10/2001 | Nakamura et al. |
| 2002/0040981 A1 | 4/2002 | Yamazaki et al. |
| 2002/0053670 A1 | 5/2002 | Ohtani et al. |
| 2002/0084261 A1 * | 7/2002 | Yamazaki ................... 219/390 |
| 2002/0094612 A1 | 7/2002 | Nakamura et al. |
| 2002/0098628 A1 | 7/2002 | Hamada et al. |
| 2002/0102764 A1 | 8/2002 | Yamazaki et al. |
| 2002/0102776 A1 | 8/2002 | Yamazaki et al. |
| 2002/0125480 A1 | 9/2002 | Nakamura et al. |
| 2002/0134981 A1 | 9/2002 | Nakamura et al. |
| 2002/0151120 A1 | 10/2002 | Yamazaki et al. |
| 2002/0155652 A1 | 10/2002 | Yamazaki et al. |
| 2002/0182783 A1 | 12/2002 | Takayama et al. |
| 2002/0182785 A1 | 12/2002 | Miyairi |
| 2002/0182828 A1 | 12/2002 | Asami et al. |
| 2002/0197785 A1 | 12/2002 | Yamazaki et al. |
| 2003/0008439 A1 | 1/2003 | Ohnuma |
| 2003/0082859 A1 | 5/2003 | Ichijo et al. |
| 2003/0089911 A1 | 5/2003 | Kasahara et al. |
| 2003/0094625 A1 | 5/2003 | Yamazaki et al. |
| 2003/0122129 A1 | 7/2003 | Yamazaki et al. |
| 2003/0211669 A1 | 11/2003 | Yamazaki et al. |
| 2004/0180512 A1 | 9/2004 | Linn et al. |
| 2005/0037554 A1 | 2/2005 | Ohtani et al. |
| 2005/0189592 A1 | 9/2005 | Yamazaki et al. |

FOREIGN PATENT DOCUMENTS

| | | |
|---|---|---|
| EP | 0 840 367 | 5/1998 |
| JP | 05-109737 | 4/1993 |
| JP | 07-130652 | 5/1995 |
| JP | 07-183540 | 7/1995 |
| JP | 07-307286 | 11/1995 |
| JP | 08-078329 | 3/1996 |
| JP | 08-236471 | 9/1996 |
| JP | 08-330602 | 12/1996 |
| JP | 08-339960 | 12/1996 |
| JP | 09-045616 | 2/1997 |
| JP | 09-074207 | 3/1997 |
| JP | 10-135226 | 5/1998 |
| JP | 10-214973 | 8/1998 |
| JP | 10-223533 | 8/1998 |
| JP | 10-223534 | 8/1998 |
| JP | 11-297703 | 10/1999 |
| JP | 3032801 | 4/2000 |
| JP | 2000-133594 | 5/2000 |
| JP | 2000/260777 | 9/2000 |
| JP | 2000-340504 | 12/2000 |
| JP | 2001/210828 | 8/2001 |
| JP | 2001-250777 | 9/2001 |
| JP | 2002-217106 | 8/2002 |
| KR | 1997-053622 | 7/1997 |
| KR | 1997-060391 | 8/1997 |
| KR | 1999-014341 | 2/1999 |
| KR | 1999-037169 | 5/1999 |

OTHER PUBLICATIONS

A. Ourmazd, *Getting of Metallic Impurities in Silicon*, Mat. Res. Soc. Symp. Proc., vol. 36, 1985, pp. 25-30.

E. Colas, et al., *Quantitative Study of Metal Gettering in Silicon*, Mat. Res. Soc. Symp. Proc., vol. 59, 1986, pp. 341-346.

K. Graff et al., *Palladium-Test: A Tool to Evaluate Gettering Efficiency*, Mat. Res. Soc. Symp. Proc., vol. 36, 1985, pp. 19-24.

Masayasu Miyake et al., *Characteristics of Buried-Channel pMOS Devices with Shallow Counter-Doped Layers Fabricated Using Channel Preamorphization*, IEEE Transactions on Electron Devices, vol. 43, No. 3, Mar. 1996, pp. 444-449.

Lurng S. Lee et al., *Argon Ion-Implantation on Polysilicon or Amorphous-Silicon for Boron Penetration Suppression in p+ pMOSFET*, IEEE Transactions on Electron Devices, vol. 45, No. 8, Aug. 1998, pp. 1737-1744.

Kevin S. Jones et al., *Boron Diffusion Upon Annealing of Laser Thermal Processed Silicon*, Ion Implantation Technology 2000, IEEE 2000, pp. 111-114.

D.J. Llewellyn et al., *Implantation and Annealing of CU in InP for Electrical Isolation: Microstructural Characterisation*, Optoelectronic and Microelectronic Materials and Devices Proceedings, IEEE 1997, pp. 313-316.

\* cited by examiner

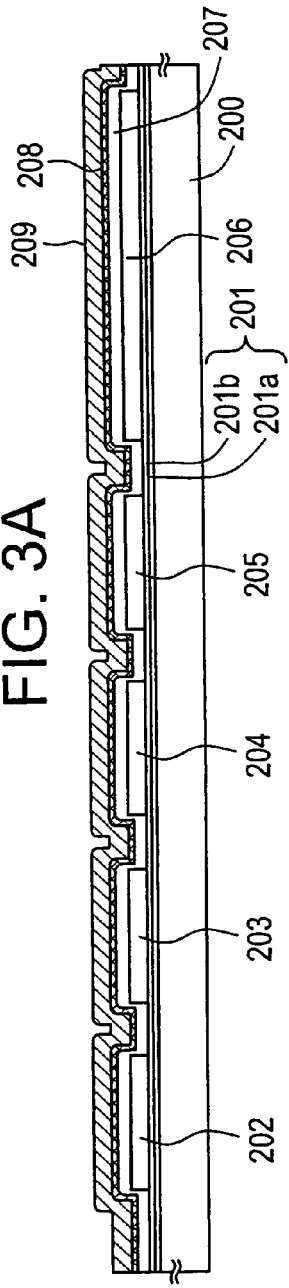
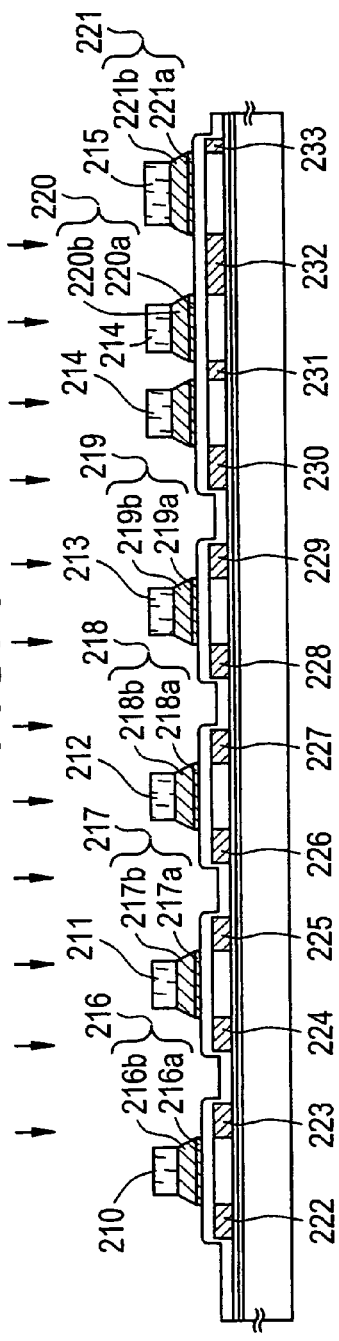
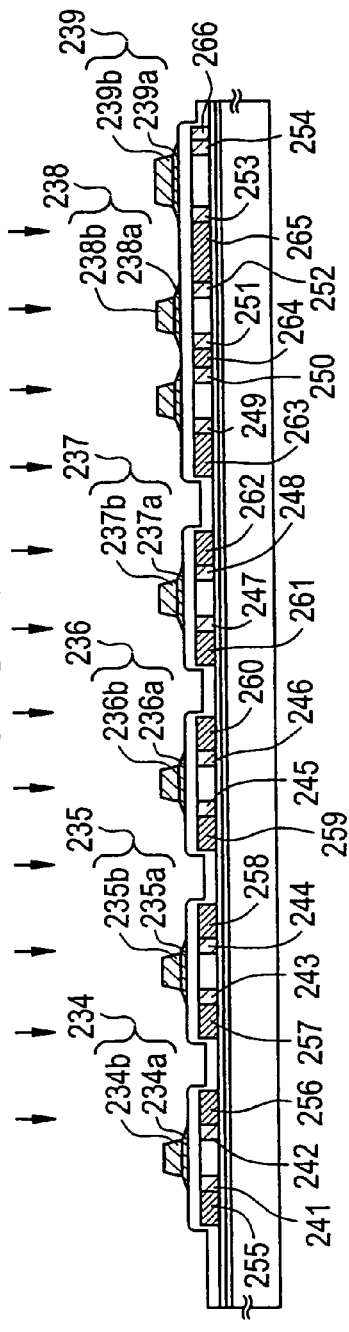

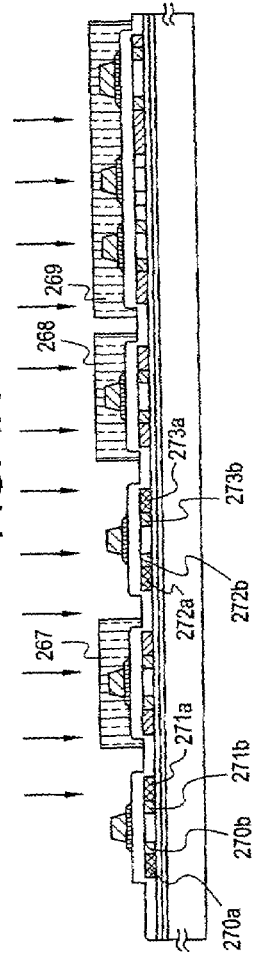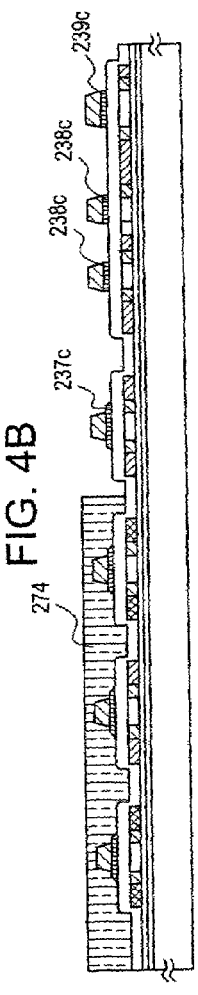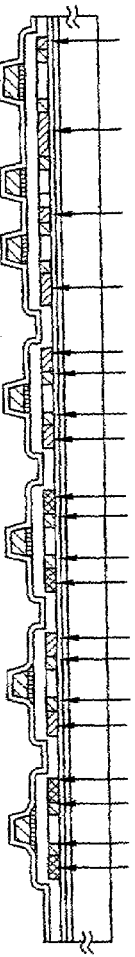

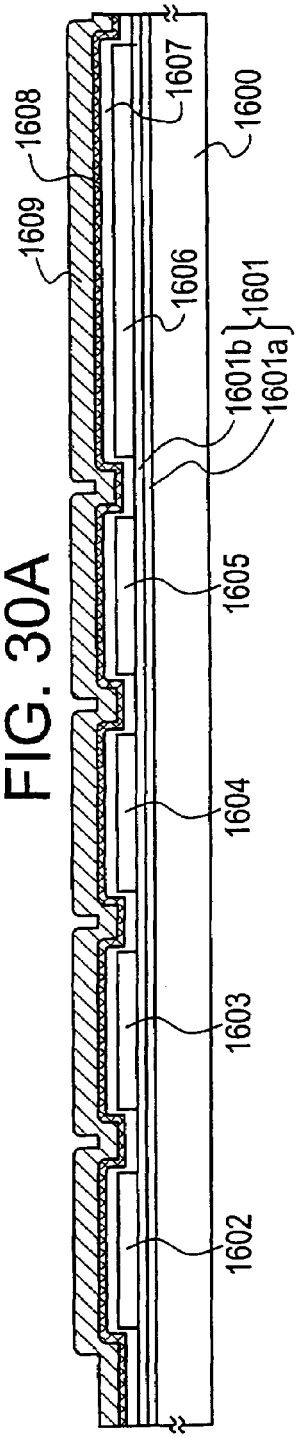
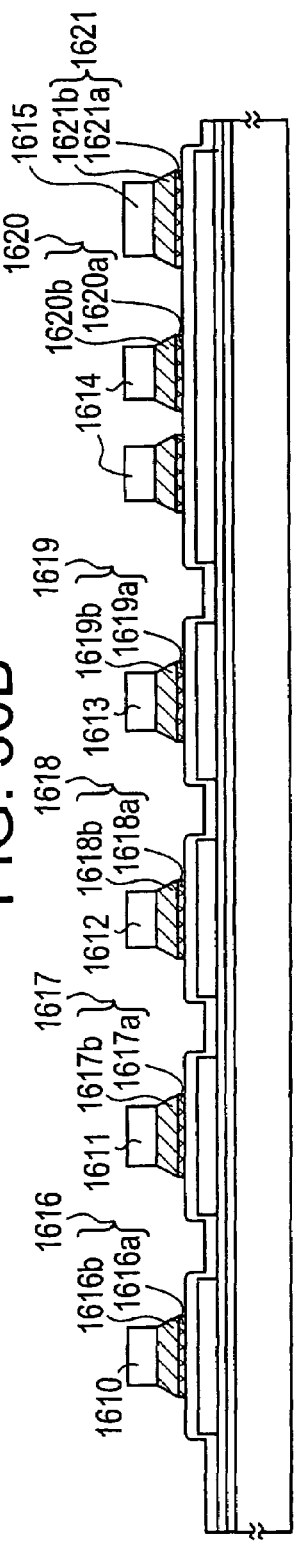
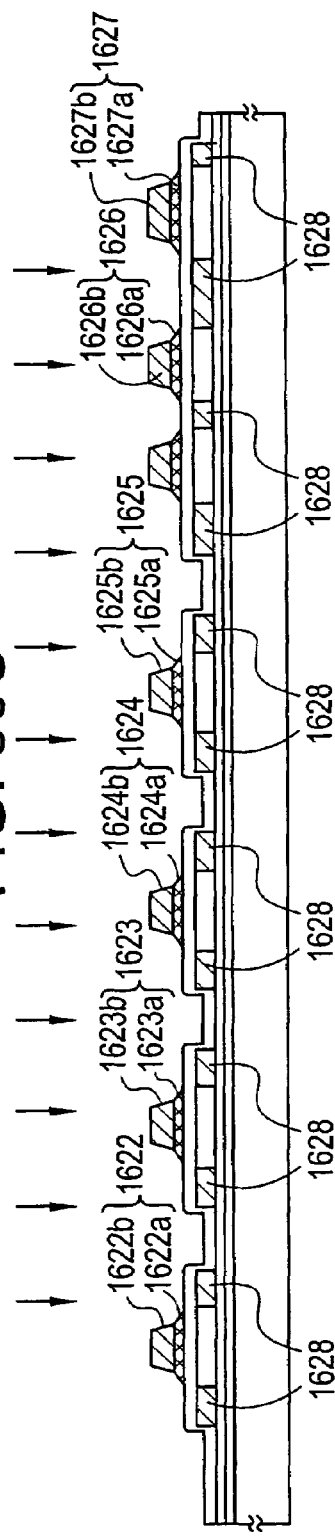

METHOD OF MANUFACTURING SEMICONDUCTOR DEVICE

BACKGROUND OF THE INVENTION

1. Field of the Invention

The present invention relates to a method of manufacturing a semiconductor device using a gettering technique and a semiconductor device obtained by the manufacturing method. More particularly, the present invention relates to a method of manufacturing a semiconductor device using a crystalline semiconductor film produced by adding a metal element having catalysis to crystallization of a semiconductor film and a semiconductor device.

In addition, the semiconductor device in the present specification indicates the entire devices that can function by using semiconductor characteristics. The electronic optical device, the semiconductor circuit and an electronic device are all semiconductor devices.

2. Description of the Related Art

A thin film transistor (hereinafter referred to as a TFT) is known as a typical semiconductor element using a semiconductor film having a crystalline structure (hereinafter referred to as a crystalline semiconductor film). The TFT is noted as a technique for forming an integrated circuit on an insulating substrate made of glass or the like, and a driver circuit integrated liquid crystal display device and the like are putting into practical use. According to a conventional technique, an amorphous semiconductor film deposited by a plasma CVD method or a low pressure CVD method is processed by heat treatment or a laser anneal method (technique for crystallizing a semiconductor film by laser light irradiation) to manufacture the crystalline semiconductor film.

Since the crystalline semiconductor film thus produced is an aggregate of a large number of crystal grains, and its crystal orientation is oriented in an arbitrary direction, which is thus uncontrollable, this causes a reduction in a characteristic of the TFT. To solve such a problem, a technique disclosed in Japanese Patent Application Laid-open No. Hei 7-183540 is one performed by adding a metal element having catalysis, such as nickel, in crystallization of an amorphous semiconductor film, and orientation property of the crystal orientation can be improved to be a single direction, in addition to an effect of decreasing a heating temperature required for the crystallization. When a TFT is made from a crystalline semiconductor film produced by this method, a reduction in a sub-threshold coefficient (S value) and improvements of a static characteristic and a dynamic characteristics become possible in addition to an improvement of electric field effect mobility.

However, since a metal element having catalysis is added, there is such a problem that the metal element is left in the inner portion or the surface of the crystalline semiconductor film, and thus a characteristic of an obtained element is varied. One example is increase of an off current and there is such a problem that a variation between the individual TFTs is caused. That is, the metal element having catalysis to crystallization conversely becomes unnecessary once the crystalline semiconductor film has been formed.

Gettering using phosphorus is effectively used as a method of removing such a metal element from a specific region of the crystalline semiconductor film. For example, phosphorus is added to a source and a drain region of a TFT and then heat treatment is performed at 450 to 700° C., whereby the metal element can be easily removed from the channel forming region.

Phosphorus is implanted to the crystalline semiconductor film by an ion dope method (which is a method of dissociating $PH_3$ or the like with plasma and accelerating ions of $PH_3$ by an electric field to implant it into a semiconductor, and a method in which ion mass separation is not basically performed). A concentration of phosphorus required for gettering is $1 \times 10^{20}/cm^3$ or higher. Addition of phosphorus by the ion dope method causes the crystalline semiconductor film to be amorphous. However, when the concentration of phosphorus is increased, a problem in which recrystallization by later anneal is hindered is caused. Also, since the addition of high concentration phosphorus causes an increase in a processing time required for doping, a problem in which throughput in a doping process is decreased is caused.

SUMMARY OF THE INVENTION

Therefore, with the foregoing in mind, it is an object of the present invention to simplify processes and enhance throughput, while reducing the number of heat treatments at a high temperature (600° C. or higher) and realizing a lower-temperature process (600° C. or lower).

Gettering is considered as a main technique in manufacturing of an integrated circuit using a single crystal silicon wafer. Gettering is known as a technique of segregating a metal impurity taken in a semiconductor to a gettering site with some energy, thereby reducing an impurity concentration of an active region of a device. Gettering is roughly classified into extrinsic gettering and intrinsic gettering. Extrinsic gettering brings about a gettering effect by giving a distortion field and a chemical action from outside. This corresponds to phosphorus gettering of diffusing a high concentration of phosphorus from a reverse surface of a single crystal silicon wafer. The above-mentioned gettering using phosphorus with respect to a crystalline semiconductor film is also considered as one of extrinsic gettering.

On the other hand, intrinsic gettering is known as a technique of utilizing a distortion field of lattice defects associated with oxygen generated in a single crystal silicon wafer. The present invention is based on intrinsic gettering utilizing such lattice defects or lattice distortions, and in order to apply the present invention to a crystalline semiconductor film with a thickness of about 10 to 100 nm, the following means is adopted.

The present invention includes means for forming a semiconductor film having a crystalline structure, using a metal element; means for forming a gettering site by selectively adding a rare gas element; and means for gettering the metal element to the gettering site.

Furthermore, as a method for adding a rare gas element, ion doping or ion implantation may be used.

In addition to a rare gas element, one kind or a plurality of kinds of elements selected from the group consisting of H, $H_2$, O, $O_2$, and P may be added. In the case of adding one kind or a plurality of kinds of elements selected from H, $H_2$, O, and $O_2$, in addition to a rare gas element, for example, such an element may be added in an atmosphere containing water vapor as well as a rare gas element. FIG. 24 shows the measurement results obtained by using an electromagnetic field cross mass analyzer (E×B mass analyzer) when a rare gas element (argon) is added to an atmosphere by ion doping in addition to water vapor. The electromagnetic field cross mass analyzer is a mass analyzer in which a magnetic field and an electric field are directed vertically, and each field is vertical to an ion beam axis. A mass is analyzed by deflecting a beam with an electric field, and allowing a detection target ion to return to a central axis with a magnetic field.

Furthermore, in the case of adding one kind or a plurality of kinds of elements selected from the group consisting of H, $H_2$, O, $O_2$, and P, for example, such an element may be added in an atmosphere containing water vapor and phosphine in addition to a rare gas element. By adding a plurality of elements, a gettering effect can be obtained synergistically.

In particular, it is effective to add oxygen (O, $O_2$), and a metal element promoting crystallization tends to move to a region of a gettering site where the concentration of oxygen is high in the gettering process.

According to the present invention, a semiconductor film having a crystalline structure may be obtained by adding a metal element to a semiconductor film having an amorphous structure, followed by crystallizing the film by heat treatment or irradiation with strong light. After crystallization, a metal element segregated with an etchant containing fluoric acid, e.g., diluted fluoric acid or FPM (mixed solution of fluoric acid, a hydrogen peroxide solution, and pure water) may be removed or reduced. In the case where the surface is etched with an etchant containing fluoric acid, it is desirable that the surface is flattened by irradiation with strong light.

Furthermore, after the above-mentioned crystallization, laser light or strong light may be radiated for the purpose of further enhancing crystallization. After irradiation with laser light or strong light for enhancing crystallization, a metal element segregated with an etchant containing fluoric acid may be removed or reduced, and the surface may be further flattened by irradiation with strong light.

Then, an insulating film containing silicon as its main component is formed on a semiconductor film having a crystalline structure. The insulating film may be very thin, and may be formed by oxidation with a solution containing ozone used for a surface treatment called hydro-cleaning that is conducted for removing carbon (i.e., an organic substance). The insulating film is formed for the purpose of doping of a trace amount of impurity element (boron or phosphorus) for controlling a threshold value of a TFT. After the insulating film is formed, and channel doping is conducted. strong light may be radiated for the purpose of activation.

According to one feature of the present invention, the present invention includes processes of adding a rare gas element to a crystalline semiconductor thin film to form a gettering site, and conducting heat treatment (including heat treatment by irradiation with strong light), wherein metal contained in the crystalline semiconductor thin film moves to be taken in the gettering site (region with ions of a rare gas element added thereto) due to the heat treatment, whereby metal is removed or reduced from a region of the crystalline semiconductor thin film other than the gettering site. Strong light may be radiated in place of heat treatment, and strong light may be radiated simultaneously with heat treatment. Furthermore, during gettering, an impurity element added by channel doping may be activated.

The present invention is also characterized in that an impurity region with a rare gas element (also called a rare gas) is formed in a semiconductor film having a crystalline structure, using a mask, gettering for segregating a metal element contained in the semiconductor film to the impurity region by heat treatment, and thereafter, the semiconductor film is patterned using the mask. In order to reduce the number of masks or simplify the processes, it is desirable that a mask for selectively adding a rare gas element is the same as that used for pattering a semiconductor film. However, when gettering is conducted, a metal element is likely to be segregated to a boundary of a region where a rare gas is added, so that separate masks as shown in FIGS. 13A to 13D may be used.

As a method for adding a rare gas element, ion doping or ion implantation can be used. As a rare gas element, one kind or a plurality of kinds of elements selected from the group consisting of He, Ne, Ar, Kr, and Xe can be used. Among them, Ar that is inexpensive gas is desirably used. In the case of using ion doping, the concentration of one kind of rare gas element contained in a doping gas is set to be 30% or more, preferably 100%. For example, a doping gas containing 30% of Kr gas and 70% of Ar gas may be used.

Furthermore, according to the present invention, when the semiconductor film is patterned, a region with a rare gas added thereto (i.e., a region where a metal element is segregated in a high concentration) is removed and covered with a mask, and a semiconductor layer, in which a region with a metal element reduced has a desired shape, is formed. When overetching is conducted during formation of the semiconductor layer, portions at the ends of the semiconductor layer where metal is segregated can be removed. After patterning, the mask is removed.

The surface of the semiconductor layer is washed with an etchant containing fluoric acid, and thereafter, an insulating film containing silicon as its main component to be a gate insulating film is formed. It is desirable that washing of the surface and formation of the gate insulating film are continuously conducted without exposure to the atmosphere. It may also be possible that the activation process is added before or after washing of the surface, whereby an impurity element added by channel doping may be activated.

After the surface of the gate insulating film is washed, a gate electrode is formed, and an impurity element providing a p-type or an n-type is appropriately added, whereby a source region and a drain region are formed. If required, an LDD region may be formed. After addition of the impurity element, heat treatment, irradiation with strong light, or irradiation with laser light may be conducted so as to activate the impurity element. Simultaneously with activation, plasma damage to a gate insulating film and plasma damage to the interface between a gate insulating film and a semiconductor layer can be recovered. In particular, it is very effective to activate an impurity element by irradiation with the second harmonic of a YAG laser from the front surface or the reverse surface in an atmosphere of room temperature to 300° C. A YAG laser is preferable because of less maintenance.

In the subsequent processes, an interlayer insulating film is formed, hydrogenation is conducted, contact holes reaching the source region and the drain region are formed, a source electrode and a drain electrode are formed. Whereby a TFT is completed.

According to the present invention, in the case where crystallization is conducted by heat treatment and activation is conducted by a method other than heat treatment, the number of times of heat treatments at a high temperature can be twice (crystallization and gettering). In the case where crystallization is conducted by irradiation with strong light, and activation is conducted by a method other than heat treatment, the number of times of heat treatments at a high temperature can be once (gettering).

Furthermore, a high concentration of a rare gas element can be added to a semiconductor film in a short period of time (about one or two minutes). Therefore, compared with gettering using phosphorus, throughput is enhanced remarkable.

An experiment on a gettering ability of a rare gas element was conducted. As a semiconductor film, a crystalline semiconductor film was used, which was obtained by coating an amorphous silicon film (thickness: 50 nm) with an aqueous solution containing 10 ppm of nickel acetate, and crystallizing the amorphous film by dehydrogenation at 500° C. for 1 hour and heat treatment at 550° C. for 4 hours. The crystallized semiconductor film is patterned, and a silicon oxide film (thickness: 90 nm) was formed. Then, the width of a region to be gettered was set to be 50 μm, and argon was injected using a mask so as to sandwich the region by ion doping (at an acceleration voltage of 80 keV and a dose amount of $5 \times 10^{15}/\text{cm}^2$) whereby a sample with gettering sites (width: 5 μm) were prepared. Argon of 99.9999% or more was used, so that it took one to two minutes to inject argon. Then, gettering was conducted at a heating temperature of 350° C., 400° C., 450° C., 500° C., and 550° C. for 4 hours, 6 hours, and 8 hours in a nitrogen atmosphere. After gettering, a silicon oxide film was removed, the gettered region was treated with FPM. The effect of gettering was confirmed based on the number of etch pits in the gettered region of the crystalline semiconductor film. More specifically, most of added nickel remains in the crystalline semiconductor film as nickel silicide, which is known to be etched with FPM (mixture of fluoric acid, a hydrogen peroxide solution, and pure water). Therefore, the gettered region is treated with FPM and the presence of etch pits is confirmed, whereby the effect of gettering can be confirmed. In this case, as the number (density) of etch pits is smaller, the effect of gettering is higher. FIG. 26 shows the results. It is understood from FIG. 26 that as a heating time became longer, the density of etch pits became smaller, and the density of etch pits became sufficiently small due to the heat treatment at 500° C. (preferably 550° C.).

Furthermore, FIG. 27 shows the results obtained by conducting the similar experiment under the condition that the width of a region to be gettered is 30 μm. It is understood from comparison between FIG. 26 and FIG. 27 that if a region to be gettered is 30 μm in width, the density of etch pits became sufficiently small even at 500° C.

FIG. 29 schematically shows a sample in which etch pits are formed. In FIG. 29, a rare gas element added region 10401 represents a region where argon is added. The number of etch pits 10403 present in a gettered region (region to be gettered) is counted under observation with an optical microscope to obtain the density of etch pits.

Furthermore, an experiment was further conducted so as to compare the above-mentioned gettering ability with that of phosphorus. Doping conditions and heating conditions were changed, and the density of etch pits were obtained in the same way as in the above experiment. Herein, a sample in which phosphorus is injected to a gettering site (width: 5 μm) by ion doping (using 5% PH3 diluted with hydrogen at an acceleration voltage of 80 keV and a dose amount of $1.3 \times 10^{15}/\text{cm}^2$) and a sample in which argon is injected by ion doping (at an acceleration voltage of 80 keV and a dose amount of $1 \times 10^{15}$, $5 \times 10^{15}/\text{cm}^2$, and $5 \times 10^{15}/\text{cm}^2$) were prepared, and these samples were evaluated by comparison. At this time, it took about 8 minutes for injecting phosphorus. Then, gettering was conducted at a heating temperature of 500° C. for 24 hours. Furthermore, a sample in which the width of a gettered region is 30 μm was compared with a sample in which the width of a gettered region is 50 μm. FIG. 28 shows the results. FIG. 28 shows that although the dose amount of argon is smaller than that of phosphorus, argon exhibits a higher gettering ability. Furthermore, even if the added amount of argon is small (i.e., the dose amount thereof is $5 \times 10^{15}/\text{cm}^2$), when a heating time is long, sufficient gettering is conducted, thereby being capable of decreasing the density of etch pits.

Thus, compared with gettering using phosphorus, the gettering ability of the present invention by the addition of a rare gas element is high. Furthermore, a rare gas element can be added in a high concentration (e.g., $1 \times 10^{20}$ to $5 \times 10^{21}/\text{cm}^3$).

Therefore, the added amount of a metal element used for crystallization can be increased. More specifically, by increasing the added amount of a metal element used for crystallization, crystallization can be conducted in a shorter time. Furthermore, in the case where a crystallization time is not changed, by increasing the added amount of a metal element used for crystallization, crystallization can be conducted at a lower temperature. Furthermore, by increasing the added amount of a metal element used for crystallization, natural cores can be decreased, and a crystalline semiconductor film of good quality can be formed.

Furthermore, according to the present invention, not only gettering of a metal element used for crystallization, but also gettering of another heavy metal element are conducted.

Furthermore, due to the gettering of the present invention, a crystalline semiconductor film is also annealed.

Furthermore, since a high-temperature heat treatment is conducted by the time when islands are formed. Therefore, a substrate does not contract after islands are formed. This minimizes a shift of patterning, resulting in an increase in yield in terms of manufacturing of a device. Furthermore, according to the present invention, the number of heat treatments is small. Therefore, even if the substrate is thin (e.g., 0.7 mm or 0.5 mm), the influence on the substrate is small. Therefore, there is no problem for practical use.

A structure of the invention relating to a manufacturing process disclosed in this specification is a method of manufacturing a semiconductor device characterized by comprising:

a first process of adding a metal element to a semiconductor film having an amorphous structure;

a second process of crystallizing the semiconductor film having an amorphous structure to form a semiconductor film having a crystalline structure;

a third process of selectively adding a rare gas element to the semiconductor film having a crystalline structure to form an impurity region;

a fourth process of gettering the metal element to the impurity region to selectively remove or reduce the metal element in the semiconductor film having a crystalline structure; and a fifth process of removing the impurity region.

According to the above-mentioned structure, the method is characterized in that the rare gas element is one kind or a plurality of kinds of elements selected from the group consisting of He, Ne, Ar, Kr, and Xe.

Also, according to the above-mentioned structure, the method is characterized in that one kind or a plurality of kinds of elements selected from the group consisting of H, $H_2$, O, $O_2$, P, and $H_2O$ are added in addition to the rare gas element in the third process.

Also, according to the above-mentioned structure, the method is characterized in that the third process is conducted in an atmosphere containing a rare gas element and water vapor.

Also, according to each of the above-mentioned structures, the method is characterized by comprising a process of irradiating the semiconductor film with strong light or laser light from a front surface or a reverse surface to activate the impurity element after the fifth process.

Also, according to each of the above-mentioned structures, the method is characterized in that the second process is heat treatment.

Also, according to each of the above-mentioned structures, the method is characterized in that the second process is irradiation of the semiconductor film having an amorphous structure with strong light.

Also, according to each of the above-mentioned structures, the method is characterized in that the second process is heat treatment and irradiation of the semiconductor film having an amorphous structure with strong light.

Also, according to each of the above-mentioned structures, the method is characterized in that the fourth process is characteristically heat treatment.

Also, according to each of the above-mentioned structures, the method is characterized in that the fourth process is irradiation of the semiconductor film with strong light.

Also, according to each of the above-mentioned structures, the method is characterized in that the fourth process is heat treatment and irradiation of the semiconductor film with strong light.

Also, according to each of the above-mentioned structures, the method is characterized in that the strong light is emitted from a lamp selected from the group consisting of a halogen lamp, a metal halide lamp, a xenon arc lamp, a carbon arc lamp, a high-pressure sodium lamp, and a high-pressure mercury lamp.

Also, according to each of the above-mentioned structures, the method is characterized in that the metal element is one kind or a plurality of kinds of elements selected from the group consisting of Fe, Ni, Co, Ru, Rh, Pd, Os, Ir, Pt, Cu, and Au.

Furthermore, a method of manufacturing a semiconductor device with another configuration according to the present invention includes:

a first process of adding a metal element to a semiconductor film having an amorphous structure;

a second process of crystallizing the semiconductor film having an amorphous structure to form a semiconductor film having a crystalline structure;

a third process of forming a first mask on the semiconductor film having a crystalline structure;

a fourth process of selectively adding a rare gas element to the semiconductor film having a crystalline structure to form an impurity region;

a fifth process of gettering the metal element to the impurity region to selectively remove or reduce the metal element in the semiconductor film having a crystalline structure;

a sixth process of forming a second mask on the semiconductor film having a crystalline structure; and a seventh process of selectively removing the semiconductor film.

Furthermore, the method of manufacturing a semiconductor device with the above-mentioned configuration is characterized in that the seventh process includes removing the impurity region and a part of the semiconductor film having a crystalline structure.

Furthermore, the method of manufacturing a semiconductor device with the above-mentioned configuration is characterized in that the second mask is provided at a position on an inner side of the ends of the first mask.

Furthermore, a method of manufacturing a semiconductor device with another configuration according to the present invention includes:

a first process of forming a first mask on a semiconductor film having an amorphous structure;

a second process of selectively adding a metal element to the semiconductor film having an amorphous structure;

a third process of crystallizing the semiconductor film to form a semiconductor film having a crystalline structure;

a fourth process of selectively adding a rare gas element to the semiconductor film having a crystalline structure to form an impurity region;

a fifth process of gettering the metal element to the impurity region to selectively remove or reduce the metal element in the semiconductor film having a crystalline structure;

a sixth process of forming a second mask on the semiconductor film having a crystalline structure; and an seventh process of selectively removing the semiconductor film.

Furthermore, a method of manufacturing a semiconductor device with another configuration according to the present invention includes:

a first process of forming a first mask on a semiconductor film having an amorphous structure;

a second process of selectively adding a metal element to the semiconductor film having an amorphous structure;

a third process of crystallizing the semiconductor film to form a semiconductor film having a crystalline structure;

a fourth process of forming a second mask on the semiconductor film having a crystalline structure;

a fifth process of selectively adding a rare gas element to the semiconductor film having a crystalline structure to form an impurity region;

a sixth process of gettering the metal element to the impurity region to selectively remove or reduce the metal element in the semiconductor film having a crystalline structure;

a seventh process of forming a third mask on the semiconductor film having a crystalline structure; and an eighth process of selectively removing the semiconductor film.

Furthermore, the present invention relates to a semiconductor device provided with a TFT, which includes a semiconductor layer, an insulating film contacting the semiconductor layer, and a gate electrode contacting the insulating film, on a substrate, wherein the substrate has a region containing a rare gas element at least in a part thereof. The substrate is an insulating substrate or a semiconductor substrate. Furthermore, when a rare gas element is added, it is also added to the substrate, whereby this configuration is obtained. FIG. 14C is a schematic view showing a state immediately after a rare gas element is added. Even in the case where one kind or a plurality of kinds of elements selected from the group consisting of H, $H_2$, O, $O_2$, P, and $H_2O$, in addition to a rare gas element, one kind or a plurality of kinds of elements selected from the group consisting of H, $H_2$, O, $O_2$, P, and $H_2O$ are added to a base insulating film as well as a substrate. These elements, however, are likely to diffuse by a later heat treatment, compared with a rare gas element.

The semiconductor device with the above-mentioned configuration is characterized in that a mask for forming a region containing the rare gas element is the same as that for forming the semiconductor layer. Because of this, a semiconductor device is obtained without increasing the number of masks.

Furthermore, a semiconductor device with another configuration of the present invention is provided with a TFT including an insulating film contacting a substrate and a semiconductor layer, wherein the insulating film has a region containing a rare gas element at least in a part thereof.

The above-mentioned insulating film is a base insulating film provided as a blocking layer. FIG. 14B shows a state when a rare gas is added to the base insulating film.

In the above-mentioned configuration, the substrate includes a region containing a rare gas element at least in a part thereof. More specifically, in a region not covered with a mask, a rare gas element is added to the base insulating film as well as the substrate. Furthermore, even in the case where one kind or a plurality of kinds of elements selected from the group consisting of H, $H_2$, O, $O_2$, P, and $H_2O$, in addition to a rare gas element, one kind or a plurality of kinds of elements selected from the group consisting of H, $H_2$, O, $O_2$, P, and $H_2O$ is added to the base insulating film as well as the substrate. These elements, however, are likely to diffuse by a later heat treatment, compared with a rare gas element.

Furthermore, a mask for forming the region containing a rare gas element is the same as that for forming the semiconductor layer.

These and other advantages of the present invention will become apparent to those skilled in the art upon reading and understanding the following detailed description with reference to the accompanying figures.

BRIEF DESCRIPTION OF THE DRAWINGS

FIGS. 3A to 3C show processes of manufacturing an active matrix type liquid crystal display.

FIGS. 4A to 4C show processes of manufacturing an active matrix type liquid crystal display.

FIGS. 30A to 30C show processes of manufacturing an active matrix type liquid crystal display.

DETAILED DESCRIPTION OF THE PREFERRED EMBODIMENTS

Hereinafter, the present invention will be described by way of illustrative embodiments with reference to the drawings.

FIGS. 1 and 2 illustrate a method of one embodiment of the present invention in which a metal element having a catalytic function is added to the entire surface of an amorphous semiconductor film, followed by being crystallized, and then, gettering is conducted.

Figure 1A:
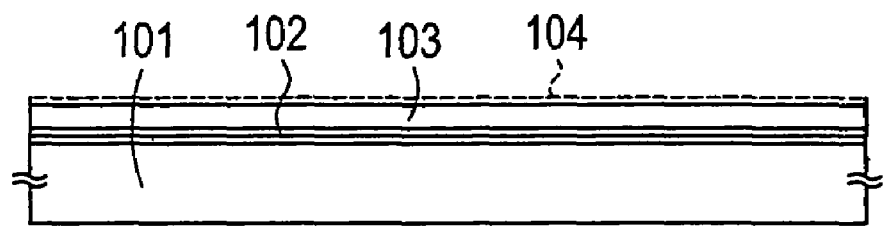
FIGS. 1A to 1D show processes of manufacturing a semiconductor layer.

In FIG. 1A, as a substrate 101, barium borosilicate glass, aluminoborosilicate glass, quartz, or the like can be used. An inorganic insulating film is formed to a thickness of 10 to 200 nm on the surface of the substrate 101 as a blocking layer 102. An example of a preferable blocking layer is a silicon oxynitride film manufactured by plasma CVD. A silicon oxynitride film is obtained by forming a first silicon oxynitride film made of $SiH_4$, $NH_3$, and $N_2O$ to a thickness of 50 nm and forming a second silicon oxynitride film made of $SiH_4$ and $N_2O$ to a thickness of 100 nm. The blocking layer 102 is provided so as not to prevent alkali metal contained in the class substrate from diffusing into a semiconductor film to be formed thereon. In the case of using a substrate made of quartz, the blocking layer 102 may be omitted.

As a material for a semiconductor film 103 having an amorphous structure to be formed on the blocking layer 102, a semiconductor material containing silicon as its main component is used. Typically, an amorphous silicon film, an amorphous silicon germanium film, or the like is formed to a thickness of 10 to 100 nm by plasma CVD, low-pressure CVD, or sputtering. In order to obtain crystal of good quality, it is required to reduce the concentration of impurities such as oxygen, nitrogen, and carbon contained in the semiconductor film 103 having an amorphous structure. It is desirable to use a CVD apparatus designed for ultrahigh vacuum, as well as a high purity material gas.

Then, a metal element having a catalytic function for promoting crystallization is added to the surface of the semiconductor film 103 having an amorphous structure. Examples of the metal element having a catalytic function for promoting crystallization of the semiconductor film include iron (Fe), nickel (Ni), cobalt (Co), ruthenium (Ru), rhodium (Rh), palladium (Pd), osmium (Os), iridium (Ir), platinum (Pt), copper (Cu), gold (Au), and the like. One kind or a plurality of kinds of these elements can be used. Typically, the semiconductor film 103 is coated with a nickel acetate solution containing 3 to 50 ppm of nickel by weight, using a spinner, whereby a catalyst-containing layer 104 is formed. Since the ability of gettering conducted in the process after FIG. 1A is very high, it is possible to use a solution containing a rich concentration of nickel. Furthermore, in order to coat the surface of the semiconductor film 103 with a solution of high concentration, the number of rotations of a spinner may be reduced. In this case, in order to enhance the compatibility of the solution, the semiconductor film 103 having an amorphous structure is subjected to a surface treatment. More specifically, a very thin oxide film is formed with an ozone-containing aqueous solution, and the oxide film is etched with a mixed solution of fluoric acid and hydrogen peroxide to form a clean surface. Thereafter, the clean surface is treated with an ozone-containing aqueous solution again to form a very thin oxide film. The surface of a semiconductor film made of silicon or the like is inherently hydrophobic. Therefore, by forming such an oxide film, the surface of the semiconductor film can be uniformly coated with a nickel acetate solution.

Needless to say, the coating method of the catalyst-containing layer 104 is not limited to the above. The catalyst-containing layer 104 may be formed by sputtering, vapor deposition, a plasma treatment, or the like.

Figure 1B:
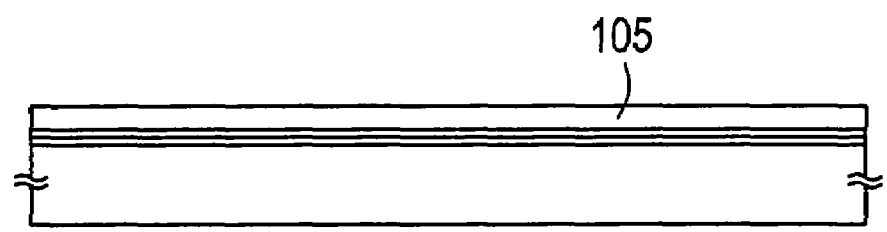

Then, the catalyst-containing layer 104 is heat-treated or irradiated with strong light, whereby crystallization is conducted. In this case, silicide is formed in a portion of the semiconductor film 103, with which the metal element to be a catalyst is in contact, is formed, and crystallization proceeds using silicide thus formed as a core. In this manner, a crystalline semiconductor film 105 shown in FIG. 1B is formed. In the case where crystallization is conducted by heat treatment, after the amorphous silicon film 103 is dehydrogenated (500° C., 1 hour), thermal crystallization (550° C. to 650° C., 4 to 24 hours) may be conducted. In the case where crystallization is conducted by irradiation with strong light, it is possible to use either one or a combination of infrared light, visible light, or UV-light. Typically, light emitted from a halogen lamp, a metal halide lamp, a xenon arc lamp, a carbon arc lamp, a high-pressure sodium lamp, or a high-pressure mercury lamp is used (FIG. 1B). If required, before irradiation with first strong light, heat treatment may be conducted in which hydrogen contained in the semiconductor film 103 having an amorphous structure is released. Furthermore, crystallization may be conducted by simultaneously performing heat treatment and irradiation with strong light.

Immediately after crystallization, in order to reduce the metal element contained in the semiconductor film, the metal element to be a catalyst may be reduced or eliminated by etching with an etchant containing fluorine.

Figure 1C:
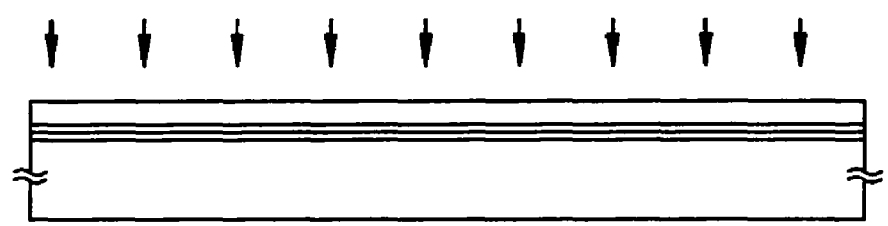

Then, in order to enhance a crystallization ratio (ratio of a crystalline component in the entire volume of the film) and correct defects remaining in crystal grains, the crystalline semiconductor film 105 is irradiated with light (FIG. 1C). At this time, an excimer laser with a wavelength of 400 nm or less, the second harmonic of a YAG laser, or the third harmonic of a YAG layer may be used. A gas laser or solid laser of continuous oscillation may also be used. As a solid laser, a laser using crystal such as YAG, $YVO_4$, YLF, and $YalO_3$ doped with Cr, Nd, Er, Ho, Ce, Co, Ti, or Tm is applied. The fundamental wave of the laser is varied depending upon a doping material, and laser light having the fundamental wave of about 1 μm is obtained. The harmonics with respect to the fundamental wave can be obtained by using a non-linear optical element. Herein, the following may be possible: pulse laser light with a repeating frequency of about 10 to 1000 Hz is used, the laser light is condensed by an optical system at 100 to 400 $mJ/cm^2$, and the crystalline semiconductor film 105 is subjected to a laser treatment with an overlapping ratio of 90 to 95%. Furthermore, the crystalline semiconductor film 105 may be irradiated with strong light, instead of laser light, or may be irradiated with laser light and strong light simultaneously.

In the case of using a solid laser that is capable of continuously oscillating, laser light emitted from a $YVO_4$ laser of continuous oscillation with an output of 10 W is converted to the harmonic by a non-linear optical element. There is also a method in which $YVO_4$ crystal and a non-linear optical element are put in a resonator to emit the harmonic. Preferably, laser light is formed into a rectangular shape or an oval shape on an irradiation surface by an optical system and radiated to a substance to be treated. It is required that the energy density at this time is about 0.01 to 100 $MW/cm^2$ (preferably, 0.1 to 10 $MW/cm^2$). The semiconductor film is relatively moved with respect to laser light at a speed of about 0.5 to 2000 cm/s, whereby the semiconductor film is irradiated with laser light.

Then, in order to reduce the metal element contained in the crystalline semiconductor film 105 immediately after a treatment for correcting defects, the metal element to be a catalyst may be reduced or eliminated by etching with an etchant containing fluorine. Furthermore, in the case where unevenness is caused on the surface by etching, the surface may be flattened by irradiation with strong light.

The surface of the semiconductor film is washed with an ozone-containing solution to remove an organic substance, whereby a very thin oxide film is formed on the surface. It is desirable that a trace amount of an impurity element (boron or phosphorus) is allowed to pass through the very thin film to be added to the semiconductor film (channel doping), whereby a threshold value of a TFT is controlled. Furthermore, in order to activate the impurity element after channel doping, the semiconductor film may be irradiated with strong light. Furthermore, similar washing is conducted before adding nickel, and channel doping is conducted after forming a very thin oxide film.

Figure 1D:
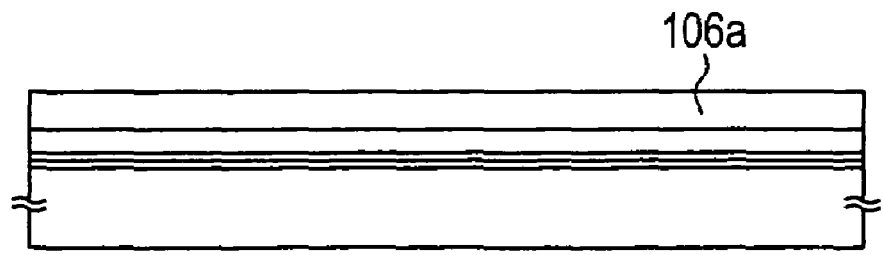

Next, a silicon oxide film 106a (thickness: 100 to 200 nm) is formed on the crystalline semiconductor film 105 (FIG. 1D). There is no particular limit to a method of manufacturing the silicon oxide film 106a. For example, the silicon oxide film 106a is formed by mixing tetraethyl ortho silicate (TEOS) and $O_2$, and allowing discharging to be conducted under the conditions of a reaction pressure of 40 Pa, a substrate temperature of 300° C. to 400° C. and a high-frequency (13.56 MHZ) power density of 0.5 to 0.8 $W/cm^2$.

Figure 2A:
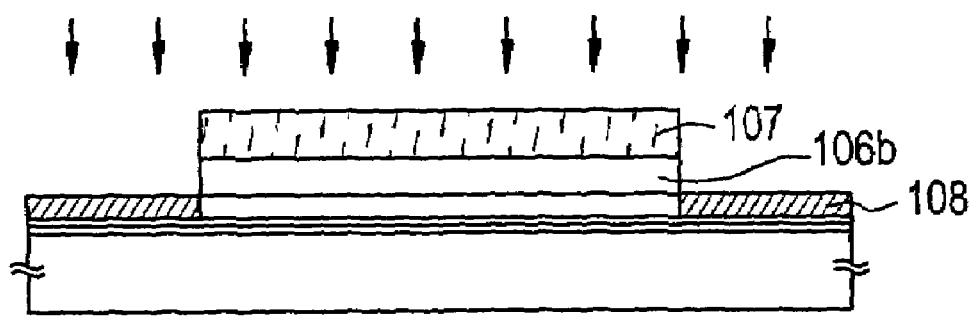
FIGS. 2A to 2D show processes of manufacturing a semiconductor layer.
Figure 14A:
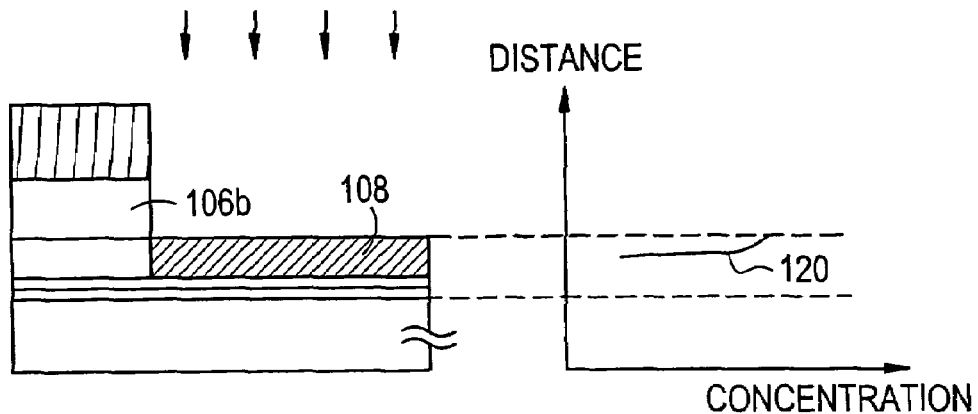
FIGS. 14A to 14C show concentration distributions of a rare gas element.
Figure 14B:
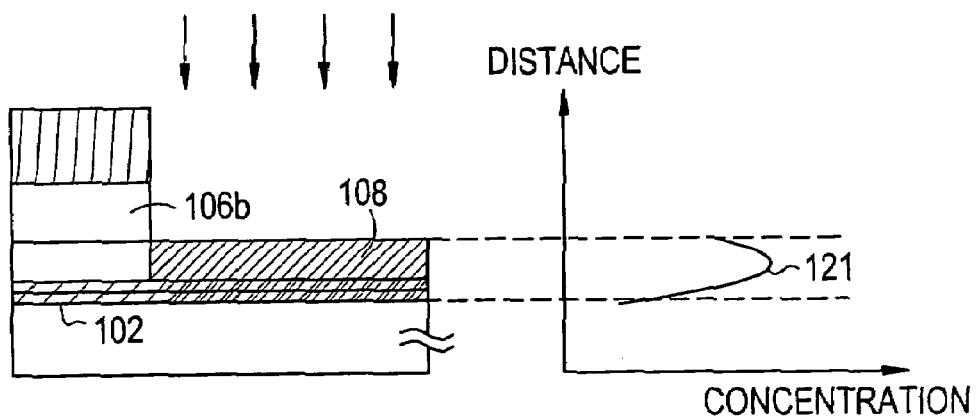
Figure 14C:
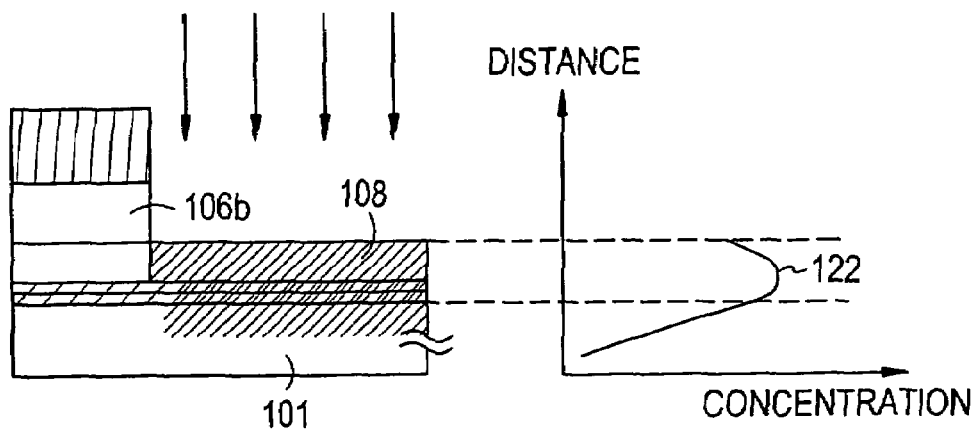

Then, a resist mask 107 is formed on the silicon oxide film 106a. The silicon oxide film 106a is patterned using the resist mask 107, whereby an insulating layer 106b made of silicon oxide covering a portion to be a semiconductor layer of a TFT is formed. Thereafter, a rare gas element is added to the semiconductor film 105 to form gettering sites 108 (FIG. 2A). Herein, it is desirable that the rare gas element is added by ion doping or ion implantation, and the concentration of the rare gas element added to the semiconductor film 105 is set at $1 \times 10^{20}$ to $5 \times 10^{21}/cm^3$. At this time, the semiconductor film 105 may be doped with the rare gas element while the resist mask 107 remains. Alternatively, the semiconductor film 105 may be doped with the rare gas element after removing the resist mask 107. After doping of the rare gas element, the resist mask 107 is removed. In addition to the rare gas element, an element of Group XV or Group XIII of the periodic table may be added. In FIG. 2A, the rare gas element is added only to the semiconductor film 105. However, actually, the concentration distribution of a metal element as shown in FIGS. 14A to 14C can be controlled depending upon the conditions of processes of adding a rare gas element. FIG. 14A shows that a rare gas element is added under such a condition as to obtain a concentration distribution 120 having a peak at a shallow position of the semiconductor film. FIG. 14B shows that a rare gas element is added under such a condition as to obtain a concentration distribution 121 having a peak at an intermediate position of the semiconductor film. In this case, a rare gas element is also added to the blocking layer 102. FIG. 14C shows that a rare gas element is added under such a condition as to obtain a concentration distribution 122 having a peak at a deep position of the semiconductor film. In this case, a rare gas element is also added to the blocking layer 102 and the substrate 101. By adding a rare gas element to the blocking layer 102 and the substrate 101 as shown in FIGS. 14B and 14C, stress can be alleviated.

Figure 2B:
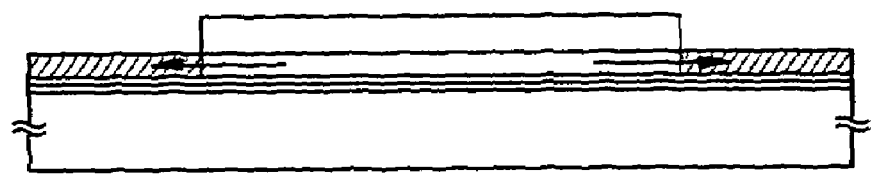

Then, gettering is conducted (FIG. 2B). If gettering is conducted at 450° C. to 800° C. for 1 to 24 hours (e.g., 550° C. for 14 hours) in a nitrogen atmosphere, a metal element can segregate to the gettering sites 108. Because of gettering, the metal element contained in the semiconductor film covered with the insulating layer 106b is removed, or the concentration of the metal element is reduced. Furthermore, irradiation with strong light in place of the heat treatment may be conducted. In the case of using an RTA method using, as heating means for gettering, light emitted from a halogen lamp, a metal halide lamp, a xenon arc lamp, a carbon arc lamp, a high-pressure sodium lamp, and a high-pressure mercury lamp, it is desirable that strong light is radiated so that a heating temperature of the semiconductor film is 400° C. to 550° C. If a heating temperature is too high, the strain in the semiconductor film is eliminated, and the function of releasing nickel to from the gettering sites (nickel silicide) and the function of entrapping nickel are eliminated, resulting in a decrease in a gettering efficiency.

Figure 2C:
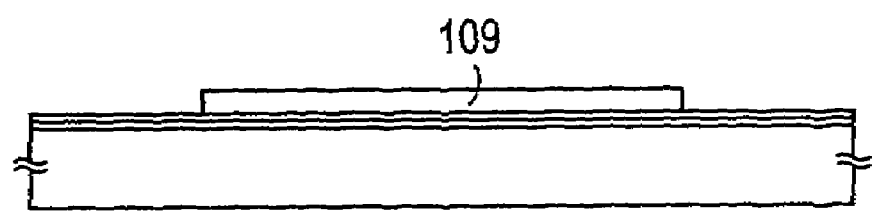
Figure 36:
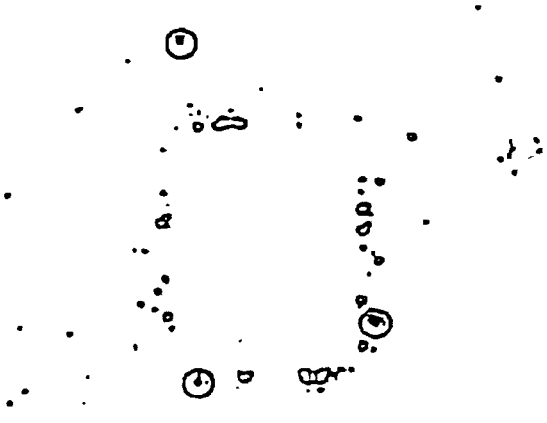
FIG. 36 is an observation photograph view after conducting FPM processing after gettering.

After gettering, the gettering sites 108 are removed using the above-mentioned mask, whereby a semiconductor layer 109 having a desired shape composed of a region with a metal element reduced is formed, and the insulating layer 106b made of silicon oxide is removed (FIG. 2C). It is desirable that the surface of the semiconductor layer 109 is also etched slightly when the insulating layer 106b is removed. FIG. 36 shows an optical microscope photograph showing nickel silicide etched with FPM (mixed solution of fluoric acid, hydrogen peroxide solution, and pure water) after gettering. From FIG. 36, a number of etch pits are observed on the periphery of the semiconductor layer, so that it is expected that nickel becomes likely to segregate on the periphery of the semiconductor layer by gettering. The optical microscope photograph in FIG. 36 is obtained by forming a base insulating film having a thickness of 50 nm and a polysilicon film (crystallized film after adding nickel) having a thickness of 50 nm are formed on a glass substrate, argon is selectively added at an accelerating voltage of 10 keV and in a dose amount of $1 \times 10^{15}/cm^2$, and conducting gettering at 550° C. for 4 hours, followed by conducting an FPM treatment.

When the resist mask is formed, it may also be possible to allow a rare gas element to pass through the silicon oxide film to conduct doping, thereby forming gettering sites. In this case, the resist mask is removed after doping and gettering is conducted, and the silicon oxide film is removed. Thereafter, only regions (gettering sites) with a rare gas element added thereto in the semiconductor film are selectively removed to form a semiconductor layer. If a dash solution, a sato solution, a seco solution, or the like is used, the regions with a rare gas element added thereto, which are made amorphous, can be selectively etched with respect to a region that is a crystalline semiconductor film (with no rare gas element added thereto).

Figure 2D:
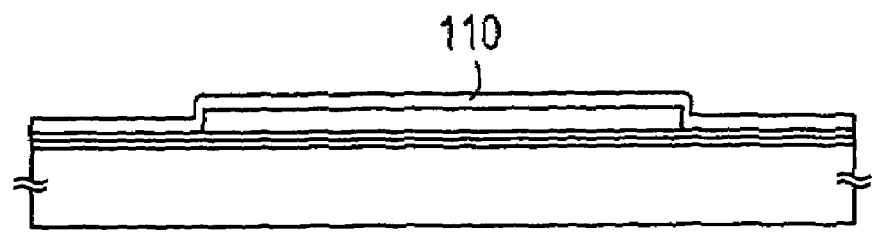

Then, the surface of the semiconductor layer 109 is washed with an etchant containing fluoric acid, and thereafter, an insulating film 110 containing silicon as its main component to be a gate insulating film is formed (FIG. 2D). It is desirable that washing of the surface of the semiconductor layer 109 and formation of the gate insulating film 110 are continuously conducted without exposing them to the atmosphere. Furthermore, an activation process may be added before or after washing the surface, and the impurity element added by channel doping may be activated.

Then the surface of the insulating film 110 is washed and a gate electrode is formed. Then an impurity element providing an n-type or a p-type is appropriately added to the semiconductor layer 109, whereby a source region and a drain region are formed. If required, a lightly doped drain (LDD) region may be formed. After the impurity element providing an n-type or a p-type is added, heat treatment, irradiation with strong light, or irradiation with laser light may be conducted so as to activate the impurity element. In particular, it is very effective to activate the impurity element by irradiation with the second or third harmonic of a YAG layer from the front surface or reverse surface in an atmosphere of room temperature to 300° C.

Thereafter, formation of an interlayer insulating film, hydrogenation, formation of contact holes reaching a source region and a drain region, formation of a source electrode and a drain electrode, and the like are conducted, whereby a TFT is completed.

The TFT thus formed is used as a TFT constituting a switching element in a pixel portion or a driving circuit, and mounted in various electronic equipment.

The present invention having the above-mentioned configuration will be described in more detail by way of the following embodiments.

EMBODIMENTS

Embodiment 1

Herein, a method of simultaneously manufacturing a pixel portion and TFTs (an n-channel TFT and a p-channel TFT) of a driving circuit provided on the periphery of the pixel portion on the same substrate will be described with reference to FIGS. 3A-3C to 6.

First, in the present embodiment, a substrate 200 made of barium borosilicate glass such as #7059 and #1737 produced by Corning Co. or aluminoborosilicate glass is used. There is no particular limit to the substrate 200 as long as it has light transparency, and a quartz substrate may be used. Furthermore, a plastic substrate having heat resistance enduring a treatment temperature in the present embodiment may be used.

Then, a base film 201 composed of an insulating film such as a silicon oxide film, a silicon nitride film, or a silicon oxynitride film is formed on the substrate 200. In the present embodiment, the base film 201 has a two-layered structure; however, the base film 201 may be composed of a single-layer film of the insulating film or a multi-layered structure of two or more insulating films. As the first layer of the base film 201, a silicon oxynitride film 201a is formed to a thickness of 10 to 200 nm (preferably, 50 to 100 nm), using $SiH_4$, $NH_3$, and $N_2O$ as a reaction gas by plasma CVD. In the present embodiment, the silicon oxynitride film 201a (composition ratio: Si=32%, O=27%, N=24%, H=17%) with a thickness of 50 nm was formed. Then, as a second layer of the base film 201, a silicon oxynitride film 201b is formed to a thickness of 50 to 200 nm (preferably, 100 to 150 nm), using $SiH_4$ and $N_2O$ as a reaction gas. In the present embodiment, the silicon oxynitride film 201b (composition ratio: Si=32%, O=59%, N=7%, H=2%) with a thickness of 100 nm was formed.

Then, semiconductor layers 202 to 206 are formed on the base film 201. The semiconductor layers 202 to 206 are obtained by forming a semiconductor film having an amorphous structure by known means (sputtering, LPCVD, plasma CVD, or the like), conducting known crystallization (laser crystallization, thermal crystallization, thermal crystallization using a catalyst such as nickel, or the like) to obtain a crystalline semiconductor film, and pattering the crystalline semiconductor film to a desired shape. The semiconductor layers 202 to 206 are formed to a thickness of 25 to 80 nm (preferably, 30 to 60 nm). There is no particular limit to a material for the crystalline semiconductor film. Preferably, the crystalline semiconductor film may be formed of silicon or silicon germanium ($Si_xGe_{1-x}$(X=0.0001 to 0.02)) alloy. In the present embodiment, an amorphous silicon film with a thickness of 55 nm was formed by plasma CVD, and a solution containing nickel was held on the amorphous silicon film. The amorphous silicon film was dehydrogenated (500° C. 1 hour) and crystallized (550° C., 4 hours) by heat treatment, and subjected to laser annealing for the purpose of enhancing crystallization, whereby a crystalline silicon film was formed. As described in the embodiment, after a mask made of a silicon oxide film was formed, a rare gas element was selectively added using a mask, gettering was conducted, the crystalline silicon film was patterned, and thereafter, the mask was removed. When the rare gas element is added, ion doping is conducted using a material gas containing argon and a trace amount of water vapor. Thus, the semiconductor layers 202 to 206 made of a crystalline silicon film were formed. The state where the semiconductor layers 202 to 206 have been patterned corresponds to FIG. 1C in the present embodiment. In order to control a threshold value of a TFT, doping of a trace amount of impurity element (boron or phosphorus) may be appropriately conducted after formation of an oxide film.

Then, the surfaces of the semiconductor layers 202 to 206 were washed with a fluoric acid type etchant such as a buffer fluoric acid, and thereafter, an insulating film 207 containing silicon as its main component was formed to a thickness of 40 to 150 nm by plasma CVD or sputtering. In the present embodiment, a silicon oxynitride film (composition ratio: Si=32%, O=59%, N=7%, H=2%) was formed to a thickness of 115 nm by plasma CVD. Needless to say, the insulating film to be a gate insulating film is not limited to a silicon oxynitride film, and another insulating film containing silicon may be used as a single layer or a multi-layered structure.

Then, as shown in FIG. 3A, a first conductive film 208 with a thickness of 20 to 100 nm and a second conductive film 209 with a thickness of 100 to 400 nm were stacked on the gate insulating film 207. In the present embodiment, the first conductive film 208 made of a TaN film (thickness: 30 nm) and a second conductive film 209 made of a W film (thickness: 370 nm) were stacked. The TaN film was formed by sputtering, using Ta as a target in a nitrogen atmosphere. The W film was formed by sputtering using W as a target. Alternatively, the W film can also be formed by thermal CVD using $WF_6$.

In the present embodiment, the first conductive film 208 was made of TaN, and the second conductive film 209 was made of W. However, the present invention is not particularly limited thereto. Any of the first conductive film 208 and the second conductive film 209 may be composed of a single layer or a multi-layer made of an element selected from the croup consisting of Ta, W, Ti, Mo, Al, Cu, Cr, and Nd, or an alloy material or a compound material containing the element as a main component. A semiconductor film such as a polycrystalline silicon film doped with an impurity element such as phosphorus may be used. Furthermore, an AgPdCu alloy may be used. Furthermore, the following combinations may be used: a first conductive film made of a tantalum (Ta) film and a second conductive film made of a tungsten (W) film; a combination of a first conductive film made of a titanium nitride (TiN) film and a second conductive film made of a W film; a combination of a first conductive film made of a tantalum nitride (TaN) film and a second conductive film made of an Al film; and a combination of a first conductive film made of a tantalum nitride (TaN) film and a second conductive film made of a Cu film may be used.

Next, resist masks 210 to 215 are formed by photolithography, and a first etching treatment for forming electrodes and wiring is conducted. The first etching treatment is conducted under first and second etching conditions. In the present embodiment, under the first etching condition, etching was conducted by generating plasma by an inductively coupled plasma (ICP) etching method, using $CF_4$, $Cl_2$, and $O_2$ as an etching gas at a gas flow ratio of 25/25/10 (sccm) respectively with an RF (13.56 MHZ) power of 500 W supplied to a coil-type electrode under a pressure of 1 Pa. The electrode area on the substrate side has a size of 12.5 cm×12.5 cm, and the coil-type electrode (herein, a quartz disk provided with a coil) has a disk shape with a diameter of 25 cm. As the etching gas, a chlorine type gas such as $Cl_2$, $BCl_3$, $SiCl_4$, or $CCl_4$, or a fluorine type gas such as $CF_4$, $SF_6$, and $NF_3$, or $O_2$ can be appropriately used. Herein, a dry etching apparatus (Model E645-□ICP) using ICP produced by Matsushita Electric Industrial Co., Ltd. was used. An RF (13.56 MHZ) power of 150 W was also supplied to the substrate side (sample stage), whereby a substantially negative self-bias voltage was applied. Under the first etching condition, the W film is etched, and the ends of the first conductive layer are tapered. The etching speed with respect to W under the first etching condition was 200.39 nm/min, the etching speed with respect to TaN under the first etching condition is 80.32 nm/min, and the selection ratio of W with respect to TaN is about 2.5. Furthermore, a taper angle of W becomes about 26° under the first etching condition.

Thereafter, the etching condition was changed to the second etching condition without removing the resist masks 210 to 215, and etching was conducted for about 30 seconds by generating plasma, using $CF_4$ and $Cl_2$ as an etching gas at a gas flow ratio of 30/30 (sccm) respectively with an RF (13.56 MHZ) power of 500 W supplied to a coil-type electrode under a pressure of 1 Pa. An RF (13.56 MHZ) power of 20 W is also supplied to the substrate side (sample stage), whereby a substantially negative self-bias voltage is applied. Under the second etching condition using a mixture of $CF_4$ and $Cl_2$, the W film and the TaN film are etched to the same degree. The etching speed with respect to W under the second etching condition is 58.97 nm/min, and the etching speed with respect to TaN under the second etching condition is 66.43 nm/min. In order to conduct etching without leaving a residue on the gate insulating film, an etching time may be increased at a rate of about 10 to 20%.

In the above-mentioned first etching treatment, by appropriately forming the shape of a resist mask, the ends of the first conductive layers and the second conductive layers are tapered due to the effect of a bias voltage applied to the substrate side. The angle of the taper portions may be set at 15° to 45°.

Thus, first-shape conductive layers 216 to 221 (composed of first conductive layers 216a to 221a and second conductive layers 216b to 221b) are formed by the first etching treatment. Although not shown, regions of the insulating film 207 to be the gate insulating film, not covered with the first-shape conductive layers 216 to 221 are etched by about 10 to 20 mm to be thin.

Then, a first doping treatment is conducted without removing the resist masks 210 to 215, and an n-type impurity element is added to the semiconductor layer (FIG. 3B). The doping treatment may be conducted by ion doping or ion implantation. Ion doping is conducted at a dose amount of $1 \times 10^{13}$ to $1 \times 10^{15}/cm^2$ and an acceleration voltage of 60 to 100 keV. In the present embodiment, ion doping was conducted at a dose amount of $5 \times 10^{14}/cm^2$ and an acceleration voltage of 80 keV. As the n-type impurity element, an element belonging to Group XV, typically, phosphorus (P) or arsenic (As) is used. Herein, phosphorus (P) was used. In this case, the conductive layers 216 to 221 function as a mask with respect to the n-type impurity element and high-concentration impurity regions 222 to 233 are formed in a self-alignment manner. An n-type impurity element is added to the high-concentration impurity regions 222 to 233 in a concentration range of $3 \times 10^{19}$ to $3 \times 10^{20}/cm^3$.

Then, a second etching treatment is conducted without removing the resist masks. Herein, etching was conducted for 25 seconds by generating plasma, using $SF_6$, $Cl_2$, and $O_2$ as an etching gas at a gas flow ratio of 24/12/24 (sccm) respectively with an RF (13.56 MHZ) power of 700 W supplied to a coil-type electrode under a pressure of 1.3 Pa. An RF (13.56 MHZ) power of 10 W is also supplied to the substrate side (sample stage), whereby a substantially negative self-bias voltage is applied. The etching speed with respect to W in the second etching treatment is 227.3 nm/min, the etching speed with respect to TaN in the second etching treatment is 32.1 nm/min, the selection ratio of W with respect to TaN is 7.1, the etching speed with respect to SiON that is the insulating film 207 is 33.7 nm/min, and the selection ratio of W with respect to TaN is 6.83. Thus, in the case of using $SF_6$ as an etching gas, the selection ratio with respect to the insulating film 207 is high, so that a decrease in a film can be suppressed. Furthermore, in a TFT of a driving circuit, reliability is higher as the width of taper portions in a channel length direction is longer. Therefore, when taper portions are formed, it is effective to conduct dry etching with an etching gas containing $SF_6$.

The taper angle of W became 70° in the second etching treatment. Second conductive layers 234b to 239b are formed by the second etching treatment. On the other hand, the first conductive layers are hardly etched, and first conductive layers 234a to 239a are formed. Although not shown, actually, the width of the first conductive layers recedes by about 0.15 μm (i.e., about 0.3 μm in the entire line width), compared with the state before the second etching treatment.

In the second etching treatment, $CF_4$, $Cl_2$, and $O_2$ can be used as an etching gas. In this case, etching may be conducted by generating plasma at a gas flow ratio of 25/25/10, respectively, (sccm) with an RF (13.56 MHZ) power of 500 W supplied to a coil-type electrode under a pressure of 1 Pa. An RF (13.56 MHZ) power of 20 W is also supplied to the substrate side (sample stage), whereby a substantially negative self-bias voltage is applied. The etching speed with respect to W in the case of using $CF_4$, $Cl_2$, and $O_2$ is 124.62 nm/min, the etching speed with respect to TaN in this case is 20.67 nm/min, and the selection ratio of W with respect to TaN is 6.05. Therefore, the W film is selectively etched.

Then, after the resist masks are removed, a second doping treatment is conducted to obtain a state shown in FIG. 3C. Doping is conducted using the second conductive layers 234b to 239b as masks with respect to an impurity element so that the impurity element is added to the semiconductor layer under the taper portions of the first conductive layers. In the present embodiment, plasma doping was conducted using phosphorus (P) as the impurity element under the condition of a dose amount of $1.5 \times 10^{14}/cm^2$ an acceleration voltage of 90 keV, an ion current density of 0.5 μA/cm², a phosphine ($PH_3$) 5% hydrogen diluted gas, and a gas flow ratio of 30 (sccm). Thus, low-concentration impurity regions 241 to 254 overlapping the first conductive layers are formed in a self-alignment manner. The concentration of phosphorus (P) added to the low-concentration impurity regions 241 to 254 is $1 \times 10^{17}$ to $1 \times 10^{19}/cm^3$, and has a concentration gradient depending upon the film thickness of the taper portions of the first conductive layers. In the semiconductor layers overlapping the taper portions of the first conductive layers, an impurity concentration (P concentration) is gradually decreased toward the inside from the ends of the taper portions of the first conductive layers. Furthermore, the impurity element is also added to the high-concentration impurity regions 222 to 233 whereby high-concentration impurity regions 255 to 266 are formed.

Then, semiconductor layers to be active layers of n-channel TFTs are covered with resist masks 267 to 269, and a third doping treatment is conducted. Because of the third doping treatment, p-type impurity regions 270 to 273 (high-concentration impurity regions 270a to 273a and low-concentration impurity regions 270b to 273b) are formed in semiconductor layers to be active layers of p-channel TFTs, in which an impurity element providing a conductivity (p-type) opposite to the above-mentioned n-type is added. Since doping is conducted by allowing the impurity element to pass through taper portions, the p-type low-concentration impurity regions 270b to 273b have a concentration gradient similar to that of the n-type low-concentration impurity regions 241 to 254 (FIG. 4A). An impurity element providing a p-type is added using the first conductive layers 234a and 236b as a mask with respect to the impurity element, whereby p-type impurity regions are formed. In the present embodiment, the p-type impurity regions 270 to 273 are formed by ion doping, using diborane ($B_2H_6$) under the condition of a dose amount of $1 \times 1015/cm^2$ and an acceleration voltage of 30 keV. In the first doping treatment and the second doping treatment, phosphorus is added to the impurity regions 270a to 273a in different concentrations, respectively. However, by conducting a doping treatment so that the concentration of boron becomes $6 \times 10^{19}$ to $6 \times 10^{20}/cm^3$ in any of these regions, these regions function as source regions and drain regions of p-channel TFTs. Therefore, there is no problem.

Furthermore, in the case where the condition of preventing a decrease in a film is used in the second etching treatment, for example, in the case where $SF_6$ is used as an etching gas, doping of boron is made easy. Therefore, etching (reactive ion etching (RIE) using a $CHF_3$ gas) for thinning the insulating film 207 may be conducted before the third doping treatment.

Then, a resist mask 274 is formed, and a third etching treatment is conducted. In the third etching treatment, only taper portions of the first conductive layers are selectively etched. The third etching treatment is conducted in an ICP etching apparatus, using $Cl_3$ having a high selection ratio with respect to W as an etching gas. In the present embodiment, etching was conducted for 30 seconds by generating plasma at a gas flow ratio of $Cl_3$ of 80 (sccm) with an RF (13.56 MHZ) power of 350 W supplied to a coil-type electrodes under a pressure of 1.2 Pa. An RF (13.56 MHZ) power of 50 W is also supplied to the substrate side (sample stage), whereby a substantially negative self-bias voltage is applied. Because of the third etching, the first conductive layers 237c to 239c are formed (FIG. 4B).

Because of the third etching treatment, in a pixel portion, low-concentration impurity regions (LDD regions) 247 to 254 having a concentration gradient are formed so as not to overlap the first conductive layers 237c to 239c. In a driving circuit, the low-concentration impurity regions (gate-drain overlapped LDD (GOLD) regions) 241 to 246 remain overlapping the first conductive layers 234a to 236a. Thus, the configuration of a TFT is varied depending upon each circuit.

Furthermore, an electrode composed of the first conductive layer 237c and the second conductive layer 237b will become a gate electrode of an n-channel TFT in a sampling circuit to be formed in the subsequent process. Similarly, an electrode composed of the first conductive layer 238c and the second conductive layer 238b will become a gate electrode of an n-channel TFT in the pixel portion to be formed in the subsequent process. An electrode composed of the first conductive layer 239c and the second conductive layer 239b will become one electrode of a storage capacitor in the pixel portion to be formed in the subsequent process.

In the present embodiment, the third etching treatment is conducted after the third doping treatment. However, the third doping treatment may be conducted after the third etching treatment.

Then, the resist mask 274 is removed, and a first interlayer insulating film 275 is formed. As the first interlayer insulating film 275, an insulating film containing silicon is formed to a thickness of 10 to 200 nm by plasma CVD or sputtering. The first interlayer insulating film 275 has a function as an etching stopper for preventing overetching of semiconductor layers when contact holes are formed in the insulating film decreased in thickness. In the present embodiment, a silicon oxide film with a thickness of 50 nm was formed by plasma CVD. Needless to say, the first interlayer insulating film 275 is not limited to a silicon oxide film, and a single layer or a multi-layer structure of an insulating film containing silicon may be used.

Next, as shown in FIG. 4C, the impurity elements added to each semiconductor layer are activated. The activation process is conducted by irradiating the reverse surface with a YAG laser or an excimer laser. By irradiation from the reverse surface, impurity regions overlapping gate electrodes via the insulating film can be activated.

Figure 8:
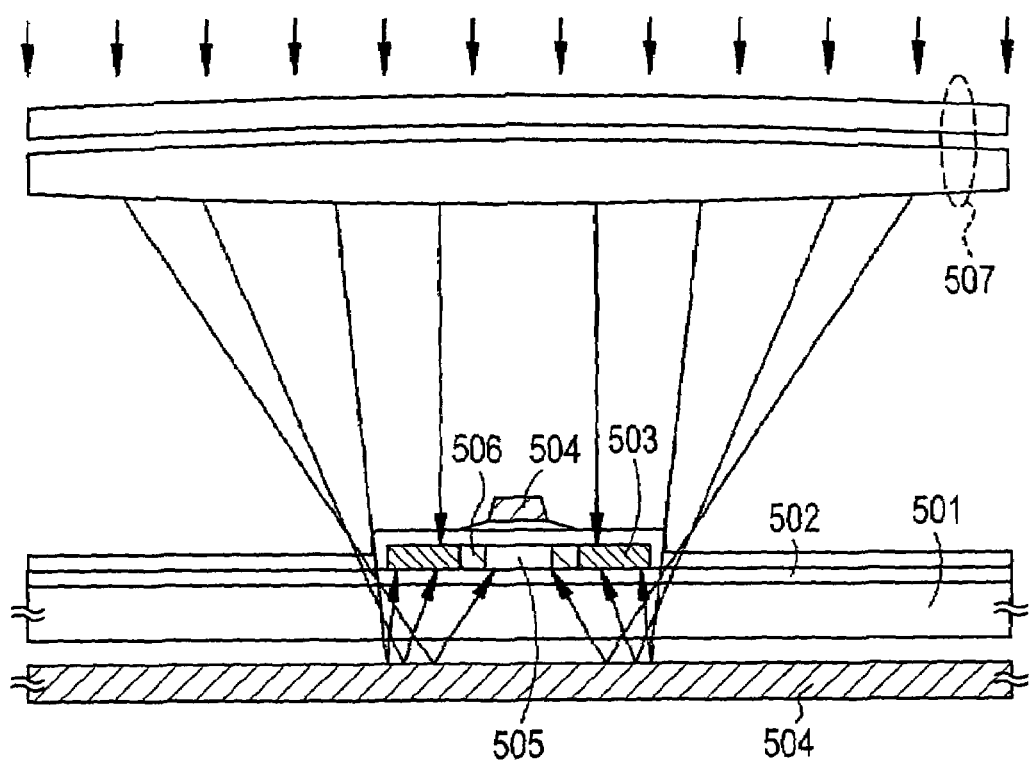
FIG. 8 shows an activation process.

Furthermore, laser light may be radiated using a reflective plate. In this case, it is desirable to use a solid laser (typically, a YAG laser). In the case of using a reflective plate, as shown in a schematic view in FIG. 8, the second harmonic or the third harmonic of a linear YAG layer is radiated simultaneously from the front surface and the reverse surface of a substrate 501 by using a reflective plate 504 having a mirror surface. A YAG laser is visible light. Therefore, a YAG laser is not absorbed by a substrate if the substrate has light transparency, and is absorbed by amorphous silicon. In particular, in the case where low-concentration impurity regions are provided under gate electrodes as in the present embodiment, it has been very difficult to activate impurity regions overlapping gate electrodes via the insulating film. By an activation method using the reflective plate 504 shown in FIG. 8, the impurity element contained in an impurity region 506 or a channel formation region 505 can be activated. In FIG. 8, reference numeral 502 denotes a base film, 503 denotes high-concentration impurity regions, and 507 denotes a cylindrical lens. Rapid thermal annealing (RTA) can also be applied in place of YAG laser annealing.

In the present embodiment, the first interlayer insulating film is formed before the above-mentioned activation. However, the first interlayer insulating film may be formed after the above-mentioned activation.

Then, a second interlayer insulating film 276 made of a silicon nitride film is formed, and heat treatment (300° C. to 550° C. 1 to 12 hours) is conducted. Whereby the semiconductor layers are hydrogenated. In the present embodiment, heat treatment was conducted at 410° C. for 1 hour in a nitrogen atmosphere. In this process, dangling bonds of the semiconductor layers are terminated with hydrogen contained in the second interlayer insulating film 276. Irrespective of the presence of the first interlayer insulating film, the semiconductor layers can be hydrogenated. As another means for hydrogenation, plasma hydrogenation (using hydrogen excited with plasma) may be conducted.

Then, a third interlayer insulating film 277 made of an organic insulating material is formed on the second interlayer insulating film 276. In the present embodiment, an acrylic resin film having a thickness of 1.6 μm was formed. Then, patterning is conducted so as to form contact holes reaching each impurity region (257, 258, 261 to 263, 265, 270a, 271a, 272a, 273a). In the present embodiment, a plurality of etching treatments were conducted. In the present embodiment, the third interlayer insulating film was etched using the second interlayer insulating film as an etching stopper, the second interlayer insulating film was etched using the first interlayer insulating film as an etching stopper, and the first interlayer insulating film was etched.

Then, electrodes 278 to 286 electrically connected to the impurity regions (257, 258, 261 to 263, 270a, 271a, 272a, 273a) and a pixel electrode 287 electrically connected to the impurity region 265 are formed. A material excellent in reflectivity such as a film containing Al or Ag as its main component, a layered film thereof, or the like is used for these electrodes and pixel electrodes.

Figure 5:
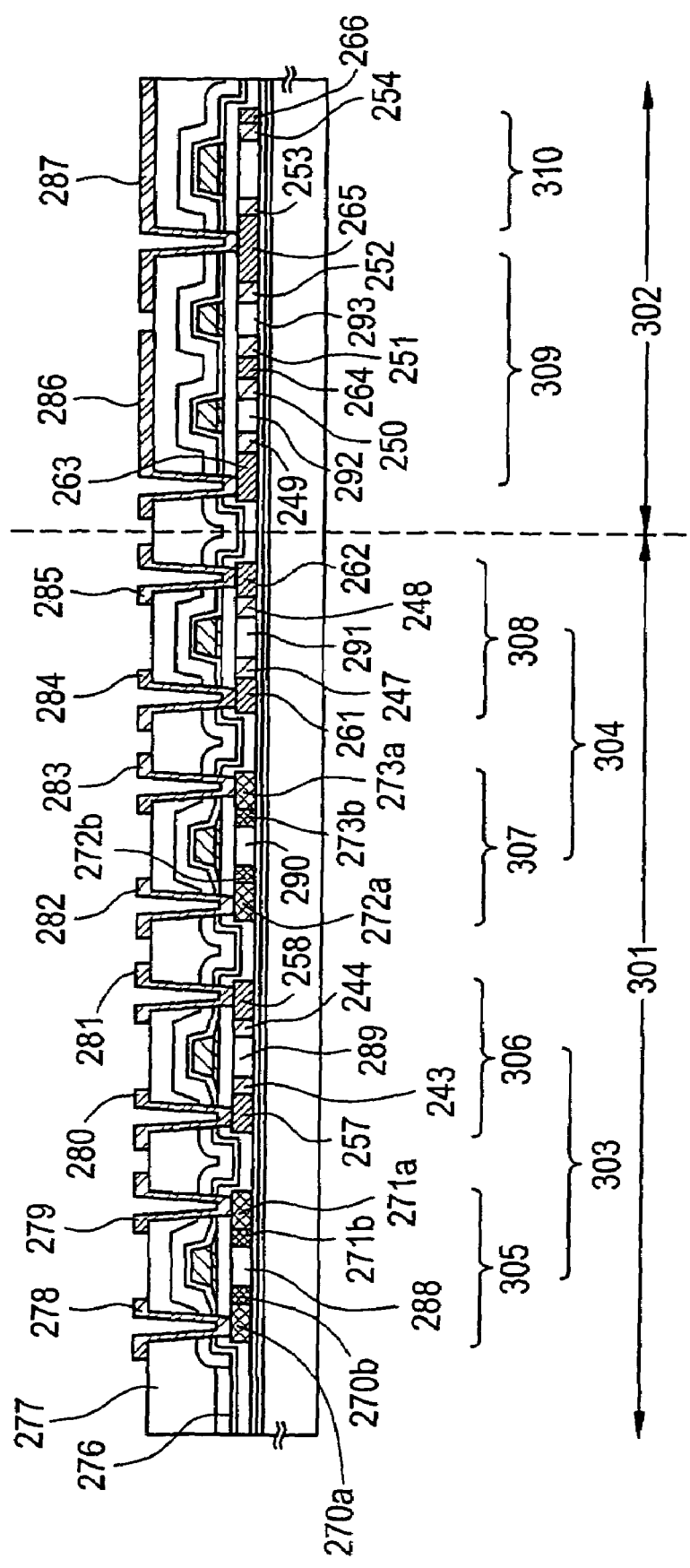
FIG. 5 shows processes of manufacturing an active matrix type liquid crystal display.

As described above, a driving, circuit 301 including a logic circuit portion 303 composed of an n-channel TFT 306 and a p-channel TFT 305 and a sampling circuit portion 304 composed of an n-channel TFT 308 and a p-channel TFT 307, and a pixel portion 302 having a pixel TFT made of an n-channel TFT 309 and a storage capacitor 310 can be formed on the same substrate. In the present specification, such a substrate is referred to as an active matrix substrate for convenience. (FIG. 5)

In the present embodiment, the configuration of a TFT is varied depending upon each circuit.

A low power consumption is required of the n-channel TFT 309 in the pixel portion, so that it is desirable that the n-channel TFT 309 has a TFT configuration with a sufficiently low OFF current value. Furthermore, in the present embodiment, the low-concentration impurity regions 249 to 252 have a concentration gradient and do not overlap the gate electrodes (238b, 238c). Furthermore, the end of the gate electrode of the n-channel TFT 309 is substantially matched With the interface between the channel formation region and the low-concentration impurity region via the gate insulating film. Furthermore, in the concentration distribution of the respective low-concentration impurity regions 249 to 252, an impurity concentration is increased with a distance from the channel formation regions 292 and 293.

In the present embodiment, the n-channel TFT 309 has a double gate structure in which two channel formation regions are formed between a source region and a drain region. However, the present embodiment is not limited to a double gate structure. A single gate structure in which one channel formation region is formed or a triple gate structure in which three channel formation regions are formed may be used.

Furthermore, in the impurity regions 253, 254, 265, and 266 that function as one electrode of the storage capacitor 310, an impurity element providing an n-type is added, respectively. The storage capacitor 310 is composed of the insulating film 207 as a dielectric, the electrodes 239b and 239c, and the semiconductor layer. In the present embodiment, the impurity regions do not overlap the electrodes 239b and 239c. However, if they overlap each other, capacitance can be further increased. The present invention is not limited to the structure in which a storage capacitor is formed in the present embodiment. It is also possible to use a known structure, e.g., a capacitor using capacitive wiring.

Furthermore, the sampling circuit portion 304, typically, the n-channel TFT 308 of the analog switch circuit preferably has a low OFF current value. In the present embodiment, low-concentration impurity regions 247 and 248 have a concentration gradient, and do not overlap gate electrodes 237b and 237c. Furthermore, in the concentration distribution of the respective low-concentration impurity regions 247 and 248, an impurity concentration is increased with a distance from the channel formation region 291. If an ON current value or reliability are regarded as serious, the low-concentration impurity regions may overlap the gate electrodes.

Furthermore, since an ON current value or reliability is regarded as serious in the p-channel TFT 307, the low-concentration impurity regions 272b and 273b overlap the gate electrodes 236a and 236b. Furthermore, in the concentration distribution of the respective low-concentration impurity regions 272b and 273b, an impurity concentration is increased with a distance from the channel formation region 290. Furthermore, the end of the gate electrode of the p-channel TFT 307 is substantially matched with the interface between the low-concentration impurity regions 272b, 273b and the high-concentration impurity regions 272a, 273a via the gate insulating film.

Furthermore, an ON current value or reliability is regarded as serious in the p-channel TFT 305 of the logic circuit portion. Therefore, the low-concentration impurity regions 270b and 271b overlap the gate electrodes 234a and 234b. In the concentration distribution of the respective low-concentration impurity regions 270b and 271b, an impurity concentration is increased with a distance from the channel formation region 288.

Furthermore, similarly, the n-channel TFT 306 has a configuration in which the low-concentration impurity regions 272b and 273b overlap the gate electrodes 235a and 235b. Furthermore, in the concentration distribution of the respective low-concentration impurity regions 272b and 273b, an impurity concentration is increased with a distance from the channel formation region 289.

Thus, in the present embodiment, the driving circuit including the TFT 306 with high reliability and the pixel portion having the pixel TFT 309 with an OFF current value reduced can be simultaneously formed on the same substrate.

In the present embodiment, a great amount of rare gas element is added. Therefore, the rare gas element is also added to the base film and the substrate. In addition to the rare gas element, hydrogen, oxygen, or moisture is also added to the base film and the substrate; however, it is likely to diffuse due to heat treatment or the like after doping. On the other hand, the rare gas element is unlikely to diffuse or leave even by heat treatment or the like at a relatively high temperature. The rare gas element is added to regions other than those covered with the mask 106b of the base film and the substrate, i.e., the regions other than those in which the semiconductor layers 202 to 206 are disposed.

Embodiment 2

In this embodiment, a process for manufacturing an active matrix liquid crystal display device using the active matrix substrate manufactured in embodiment 1 will be described. The description is made with reference to FIG. 6.

First, after the active matrix substrate with the state of FIG. 5 is obtained according to embodiment 1, an orientation film 401 is formed on the active matrix substrate of FIG. 5 to perform a rubbing process. Note that, in this embodiment, before the formation of the orientation film 401, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate 400 is prepared. A color filter in which a colored layer 402 and a light shielding layer 403 are arranged corresponding to each pixel is provided in this opposing substrate 400. Also, a light shielding layer 404 is provided in a portion of a driver circuit. A leveling film 404 for covering this color filter and the light shielding layer 403 is provided. Next, a counter electrode 405 made of a transparent conductive film is formed in a pixel portion, and then an orientation film 406 is formed on the entire surface of the opposing substrate 406 to perform a rubbing process.

Figure 6:
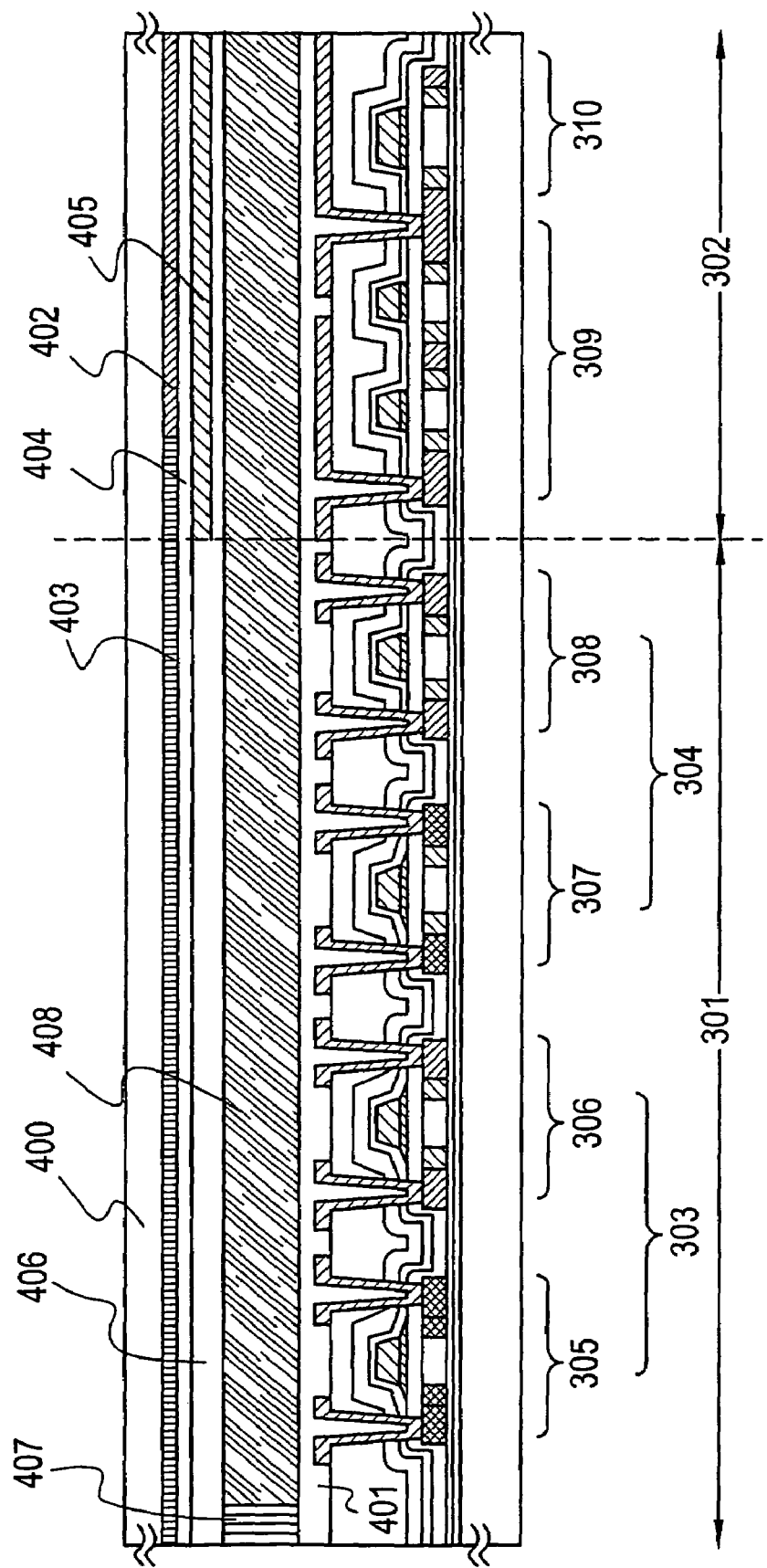
FIG. 6 shows a cross-sectional configuration of an active matrix type liquid crystal display apparatus.

Then, the active matrix substrate in which the pixel portion and the driver circuit are formed and the opposing substrate are adhered to each other by using a sealing member 407. Filler is mixed with the sealing member 407, and two substrates are adhered to each other with a uniform interval by this filler and the columnar spacer. After that, a liquid crystal material 408 is injected into a space between both substrates and then completely encapsulated by a sealing member (not shown). A known liquid crystal material may be used as the liquid crystal material 408. Thus, the active matrix liquid crystal display device as shown in FIG. 6 is completed. If necessary, the active matrix substrate or the opposing substrate is cut with a predetermined shape. Also, a polarization plate and the like are suitably provided using a known technique. And, an FPC is adhered to the active matrix liquid crystal display device using a known technique.

Figure 7:
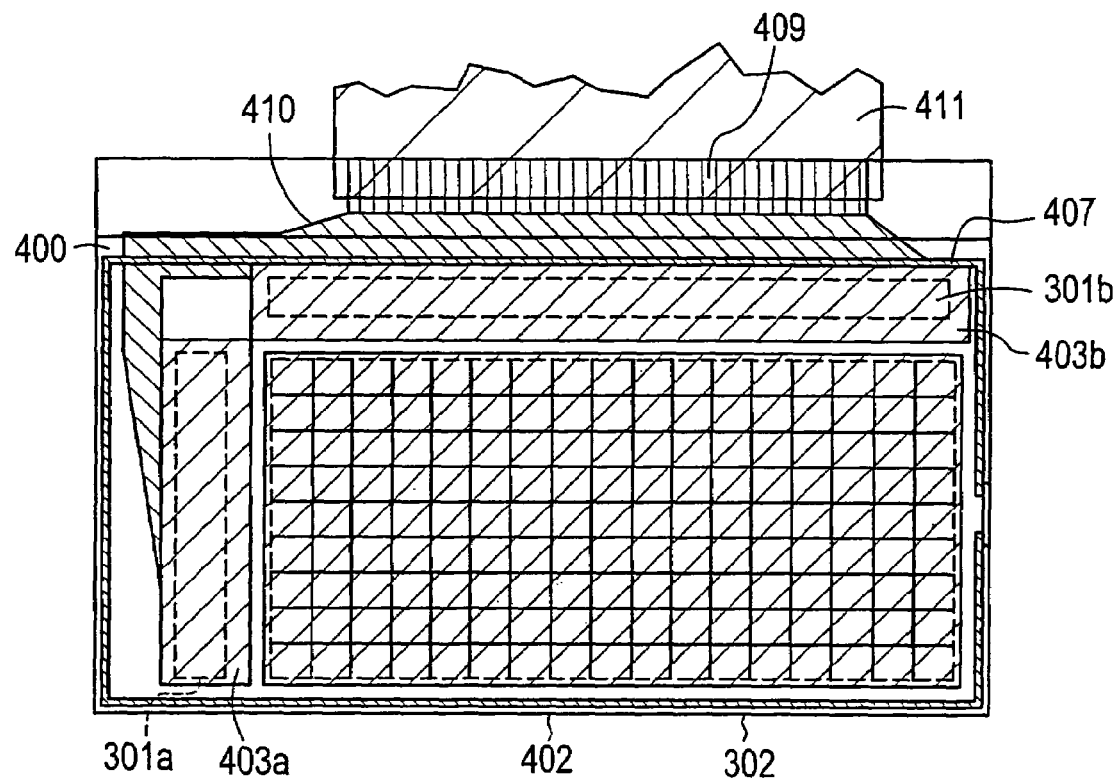
FIG. 7 shows an outer appearance of a liquid crystal module.

A structure of a liquid crystal module thus obtained will be described using a top view of FIG. 7. Note that the same reference symbols are used for portions corresponding to those of FIG. 6.

The top view of FIG. 7A shows the state that the active matrix substrate and the opposing substrate 411 are adhered to each other through the sealing member 407. In the active matrix substrate, an external input terminal 409 to which the pixel portion, the driver circuit, and the FPC (flexible printed circuit) are adhered, a wiring 410 for connecting the external input terminal 409 with an input portion of the respective circuits, and the like are formed. Also, the color filter and the like are formed in the opposing substrate 400.

A light shielding layer 403a is provided in the opposing substrate side so as to overlap with a gate wiring side driver circuit 301a. Also, a light shielding layer 403b is provided in the opposing substrate side so as to overlap with a source wiring side driver circuit 301b. In a color filter 402 which is provided in the opposing substrate side on a pixel portion 302, a light shielding layer and colored layers for respective colors (red color (R), green color (G), blue color B) and are provided corresponding to each pixel. Actually, a color display is formed using three colors, that is the colored layer for the red color (R), the colored layer for the green color (G), and the colored layer for the blue color B. Note that the colored layers for respective colors are arbitrarily arranged.

Here, for a color display, the color filter 402 is provided in the opposing substrate. However, the present invention is not particularly limited to this case and in manufacturing the active matrix substrate, the color filter may be formed in the active matrix substrate.

Also, in the color filter, the light shielding layer is provided between adjacent pixels such that a portion except for a display region is shielded. The light shielding layers 403a and 403b are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, the light shielding layer may be formed in the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light-shielded.

Also, the FPC which is composed of a base film and a wiring is adhered to the external input terminal by using an anisotropic conductive resin. Further, a reinforced plate is provided to increase a mechanical strength.

The liquid crystal module manufactured above can be used as the display portion of various electronic equipments.

Embodiment 3

The present embodiment is different from Embodiment 1 in the process after formation of the insulating film 106a to be a mask. In the present embodiment, after a resist mask is removed, a rare gas element is added. The remaining processes are the same as those in Embodiment 1, so that the same reference numerals as those in FIGS. 2A to 2D are used in FIGS. 9A to 9D.

Figure 9A:
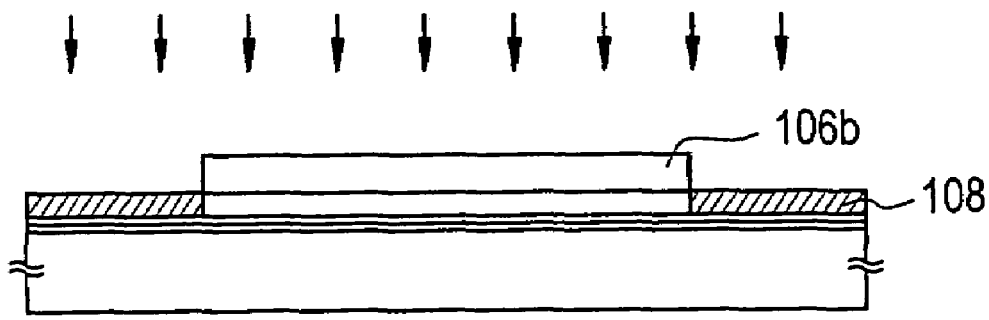
FIGS. 9A to 9D show processes of manufacturing a semiconductor layer.

First, the same state as that in FIG. 1D is obtained in accordance with the embodiment. Then, a resist mask is formed in accordance with the embodiment, and a silicon oxide film is patterned to form a mask made of a silicon oxide film. After the resist mask is removed, a rare gas element is added (FIG. 9A).

Figure 9B:
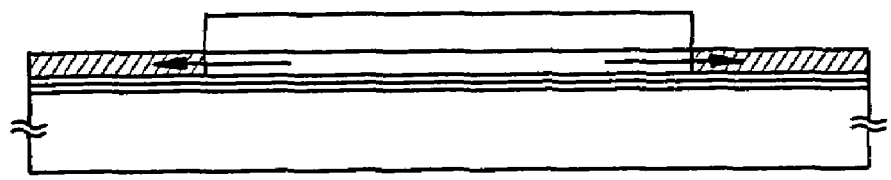
Figure 9C:
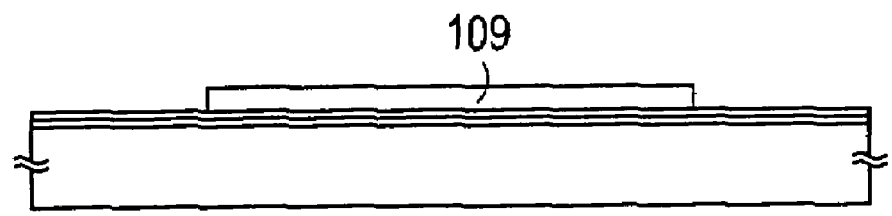
Figure 9D:
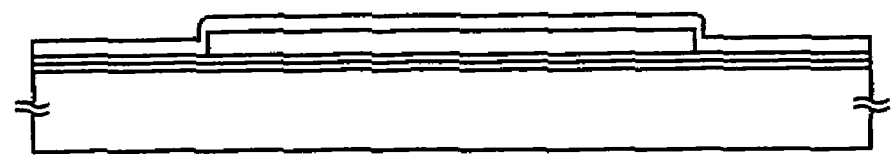

If the remaining processes are conducted in accordance with Embodiment 3, states in FIGS. 9B to 9D are obtained. If the remaining processes are conducted in accordance with Embodiment 1, the active matrix substrate shown in FIG. 6 is obtained.

The present embodiment can be combined with Embodiment 2.

Embodiment 4

The present embodiment is different from Embodiment 1 in the process after formation of a resist mask.

Figure 10A:
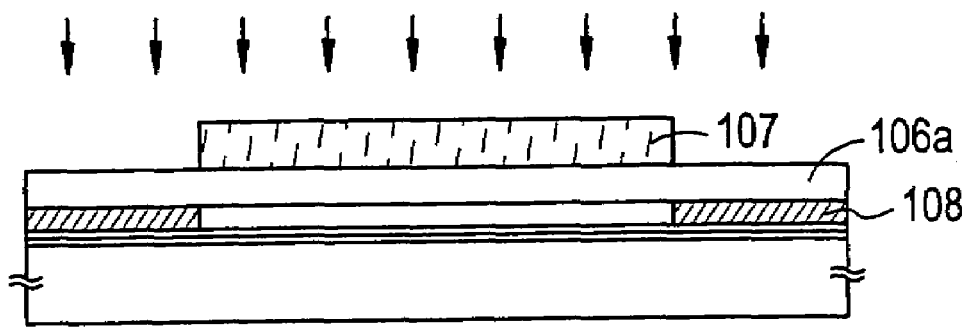
FIGS. 10A to 10D show processes of manufacturing a semiconductor layer.
Figure 20:
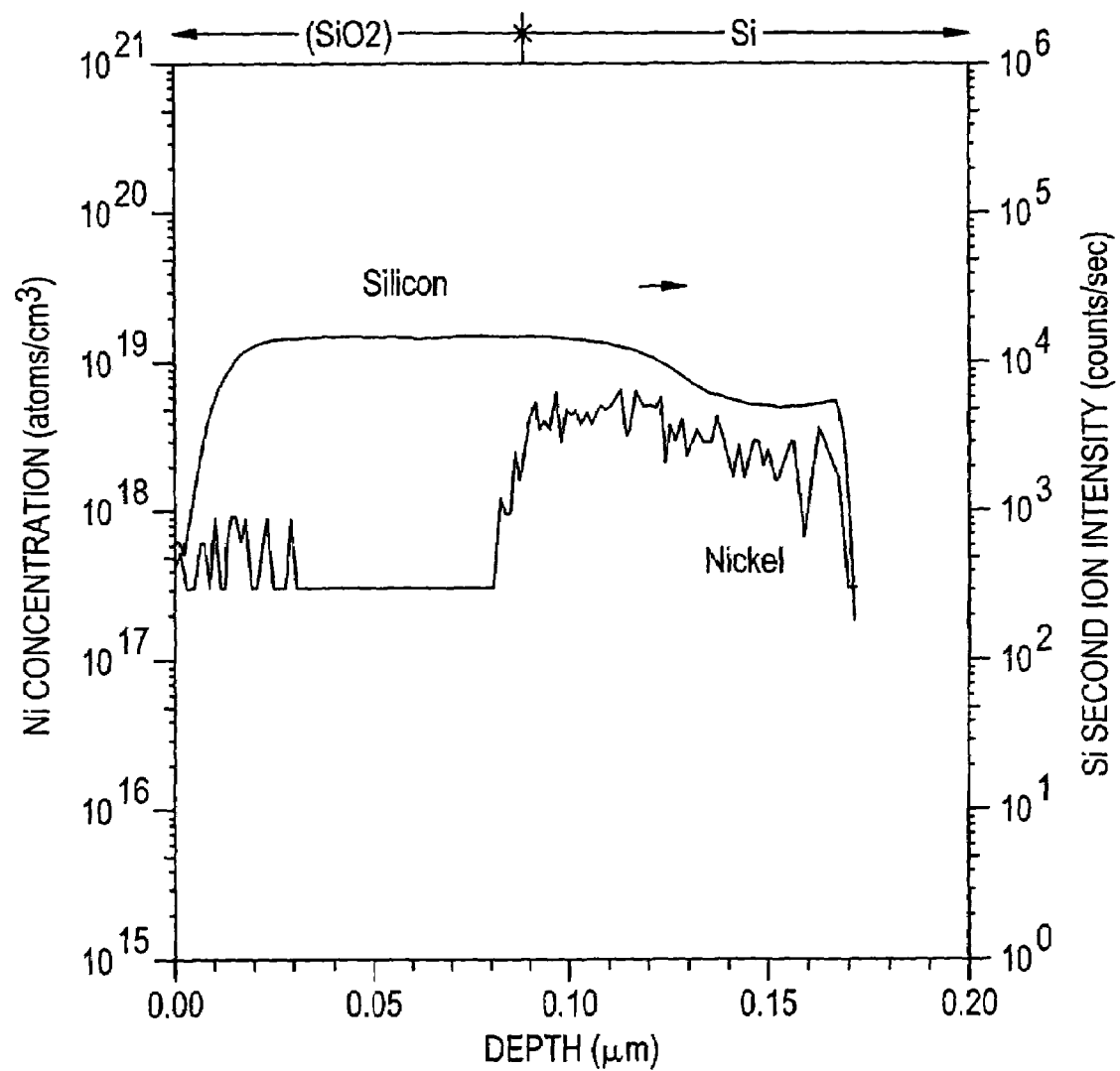
FIG. 20 is a graph showing a nickel concentration before annealing.

In the present embodiment, after a resist mask is formed, a rare gas element is added by being allowed to pass through the insulating film 106a made of a silicon oxide film, without etching the insulating film made of a silicon oxide film as in Embodiment 1 (FIG. 10A). FIG. 20 shows a concentration profile of nickel obtained by conducting SIMS analysis. FIG. 20 shows the concentration of nickel immediately after a rare gas element (herein, Ar) is added by being allowed to pass through the insulating film (thickness: 0.9 μm). Nickel is present in the semiconductor film in a concentration of $1\times10^{18}$ to $1\times10^{19}/cm^3$. The rare as element is added using 100% Ar gas as a doping gas under the conditions of a dose amount of $4\times10^{15}/cm^2$ and an acceleration voltage of 90 kV.

Figure 10B:
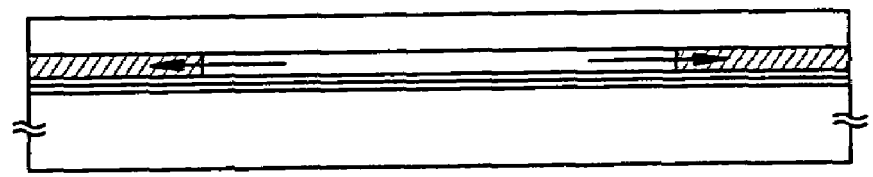
Figure 21:
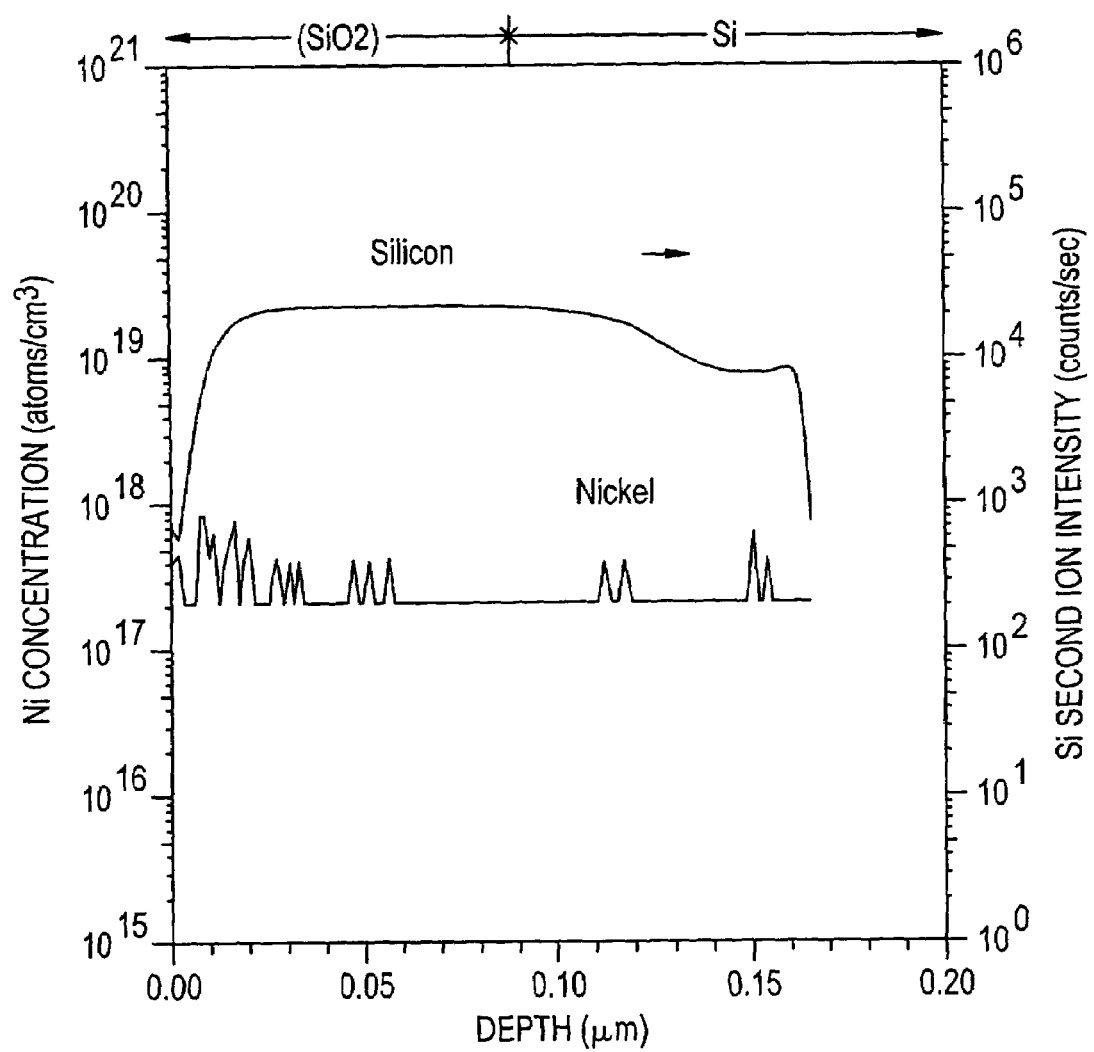
FIG. 21 is a graph showing a nickel concentration after annealing.

Then, gettering is conducted without removing the insulating film 106a made of silicon oxide (FIG. 10B). Herein, gettering is conducted at 550° C. for 4 hours. FIG. 21 shows the results obtained by conducting SIMS analysis. FIG. 21 shows that nickel in the semiconductor film has been removed by gettering to a detection lower limit.

Figure 10C:
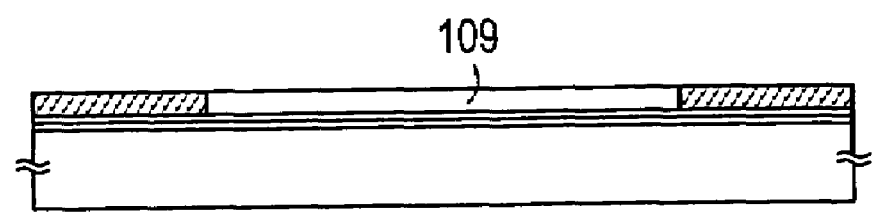

Then, the insulating film 106a is removed (FIG. 10C).

Figure 10D:
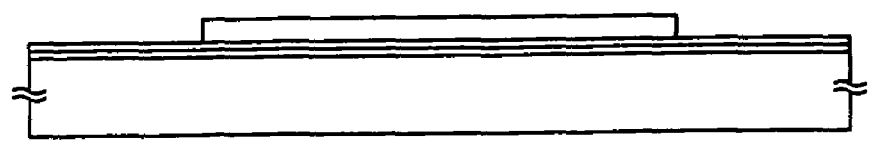

Portions (gettering sites) 108, which are made amorphous by the addition of the rare gas element in the previous process, are selectively etched (FIG. 10D).

As an etchant, a dash solution, a sato solution, a seco solution, or the like can be used. The seco solution contains chromium, so that it is not suitable for industrial purposes.

In the above-mentioned processes, only a semiconductor layer 109 made of crystalline silicon can be left.

The present embodiment can be combined with Embodiment 2.

Embodiment 5

FIGS. 11A to 11E show an embodiment in which crystallization and gettering are conducted simultaneously.

First, a blocking layer 602 and an amorphous semiconductor film 603 are formed on a substrate 601 in accordance with the embodiment. Then, a nickel-containing layer 604 is formed. Herein, a thin film of nickel was formed by sputtering.

Then, an insulating film containing silicon as its main component is formed, and a resist mask 606 is formed thereon. Then, the insulating film 605 is selectively removed by etching, using the resist mask 606, whereby a mask 605 made of an insulating film is formed.

Figure 11A:
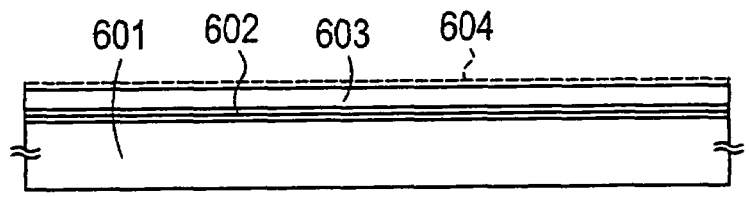
FIGS. 11A to 11E show processes of manufacturing a semiconductor layer.
Figure 11B:
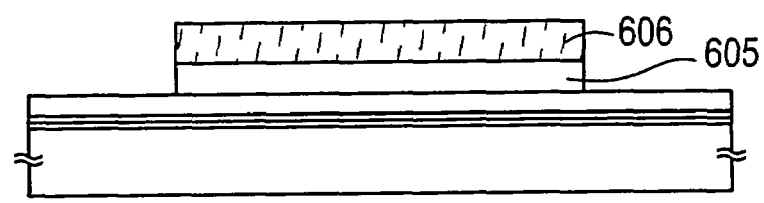
Figure 11C:
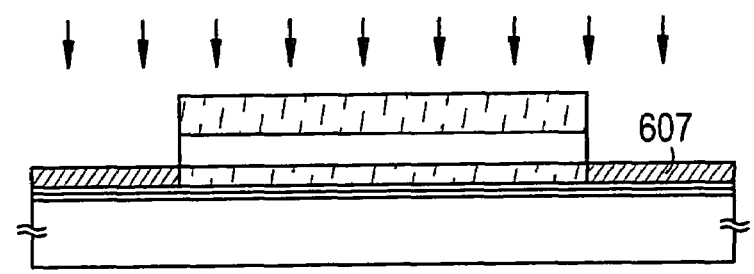
Figure 11D:
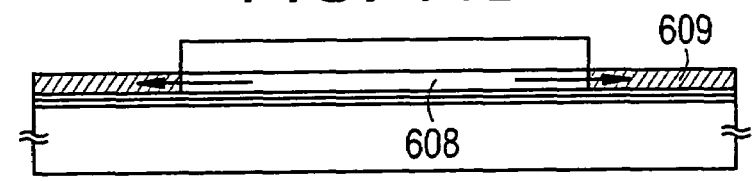
Figure 11E:
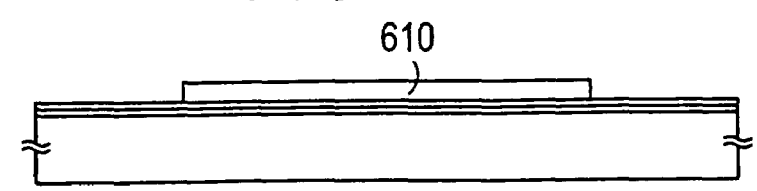

A rare gas element is added to the amorphous semiconductor film 603, using the resist mask 606 and the mask 605 made of an insulating film. In FIG. 11C, regions with the rare gas element selectively added thereto are shown as impurity regions 607.

Figure 22:
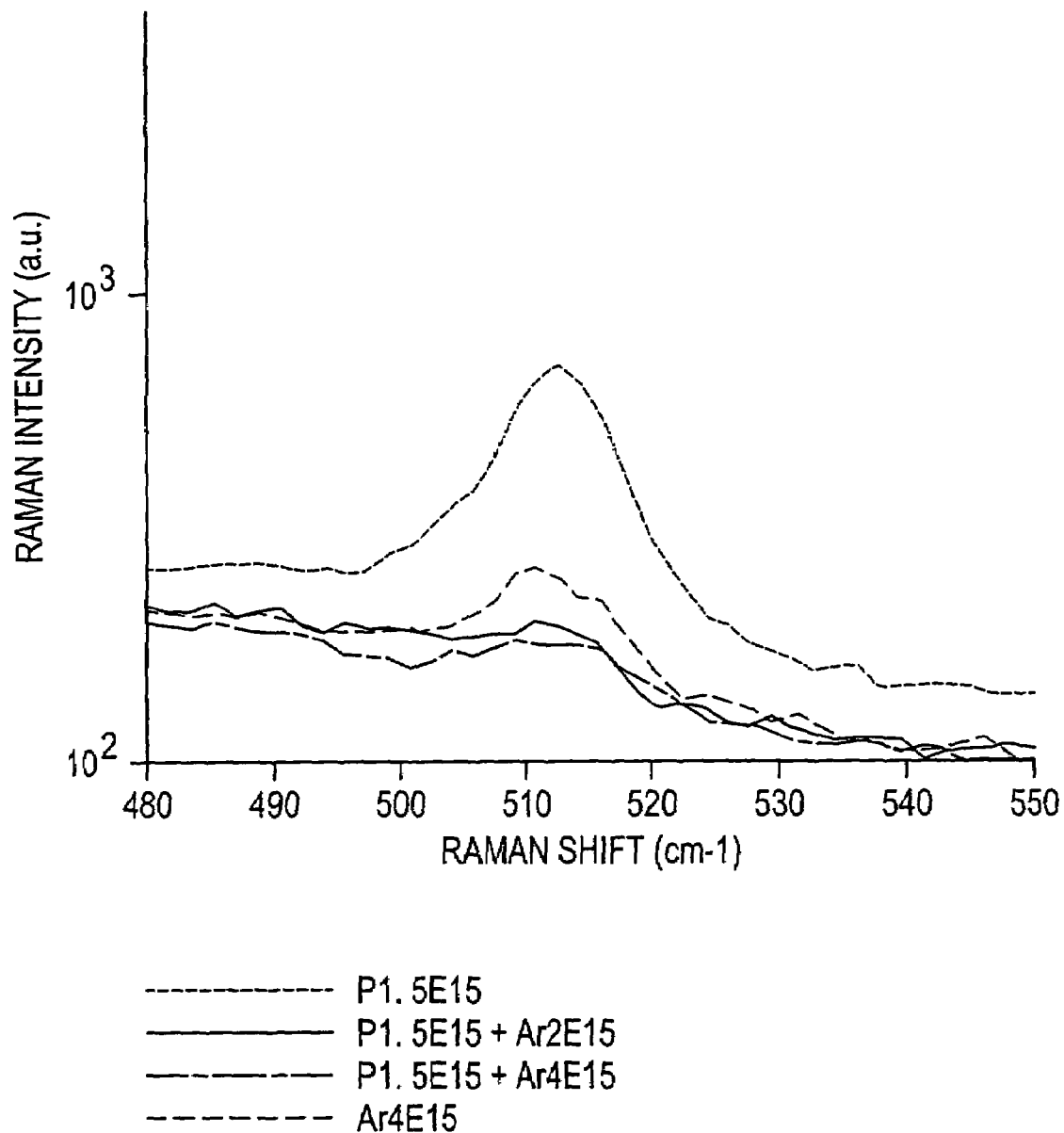
FIG. 22 is a graph showing a Raman spectrum before annealing.
Figure 23:
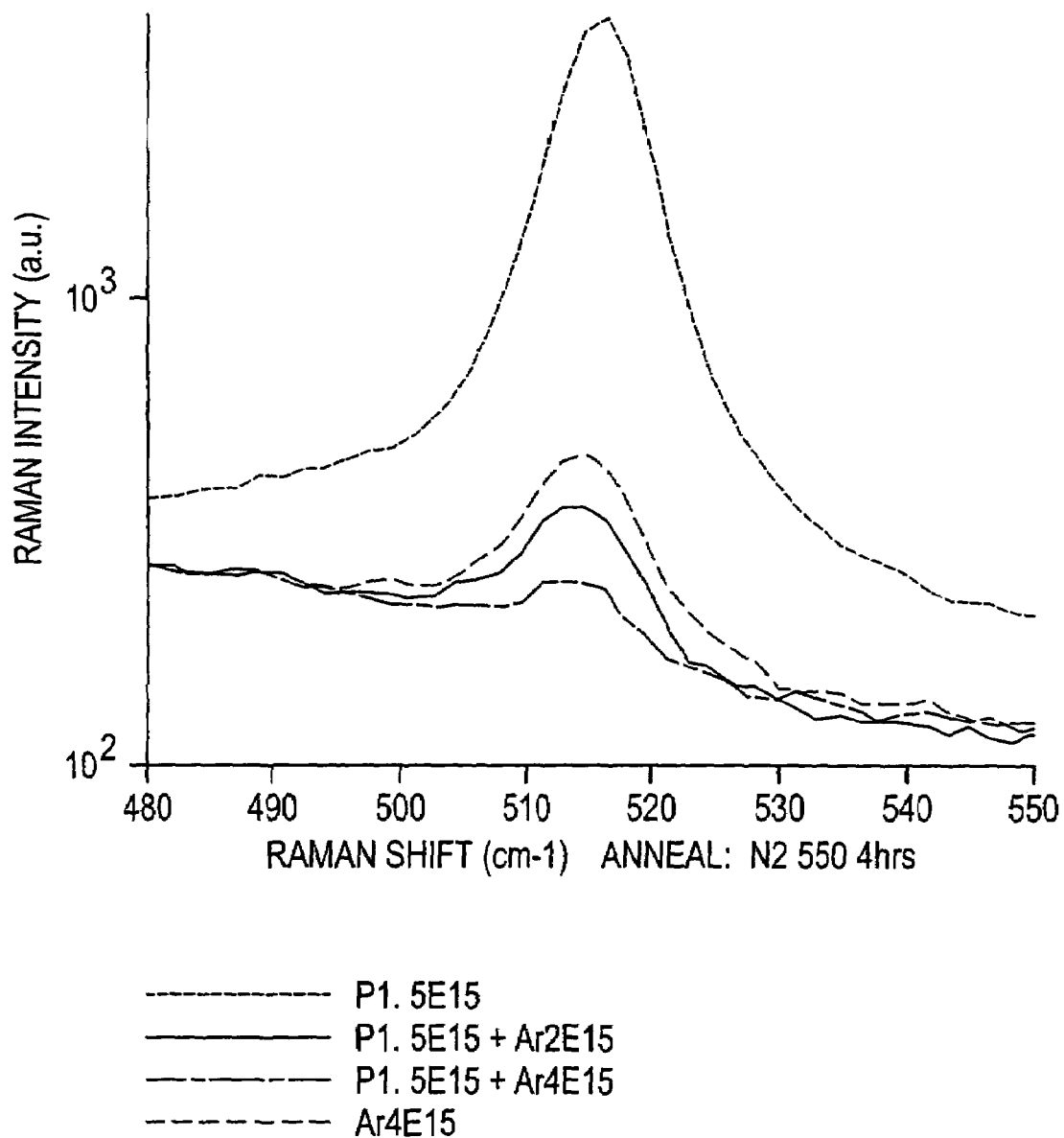
FIG. 23 is a graph showing a Raman spectrum after annealing.
Figure 24:
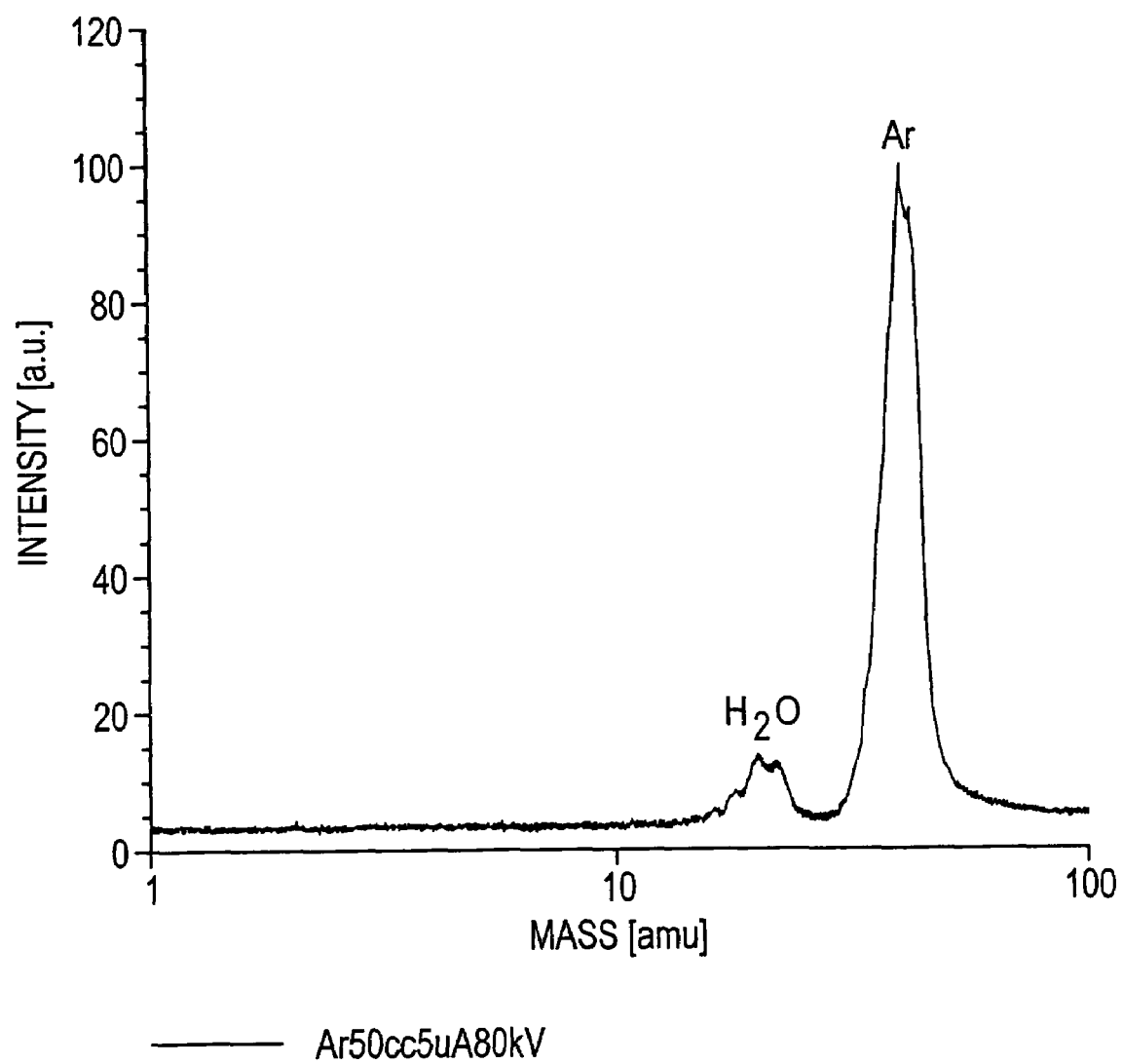
FIG. 24 is a graph showing E×B spectrum data.

Then, heat treatment or irradiation with strong light are conducted for performing both crystallization and gettering. The heat treatment may be conducted at 500° C. to 650° C. for 4 to 24 hours (e.g., 550° C. for 4 hours). Because of the heat treatment, the amorphous semiconductor film that is in contact with the mask 605 made of an insulating film is crystallized by function of nickel. In this heat treatment, nickel in the amorphous semiconductor film moves simultaneously with crystallization and gettered in the impurity regions 607 with the rare gas element added thereto. Nickel moves in directions represented by arrows in FIG. 11D. The regions with the rare gas element added thereto are hardly crystallized. In the experiment of the inventors of the present invention, in the case where a rare gas is added, crystallinity is unlikely to be recovered even if the heat treatment is conducted, compared with the case of adding phosphorus. FIGS. 22 and 23 show the comparison results. FIG. 22 shows Raman spectra immediately after the rare gas element is added under the respective conditions (Condition 1=doping of phosphorus at an acceleration voltage of 80 kV and a dose amount of $1.5\times10^{15}/cm^2$: Condition 2=doping of phosphorus at an acceleration voltage of 80 kV and a dose amount of $1.5\times10^{15}/cm^2$; doping of argon at an acceleration voltage of 90 kV and a dose amount of $2\times10^{15}/cm^2$; Condition 3=doping of phosphorus at an acceleration voltage of 80 kV and a dose amount of $1.5\times10^{15}/cm^2$, and doping of argon at an acceleration voltage of 90 kV and a dose amount of $4\times10^{15}/cm^2$; and Condition 4=doping of argon at an acceleration voltage of 90 kV and a dose amount of $4\times10^{15}/cm^2$). FIG. 3 shows Raman spectra immediately after the heat treatment is conducted at 550° C. for 4 hours in a nitrogen atmosphere.

Then, impurity regions 609 are removed using the mask 606, whereby a semiconductor layer 610 made of a crystalline semiconductor film can be obtained.

In the present embodiment, since crystallization and gettering are simultaneously conducted, throughput is remarkably enhanced.

The blocking layer 602, the amorphous semiconductor film 603, and the nickel-containing layer 604, and the insulating film containing silicon as its main component may be continuously formed without being exposed to the atmosphere by CVD.

The present embodiment can be freely combined with Embodiment 1 or 2.

Embodiment 6

FIGS. 12A to 12F show an embodiment in which a metal element is selectively added using a mask.

First, a base film (blocking layer) 902 and a semiconductor film 903 having an amorphous structure are formed on a substrate 901 in according with the embodiment or Embodiment 1. Then, an insulating film containing silicon as its main component is formed. When the base film 902, the semiconductor film 903, and the insulating film are continuously formed without being exposed to the atmosphere, an impurity is not mixed therein, which is preferable.

Figure 12A:
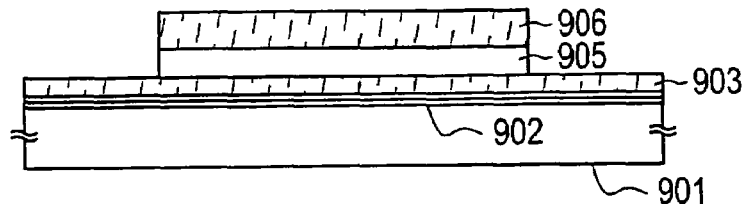
FIGS. 12A to 12F show processes of manufacturing a semiconductor layer.

Then, a resist mask 906 is formed, and the insulating film is selectively removed by etching, whereby a mask 905 made of an insulating film is formed (FIG. 12A).

Figure 12B:
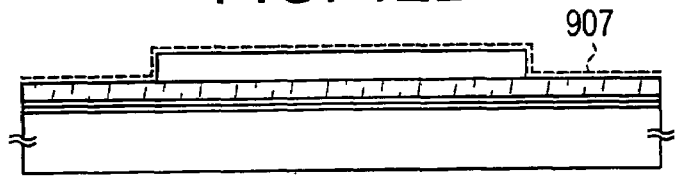
Figure 12C:
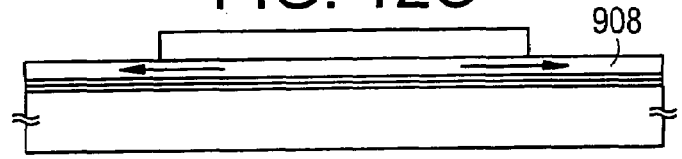

A metal-containing layer 907 is formed in accordance with the embodiment or Embodiment 1 (FIG. 12B). Then, crystallization is conducted in accordance with the embodiment or Embodiment 1, whereby a semiconductor film 908 having a crystalline structure is obtained (FIG. 12C). In this crystallization, crystal grows in directions represented by arrows in FIG. 12C. In regions not covered with the mask 905, nickel is included in a high concentration.

Figure 12D:
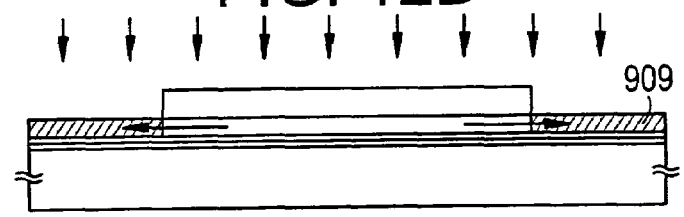

A rare gas element is added using the mask 905 in accordance with the embodiment, whereby impurity regions 909 are formed (FIG. 12D).

Figure 12E:
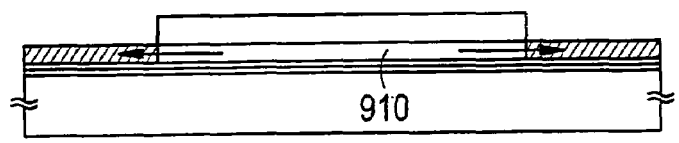

Then, gettering is conducted in accordance the embodiment (FIG. 12E). At this time, in a region 910 (i.e., a region other than the impurity regions 909) of the semiconductor film having a crystalline structure, a metal element is reduced by gettering.

Figure 12F:
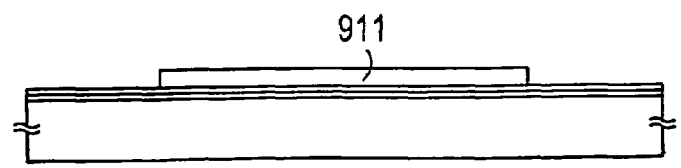
Figure 13A:
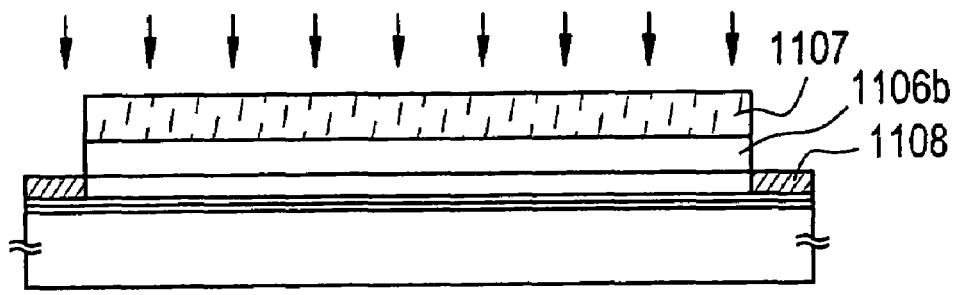
FIGS. 13A to 13D show processes of manufacturing a semiconductor layer.
Figure 13B:
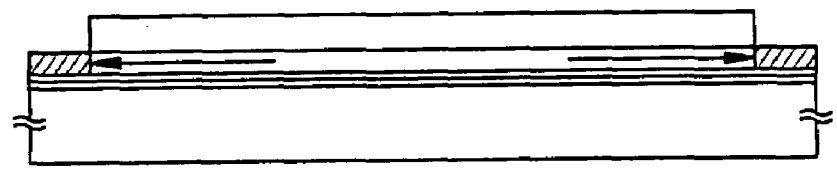
Figure 13C:
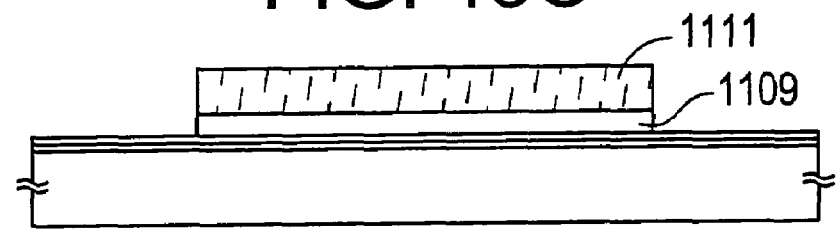
Figure 13D:
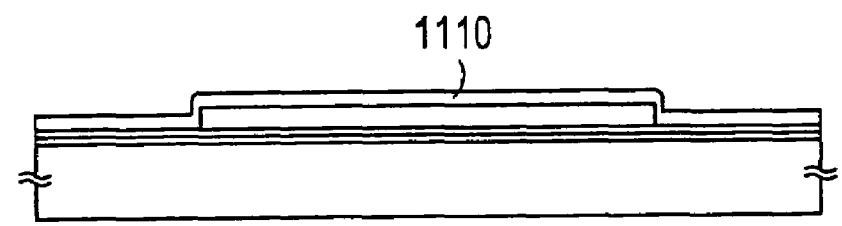

Then, the impurity regions 909 are removed using the mask 905, and thereafter, the mask 905 is removed to form a semiconductor layer 911 (FIG. 12F).

The present embodiment can be freely combined with Embodiment 1 or 2.

Embodiment 7

In the present embodiment, a mask for selectively adding a rare gas element is different from a mask used for patterning a semiconductor film. FIGS. 13A to 13D schematically show processes of the present embodiment.

The same state as that in FIG. 1D is obtained in accordance with the embodiment.

Then, a resist mask 1107 larger than that of the embodiment is formed, and a silicon oxide film is etched using the mask 1107 to form a mask 1106b. A rare gas element is selectively added using the mask 1106b to form gettering sites 1108.

After the mask 1107 is removed, gettering is conducted. Gettering may be conducted in accordance with the embodiment.

Then, the mask 1106b is removed, whereby a resist mask 1111 is formed. The resist mask 1111 is used for patterning the semiconductor film, and is provided on an inner side of the mask 1107.

Regions of the semiconductor film other than the region covered with the mask 1111 are removed. When gettering is conducted, a metal element is likely to segregate to the boundary of the regions where the rare gas element is added. Therefore, the semiconductor film in the vicinity of the regions where the rare gas element is added are also removed. Thus, a semiconductor film 1109 having a crystalline structure is formed.

In the subsequent processes, an insulating film 1110 covering the semiconductor film 1109 may be formed in accordance with the embodiment. Then, an active matrix substrate is manufactured in accordance with Embodiment 1.

Figure 25:
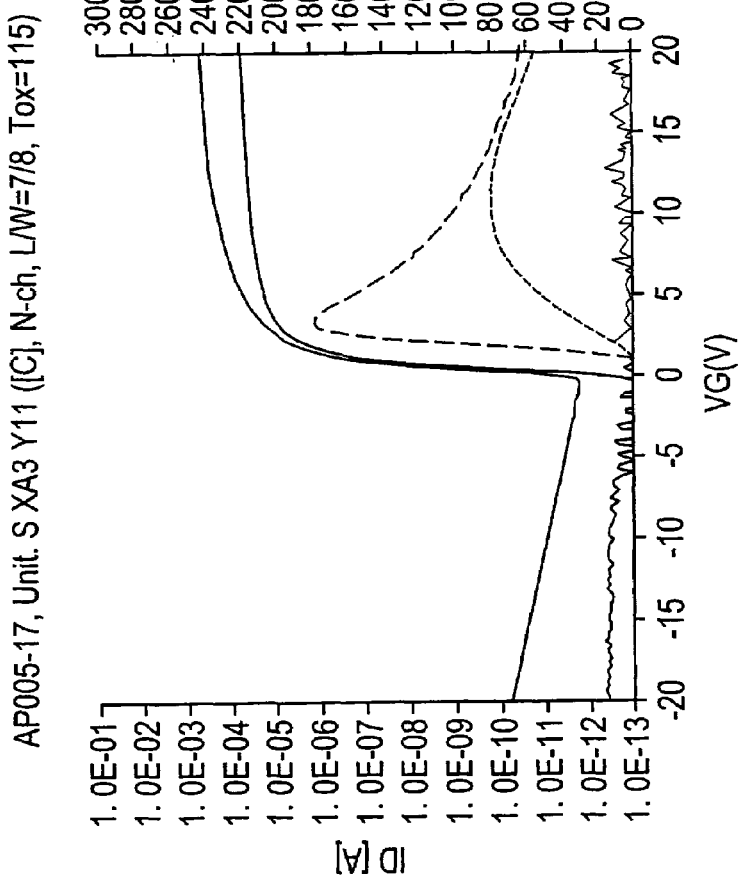
FIG. 25 shows voltage/current characteristics in a TFT.
Figure 26:
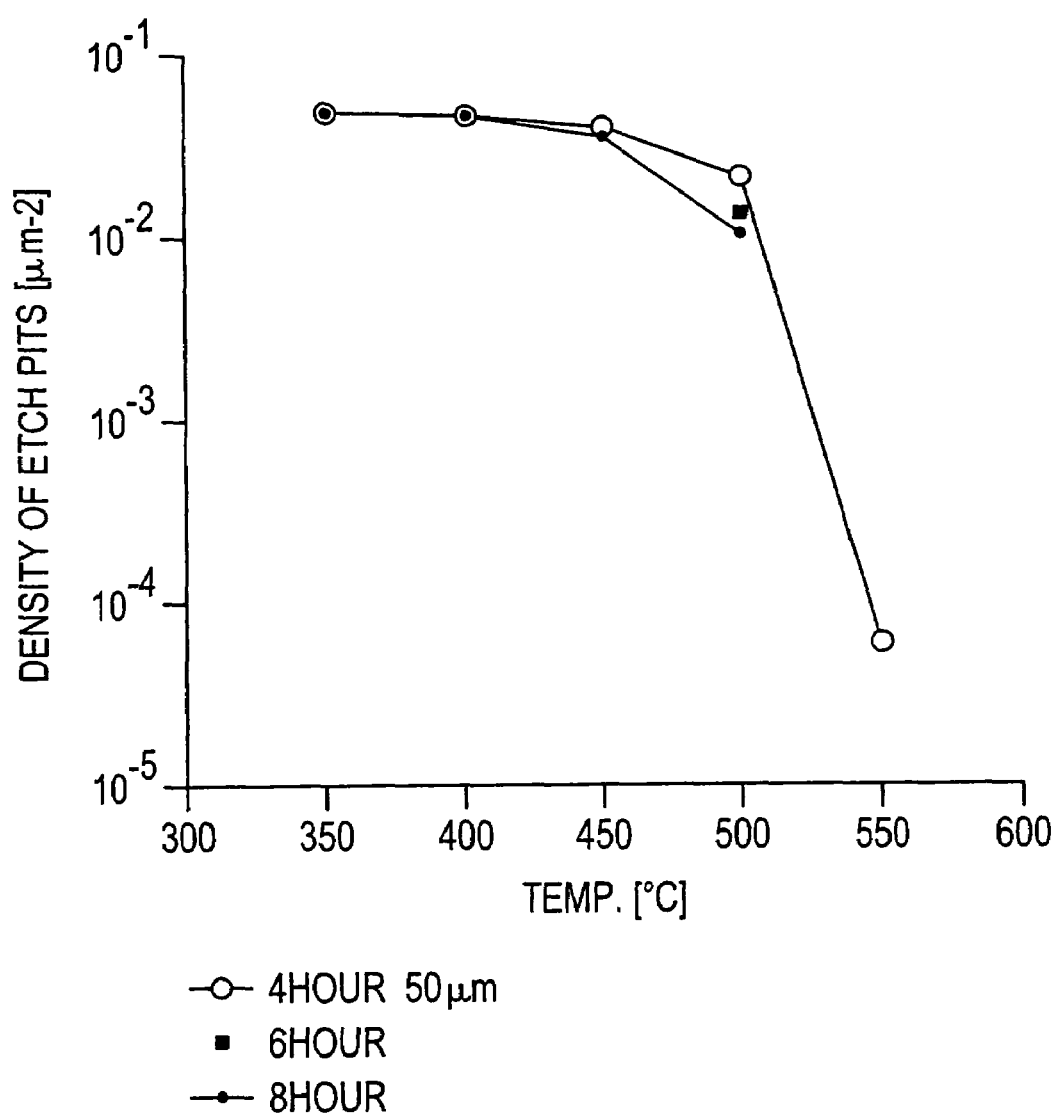
FIG. 26 is a graph showing a relationship among an etch pit density, a heating temperature, and a heating time in a region (width: 50 μm) to be gettered.
Figure 27:
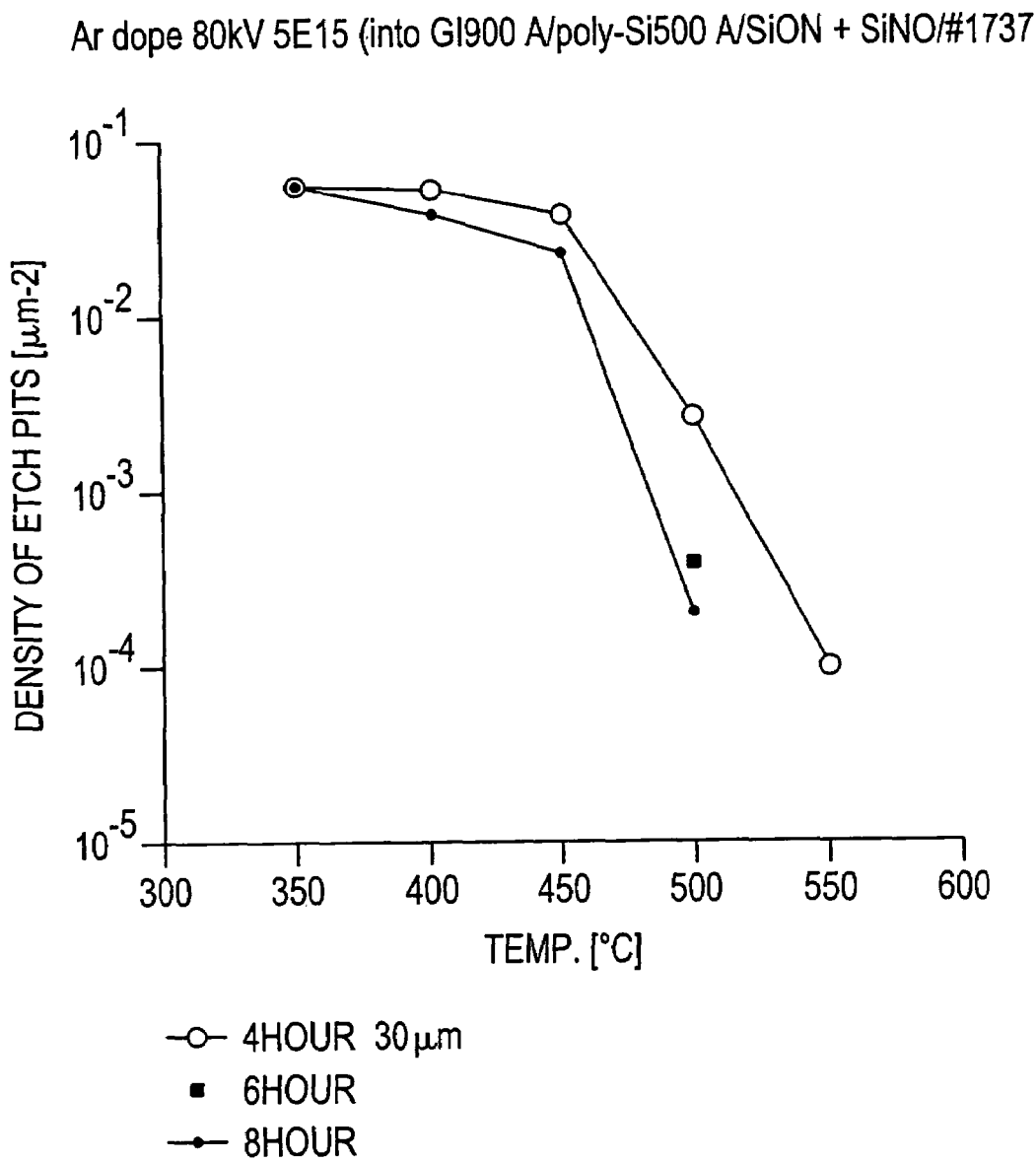
FIG. 27 is a graph showing a relationship among an etch pit density, a heating temperature, and a heating time in a region (width: 30 μm) to be gettered.
Figure 28:
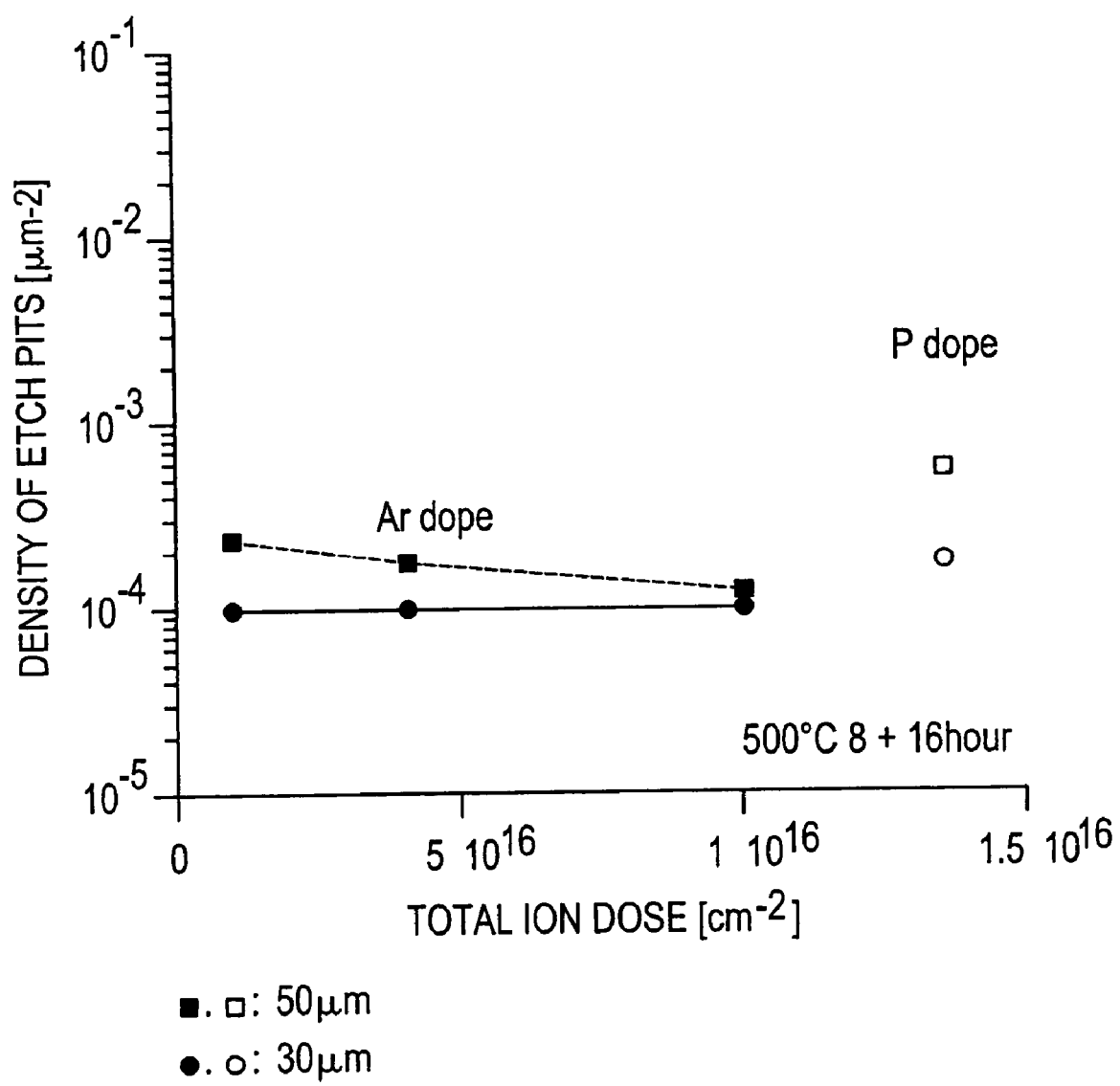
FIG. 28 is a graph showing a relationship among an etch pit density, a heating temperature, and a heating time in a region (width: 30 μm) to be gettered.
Figure 29:
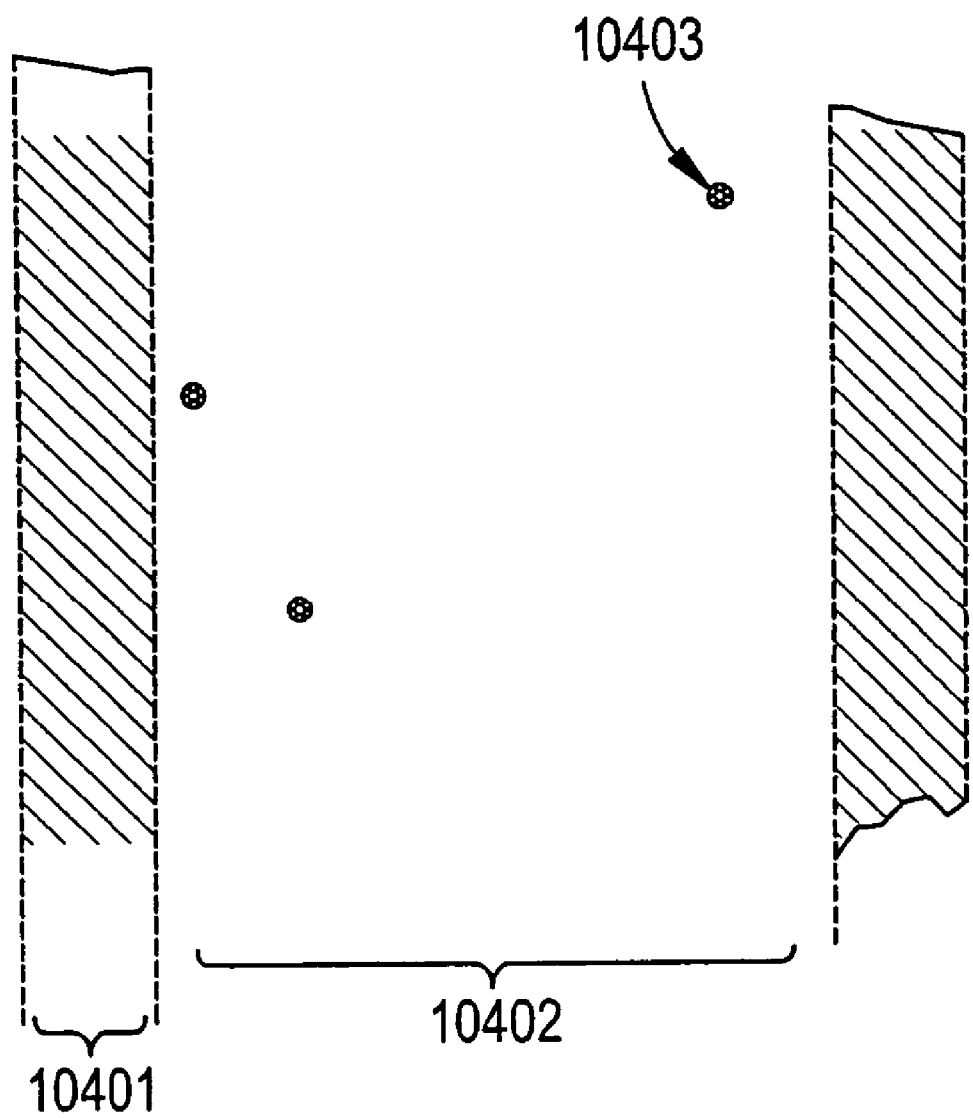
FIG. 29 is a schematic view showing etch pits observed by FPM processing after gettering.

A TFT on the resultant active matrix substrate has excellent electrical characteristics. FIG. 25 shows, as electrical characteristics, voltage/current characteristics of the TFT (L/W=7 μm/8 μm, n-channel TFT of a driving circuit, film thickness of a gate insulating film of 115 nm). In FIG. 25, a threshold value (Vth) of the TFT was 1.222 V; an S-value was 0.175 V/dec, a field effect mobility (μFE) was 179.9 $cm^2/Vs$, an ON current value was $2.34\times10^{-4}$ A when (voltage difference between a source region and a drain region)=14 V; and an OFF current value was $3.7\times10^{-12}$ A when Vds=14 V. These values show satisfactory TFT characteristic values.

The present embodiment can be combined with either one of Embodiments 1 to 6.

Embodiment 8

Figure 15:
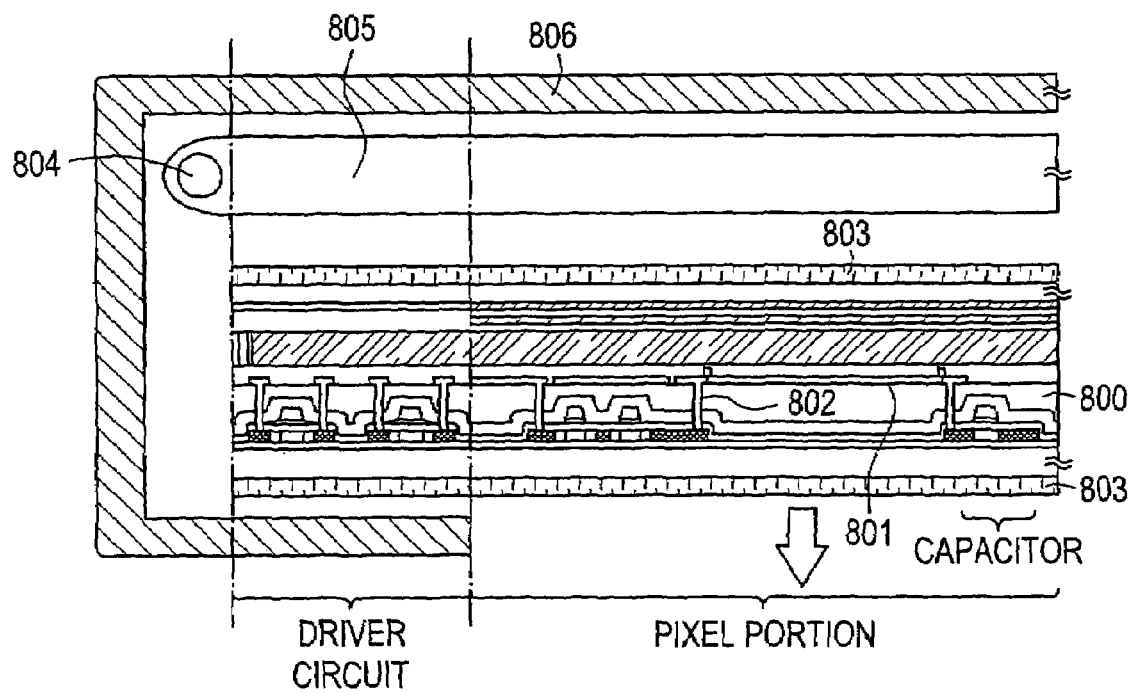
FIG. 15 shows an example of a transmission type.

Embodiment 1 shows an exemplary reflection type display apparatus in which a pixel electrode is made of a metal material with reflectivity. In the present embodiment, an exemplary transmission type display apparatus is shown in FIG. 15, in which a pixel electrode is made of a conductive film with light transparency.

The processes up to the process of forming an interlayer insulating film 800 are the same as those in Embodiment 1. Therefore, these processes will be omitted here. After the interlayer insulating film 800 is formed in accordance with Embodiment 1, a pixel electrode 801 made of a conductive film with light transparency is formed. As the conductive film having light transparency, ITO (indium tin oxide alloy). $In_2O_3(ZnO)$, zinc oxide (ZnO), or the like may be used.

Thereafter, contact holes are formed in the interlayer insulating film 800. Then, connection electrodes 802 overlapping the pixel electrodes 801 are formed. The connection electrode 802 are connected to drain regions through contact holes. Furthermore, a source region or a drain region of another TFT is also formed simultaneously with the connection electrodes 802.

Herein, an embodiment in which all the driving circuits are formed on a substrate is shown. However, several ICs may be used in a part of a driving circuit.

An active matrix substrate is formed as described above. A liquid crystal module is manufactured in accordance with Embodiment 2, using the active matrix substrate, and a backlight 804 and a light-guiding plate 805 are provided, followed by disposing a cover 806, whereby an active matrix type liquid crystal display apparatus as shown in FIG. 15 is completed. The cover 806 and the liquid crystal module are attached to each other with an adhesive or an organic resin. Furthermore, a substrate may be attached to a counter substrate by filling an organic resin between a frame and a substrate so as to surround the frame. Since the apparatus is of a transmission type, polarizing plates 803 are attached to both the active matrix substrate and the counter substrate.

The present embodiment can be combined with either one of Embodiments 1 to 7.

Embodiment 9

Figure 16A:
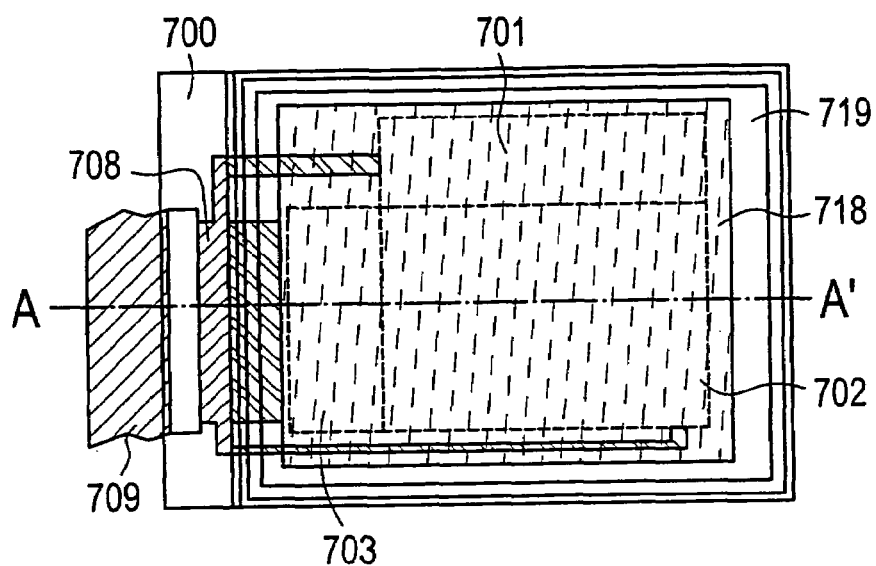
FIGS. 16A and 16B are a top view and a cross-sectional view showing an EL module.
Figure 16B:
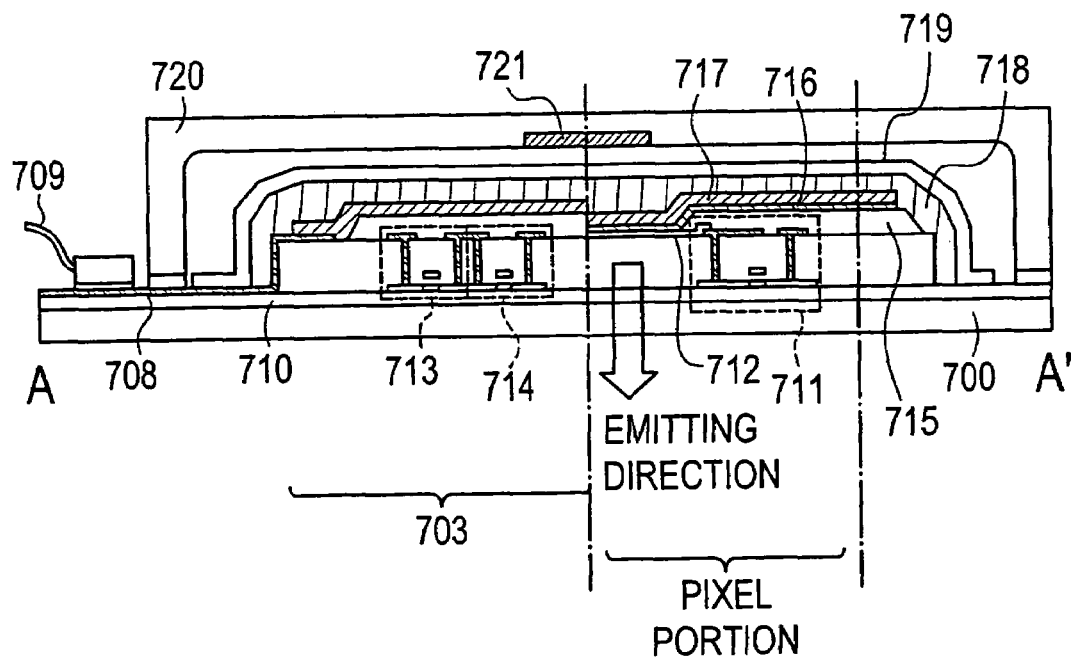

In the present embodiment, FIGS. 16A and 16B show an example of production of a light-emitting display apparatus provided with an electro-luminescence (EL) element.

FIG. 16A is a top view of an EL module, and FIG. 16B is a cross-sectional view taken along a line A-A' in FIG. 16A. A pixel portion 702, a source-side driving circuit 701, and a gate-side driving circuit 703 are formed on a substrate 700 (e.g., a glass substrate, a crystallized glass substrate, a plastic substrate, or the like) having an insulating surface. The pixel portion and driving circuits can be obtained in accordance with the embodiment. Furthermore, reference numerals 718 and 719 denote a sealant and a DLC film, respectively. The pixel portion and the driving circuit portions are covered with the sealant 718, and the sealant 718 is covered with a protective film 719. The layered structure is further sealed with a cover member 720, using an adhesive. The cover member 720 is desirably made of the same material (e.g., glass) as that of the substrate 700 so as to endure deformation due to heat or an external force, and is formed into a concave shape (depth: 3 to 10 μm) shown in FIG. 16 by sandblast. It is desirable that the cover member 720 is provided with a concave portion (depth: 50 to 200 μm) for accommodating a drying agent 721. Furthermore, in the case of manufacturing the EL module by multi-chamfering, after the substrate and the cover member are attached to each other, they may be sectioned with a $CO_2$ laser or the like so that the ends thereof are aligned with each other.

Reference numeral 708 denotes wiring for transmitting a signal input to the source-side driving circuit 701 and the gate-side driving circuit 703, which receives a video signal and a clock signal from a flexible printed circuit (FPC) 709 to be an external input terminal. Although only the FPC is shown, the FPC may be provided with a printed wiring board (PWB). A light-emitting apparatus in the present specification includes not only a light-emitting apparatus itself, but also a light-emitting apparatus provided with an FPC or a PWB.

Next, the cross-sectional structure of the EL module will be described with reference to FIG. 16B. An insulating film 710 is formed on the substrate 700, and the pixel portion 702 and the gate-side driving circuit 703 are formed above the insulating film 710. The pixel portion 702 is composed of a plurality of pixels including a current control TFT 711 and a pixel electrode 712 electrically connected to a drain of the current control TFT 711. The gate-side driving circuit 703 is formed of a CMOS circuit in which an n-channel TFT 713 and a p-channel TFT 714 are combined.

The TFTs (including 711, 713, and 714) may be manufactured in accordance with the embodiment or Embodiment 1.

The pixel electrode 712 functions as a positive electrode of an EL element. Banks 715 are formed on both sides of the pixel electrode 712, and an EL layer 716 and a negative electrode 717 of the EL element are formed on the pixel electrode 712.

The EL layer 716 (for emitting light and allowing carriers to move therefor) may be formed by freely combining a light-emitting layer, a charge transport layer, or a charge injection layer. For example, a low-molecular type organic EL material or a high-molecular type organic EL material may be used. Furthermore, as the EL layer, a thin film made of a light-emitting material (singlet compound) emitting light (fluorescence) by singlet excitation or a thin film made of a light-emitting material (triplet compound) emitting light (phosphorescence) by triple excitation can be used. Furthermore, an inorganic material such as silicon carbide or the like can also be used for a charge transport layer and a charge injection layer. Known materials can be used for the organic EL material and the inorganic material.

The negative electrode 717 also functions as wiring common to all the pixels, and is electrically connected to the FPC 709 via the connection wiring 708. Furthermore, all the elements included in the pixel portion 702 and the gate-side driving circuit 703 are covered with the negative electrode 717, the sealant 718, and the protective film 719.

As the sealant 718, it is preferable to use a material that is as transparent or semi-transparent as possible with respect to visible light. Furthermore, the sealant 718 is desirably made of a material that is unlikely to transmit moisture and oxygen.

It is also preferable that, after the light-emitting element is completely covered with the sealant 718, the protective film 719 made of a DLC film or the like is provided at least on the surface (exposed surface) of the sealant 718 as shown in FIG. 16. The protective film 719 may be provided over the entire surface of the substrate including its reverse surface. Herein, care should be taken so that the protective film is not formed on a portion where an external input terminal (FPC) is to be provided. The protective film may be prevented from being formed using a mask, or the protective film may be prevented from being formed by covering an external input terminal portion with a tape such as Teflon used as a masking tape by a CVD apparatus.

The EL element is sealed with the sealant 718 and the protective film 719 in the above-mentioned configuration, whereby the EL element can be completely shut off from the outside, and a substance promoting degradation due to oxidation of an EL layer, such as moisture and oxygen, can be prevented from entering from the outside. Thus, a highly reliable light-emitting apparatus can be obtained.

Figure 17:
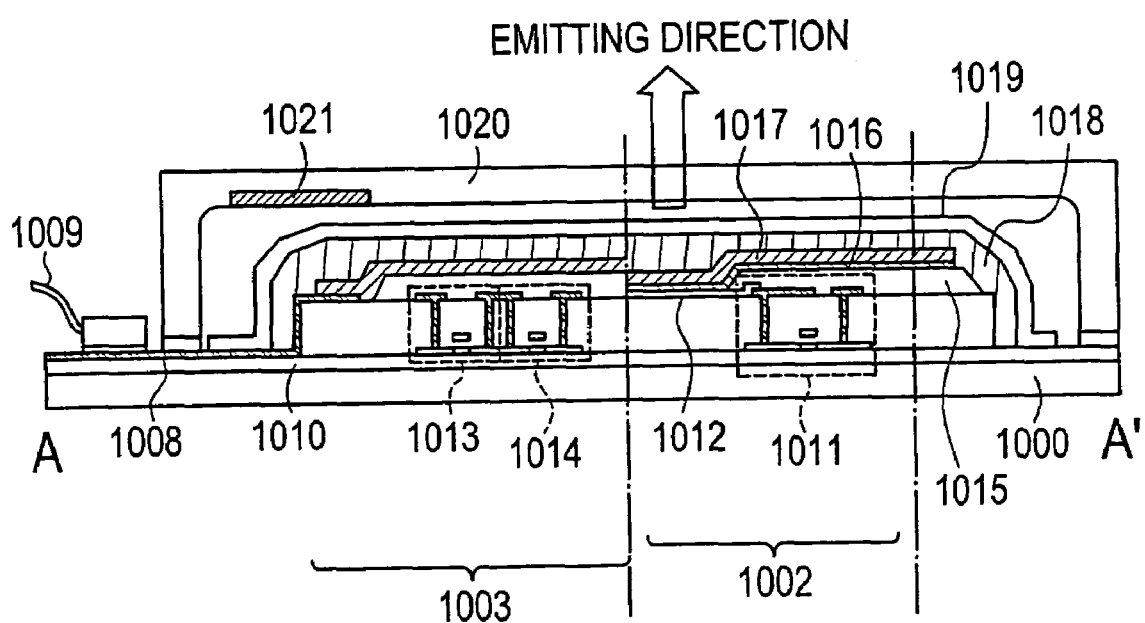
FIG. 17 is a cross-sectional view showing an EL module.

It may also be possible to form a pixel electrode as a negative electrode and stack the EL layer and a positive electrode, thereby obtaining a configuration in which light is emitted in a direction opposite to that in FIGS. 16A and 16B. FIG. 17 shows an example thereof. A top view thereof is the same, so that it will be omitted here.

A cross-sectional structure shown in FIG. 17 will be described below. As a substrate 1000, a semiconductor substrate or a metal substrate, as well as a glass substrate or a quartz substrate can be used. An insulating film 1010 is formed on the substrate 1000. A pixel portion 1002 and a gate-side driving circuit 1003 are formed above the insulating film 1010. The pixel portion 1002 is composed of a plurality of pixels including a current control TFT 1011 and a pixel electrode 1012 electrically connected to a drain of the current control TFT 1011. Furthermore, the gate-side driving circuit 1003 is composed of a CMOS circuit in which an n-channel TFT 1013 and a p-channel TFT 1014 are combined.

The pixel electrode 1012 functions as a negative electrode of an EL element. Furthermore, banks 1015 are formed on both sides of the pixel electrode 1012, and an EL layer 1016 and a positive electrode 1017 of the EL element are formed on the pixel electrode 1012.

The positive electrode 1017 functions as wiring common to all the pixels, and is electrically connected to an FPC 1009 via connection wiring 1008. Furthermore, all the elements included in the pixel portion 1002 and the gate-side driving circuit 1003 are covered with the positive electrode 1017, the sealant 1018, and the protective film 1019 made of DLC or the like. Furthermore, a cover member 1021 and the substrate 1000 are attached to each other with an adhesive. Furthermore, the cover member 1021 is provided with a concave portion for accommodating a drying agent 1021.

As the sealant 1018, it is preferable to use a material that is as transparent or semi-transparent as possible with respect to visible light. The sealant 1018 is desirably made of a material that is unlikely to transmit moisture and oxygen.

In FIG. 17, the pixel electrode is formed as a negative electrode, and the EL layer and the positive electrode are stacked. Therefore, a light-emitting direction is as represented by an arrow in FIG. 17.

The present embodiment can be combined with either one of Embodiments 1 to 8.

Embodiment 10

Figure 18:
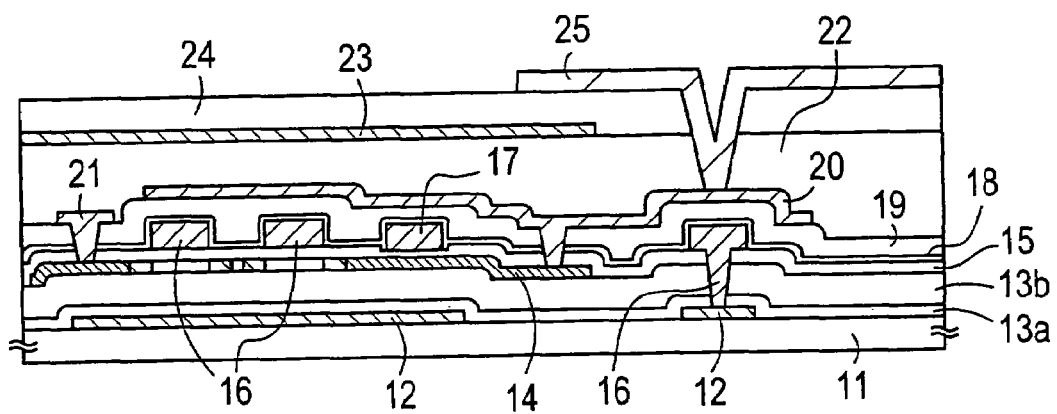
FIG. 18 is a cross-sectional view showing a configuration of an active matrix type liquid crystal display apparatus.

FIG. 18 shows an embodiment different from Embodiment 1.

First, a conductive film is formed on a substrate 11 having an insulating surface, followed by patterning, whereby scanning lines 12 are formed. The scanning lines 12 function as light blocking layers for protecting an active layer to be formed from light. Herein, a quartz substrate was used as the substrate 11, and a layered structure of a polysilicon film (thickness: 50 nm) and a tungsten silicide (W—Si) film (thickness: 100 nm) were used as the scanning lines 12. The polysilicon film protects the substrate 11 from contamination due to tungsten silicide.

Then, insulating films 13a and 13b covering the scanning electrodes 12 are formed to a thickness of 100 to 1000 nm (typically, 300 to 500 nm). Herein, a silicon oxide film (thickness: 100 nm) formed by CVD and a silicon oxide film (thickness: 280 nm) formed by LPCVD were stacked.

An amorphous semiconductor film was formed to a thickness of 10 to 100 nm. Herein, an amorphous silicon film (thickness: 69 nm) was formed by LPCVD. Then, crystallization, gettering, and patterning were conducted using the technique described in the embodiment or Embodiment 1 as a technique of crystallizing the amorphous semiconductor film to remove unnecessary portions of a crystalline silicon film, whereby a semiconductor layer 14 is formed.

Then, in order to form a storage capacitor, a mask is formed, and a part (region where a storage capacitor is to be formed) of the semiconductor layer 14 is doped with phosphorus.

Then, the mask is removed, and an insulating film covering the semiconductor layer 14 is formed. Thereafter, the mask is formed, and the insulating film on the region where a storage capacitor is to be formed is selectively removed.

The mask is removed and thermal oxidation is conducted, whereby an insulating film (gate insulating film) 15 is formed. Due to the thermal oxidation, the final thickness of the gate insulating film 15 became 80 nm. An insulating film thinner than that of the other region was formed on the region where a storage capacitor is to be formed.

Then, channel doping for adding a p-type or n-type impurity element to regions to be channel regions of TFTs in a low concentration was conducted over the entire surface or selectively. The purpose for this channel doping is to control a threshold voltage of a TFT. Herein, boron was added by ion doping in which diborane ($B_2H_6$) was excited with plasma without mass separation. Needless to say, ion implantation (in which mass separation is conducted) may be used.

Next, a mask is formed on the insulating film 15, and the insulating films 13a, 13b, and a contact hole reaching the scanning line 12 is formed. After formation of the contact hole, the mask is removed.

A conductive film is formed, followed by pattering, whereby gate electrodes 16 and capacitive wiring 17 are formed. Herein, a layered structure of a silicon film (thickness: 150 nm) doped with phosphorus and tungsten silicide (thickness: 150 nm) was used, the storage capacitor is composed of the insulating film 15 as a dielectric, the capacitive wiring 17, and a part of the semiconductor layer.

Phosphorus is added in a low concentration in a self-alignment manner, using the gate electrode 16 and the capacitive wiring 17 as a mask. The concentration of phosphorus in regions where phosphorus is added in a low concentration is regulated to be $1\times10^{16}$ to $5\times10^{18}$ atoms/cm$^3$, typically $3\times10^{17}$ to $3\times10^{18}$ atoms/cm$^3$.

Then, a mask is formed, and phosphorus is added in a high concentration, whereby high-concentration impurity regions to be a source region or a drain region are formed. The concentration of phosphorus in the high-concentration impurity regions is regulated to $1\times10^{20}$ to $1\times10^{21}$ atoms/cm$^3$ (typically, $3\times10^{19}$ to $3\times10^{20}$/cm$^3$). Regions of the semiconductor layer 14 overlapping the gate electrodes 16 become channel formation regions, and regions covered with the mask become low-concentration impurity regions that function as LDD regions. After addition of the impurity element, the mask is removed.

Then, in order to form a p-channel TFT used in a driving circuit to be formed on the same substrate as that of pixels, a region to be an n-channel TFT is covered with a mask, and boron is added to form a source region or a drain region.

After the mask is removed, a passivation film 18 covering the gate electrode 16 and the capacitive wiring 17 is formed. Herein, a silicon oxide film was formed to a thickness of 70 nm. Then, the n-type or p-type impurity elements added in the respective concentrations in the semiconductor layer are activated by heat treatment or irradiation with strong light. Herein, activation was conducted by irradiation with a YAG laser from the reverse surface. An excimer laser may be used, in place of a YAG laser.

Then, an interlayer insulating film 19 made of an organic resin material is formed. Herein, an acrylic resin film having a thickness of 40 nm was used. Then, a contact hole reaching the semiconductor layer is formed, and an electrode 20 and a source line 21 are formed. In the present embodiment, the electrode 20 and the source line 21 were composed of a three-layered structure formed by continuously forming a Ti film (thickness: 100 nm), an aluminum film containing Ti (thickness: 300 nm), and a Ti film (thickness: 150 nm) by sputtering.

After hydrogenation is conducted, an interlayer insulating film 22 made of acrylic resin is formed. Then, a conductive film (thickness: 100 nm) having light transparency is formed on the interlayer insulating film 22, whereby a light-blocking layer 23 is formed. Then, an interlayer insulating film 24 is formed. A contact hole reaching the electrode 20 is formed. Then, a transparent conductive film (herein, indium tin oxide (ITO) film) having a thickness of 100 nm is formed, followed by patterning, to obtain a pixel electrode 25.

It should be understood that the present embodiment is described merely for an illustrative purpose, and the present invention is not limited to the processes of the present embodiment. For example, as each conductive film, an element selected from tantalum (Ta), titanium (Ti), molybdenum (Mo), tungsten (W), chromium (Cr), and silicon (Si), or an alloy film (typically a Mo—W alloy, a Mo—Ta alloy) obtained by combining the elements can be used. Furthermore, as each insulating film, a silicon oxide film, a silicon nitride film, a silicon oxynitride film, and a film made of an organic resin material (polyimide, acrylic resin, polyamide, polyimideamide, benzocyclobutene (BCB) or the like) can be used.

In the present embodiment, a rare gas element is added to the insulating films 13a and 13b as well. However, a rare gas element is added to regions other than those in which the semiconductor layer 14 is provided.

The present embodiment can be combined with either one of Embodiments 1 to 9.

Embodiment 11

In Embodiment 1, a top gate type TFT has been exemplified. The present is also applicable to a bottom gate type TFT shown in FIGS. 19A and 19B.

Figure 19A:
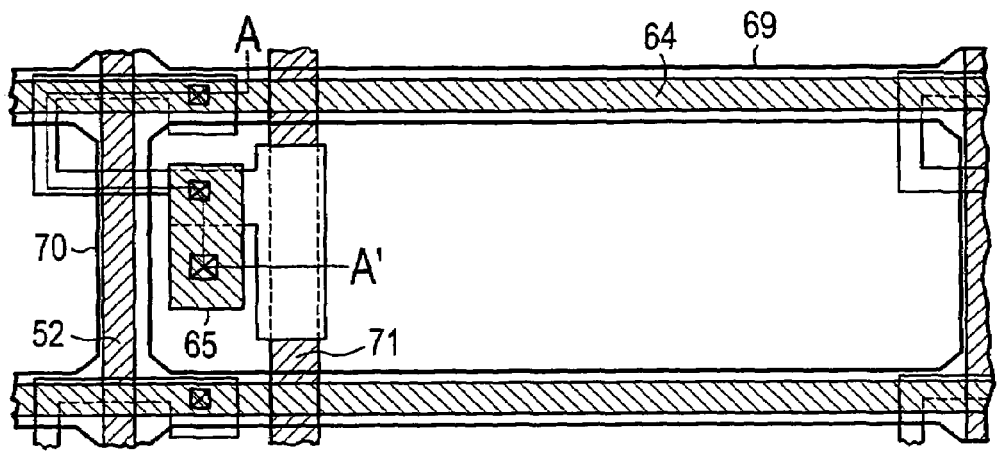
FIGS. 19A and 19B are a top view and a cross-sectional view showing a configuration of an active matrix type liquid crystal display apparatus.

FIG. 19A is a top view showing an enlarged pixel in a pixel portion. In FIG. 19A, a portion taken along a dotted line A-A' corresponds to a cross-sectional structure of the pixel portion in FIG. 19B.

Figure 19B:
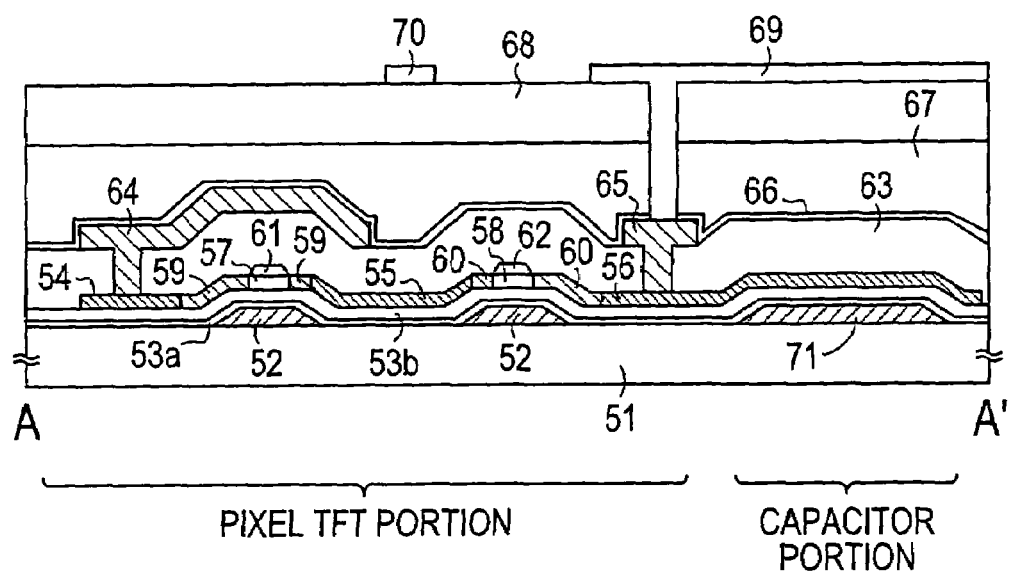

In the pixel portion shown in FIGS. 19A and 19B, a pixel TFT portion is composed of an n-channel TFT. Gate electrodes 52 are formed on a substrate 51, and a first insulating film 53a made of silicon nitride and a second insulating film 53b made of silicon oxide are provided. On the second insulating film 53b, source regions or drain regions 54 to 56 as an active layer, channel formation regions 57 and 58, and LDD regions 59 and 60 between the source region or drain region and the channel formation region are formed. The channel formation regions 57 and 58 are protected by insulating layers 61 and 62. After contact holes are formed in the first interlayer insulating film 63 covering the insulating layers 61, 62, and the active layer, a wiring 64 is connected to the source region 54 and a wiring 65 is connected to the drain region 56. A passivation film 66 is formed on the first interlayer insulating film 63. A second interlayer insulating film 67 is further formed on the passivation film 66. Furthermore, a third interlayer insulating film 68 is formed on the second interlayer insulating film 67. A pixel electrode 69 made of a transparent conductive film made of ITO, $SnO_2$ or the like is connected to the wiring 65. Reference numeral 70 denotes a pixel electroded adjacent to the pixel electrode 69.

In the present embodiment, an active layer is formed in accordance with the above-mentioned embodiment.

In the present embodiment, a channel stop type bottom gate type TFT has been described as an example. However, the present invention is not particularly limited thereto.

In the present embodiment, a gate line of a pixel TFT in the pixel portion has a double-gate structure. However, in order to reduce variation in an OFF current, a multi-gate structure such as a triple gate structure may be used. Furthermore, in order to enhance an opening ratio, a single gate structure may be used.

Furthermore, a capacitor part of the pixel portion is composed of the first and second insulating films as a dielectric, capacitive wiring 71, and the drain region 56.

The pixel portion shown in FIGS. 19A and 19B is an example, and the pixel portion is not particularly limited to the above-mentioned configuration.

The present embodiment can be combined with either one of Embodiments 1 to 10.

Embodiment 12

In the present embodiment, an example of production of an active matrix substrate by a process different from that of Embodiment 1 is shown in FIGS. 30A-30C to 32.

In the present embodiment, a base film 1601 (stack of a silicon oxynitride film 1601a and a silicon oxynitride film 1601b) is provided on a substrate 1600. Semiconductor layers 1602 to 1606 are formed on the base film 1601, and an insulating film 1607 is formed thereon. The process of stacking a first conductive film 1608 and a second conductive film 1609 on the insulating film 1607 is the same as that of Embodiment 1. Furthermore, a semiconductor layer may be formed in accordance with the embodiment. Therefore, a detailed description thereof will be omitted here. FIG. 30A shows the same state as that in FIG. 3A.

Then, a first etching treatment is conducted by the same method as that of Embodiment 3, whereby first-shape conductive layers 1616 to 1621 (first conductive layers 1616a to 1621a and second conductive layers 1616b to 1621b) made of the first and second conductive layers are formed (FIG. 30B). The processes hitherto described are the same as those in Embodiment 1.

In the present embodiment, after the first etching treatment, a second etching treatment is conducted without removing a resist mask. Herein, etching was conducted for 25 seconds by generating plasma, using $SF_6$, $Cl_2$, and $O_2$ as an etching gas with an RF (13.56 MHZ) power of 700 W supplied to a coil-type electrode under a pressure of 1.3 Pa at a gas flow ratio of 24/12/24 (sccm), respectively. An RF (13.56 MHZ) power of 10 W was also supplied to the substrate side (sample stage) as well, whereby an actually negative self-bias voltage was applied. The etching speed with respect to W in the second etching treatment is 227.3 nm/min, the etching speed with respect to TaN is 32.1 nm/min, the selection ratio of W with respect to TaN is 7.1, the etching speed with respect to SiON that is the insulating film 1607 is 33.7 nm/min, and the selection ratio of W with respect to TaN is 6.83. In the case of using $SF_6$ as an etching gas, since the selection ratio with respect to the insulating film 1607 is high, a decrease in a film can be suppressed. Furthermore, in a TFT of a driving circuit, as the width of a taper portion in a channel length direction is longer, reliability is higher. Therefore, it is effective to form a taper portion by conducting dry etching, using an etching gas containing $SF_6$.

The taper angle of W became 70° in the second etching treatment. Second conductive layers 1622b to 1627b are formed in the second etching treatment. On the other hand, the first conductive layers are hardly etched, and first conductive layers 1622a to 1627a are formed. Furthermore, in the second etching treatment, it is also possible to use $CF_4$, $Cl_2$, and $O_2$ as an etching gas.

After the resist mask is removed, a first doping treatment is conducted to obtain a state shown in FIG. 30C. Doping is conducted using the first conductive layers 1622a to 1627a with respect to an impurity element as a mask, in such a manner that the impurity element is not added to the semiconductor layers below the taper portions of the first conductive layers. In the present embodiment, plasma doping was conducted using phosphorus (P) as an impurity element under the condition of phosphine ($PH_3$) 5% hydrogen diluted gas and a gas flow ratio of 30 sccm. Thus, low-concentration impurity regions (n⁻ regions) 1628 are formed in a self alignment manner. The concentration of phosphorus (P) added to the low-concentration impurity regions 1628 is $1\times10^{17}$ to $1\times10^{19}$ cm².

Furthermore, the first doping treatment may be conducted so that the impurity element is added to the semiconductor layers below the taper portions of the first conductive layers. In this case, a concentration gradient is provided in accordance with a film thickness of the taper portions of the first conductive layer.

Figure 31A:
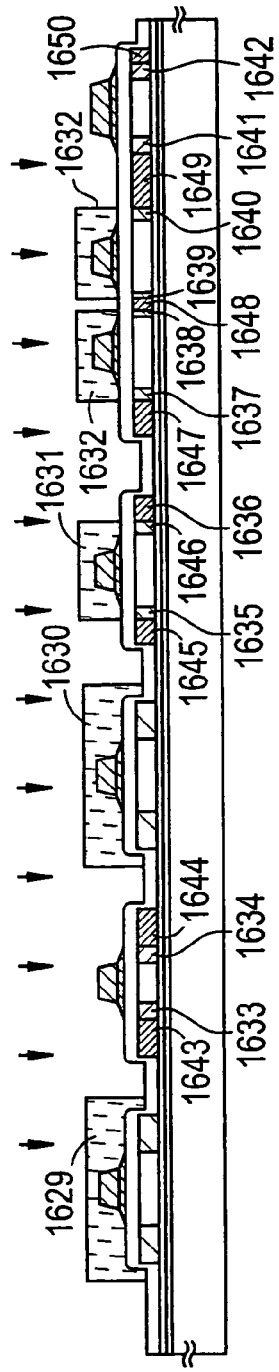
FIGS. 31A to 31C show processes of manufacturing an active matrix type liquid crystal display.

After resist masks 1629 to 1632 are formed, a second doping treatment is conducted, whereby an n-type impurity element is added to the semiconductor layers (FIG. 31A). The semiconductor layers to be active layers of p-channel TFTs are covered with masks 1629 and 1630. Doping may be conducted by ion doping or ion implantation. Herein, an impurity element providing an n-type is added using phosphorus by ion doping with phosphine (PH₃) 5% hydrogen dilute gas.

Because of the second doping treatment, in the semiconductor layer 1603 to be an n-channel TFT in a logic circuit portion, the conductive layer 1623 functions as a mask with respect to phosphorus, whereby high-concentration impurity regions (n⁺ regions) 1643 and 1644 are formed in a self-alignment manner. Furthermore, during the second doping treatment, the impurity element is also added to regions below the taper portions, whereby low-concentration impurity regions (n⁻ regions) 1633 and 1634 are formed. Thus, the n-channel TFT in the logic circuit portion to be formed later is provided with only a region (GOLD region) overlapping the gate electrode. In the low-concentration impurity regions (n⁻ regions) 1633 and 1634, an impurity concentration (P concentration) is gradually decreased from the ends of the taper portions of the first conductive layer to the inside in the semiconductor layer overlapping the taper portions of the first conductive layer.

Furthermore, because of the second doping treatment, in the semiconductor layer 1605 to be an n-channel TFT in a sampling circuit portion, high-concentration impurity regions 1645 and 1646 are formed in regions not covered with the mask 1631, and low-concentration impurity regions (n⁻ regions) 1635 and 1636 are formed in regions covered with the mask 1631. Thus, the n-channel TFT in the sampling circuit portion is provided with only a low-concentration impurity region (LDD region) not overlapping the gate electrode.

Furthermore, because of the second doping treatment, in the semiconductor layer 1606 to be an n-channel TFT in a pixel portion, high-concentration impurity regions 1647 to 1650 are formed in regions not covered with the mask 1632, and low-concentration impurity regions (n⁻ regions) 1637 to 1640 are formed in regions covered with the mask 1632. Thus, the n-channel TFT in the pixel portion is provided with only a low-concentration impurity region (LDD region) not overlapping the gate electrode. Furthermore, in a region to be a capacitor part in the pixel portion, a high-concentration impurity region 1650 is formed in a self-alignment manner, and in regions below the taper portions, low-concentration impurity regions (n-regions) 1641 and 1642 are formed.

Because of the second doping treatment, an impurity element providing an n-type is added to the high-concentration impurity regions 1643 to 1650 in a concentration range of $3\times10^{19}$ to $1\times10^{21}$/cm³.

A rare gas element may be added before and after the second doping treatment. In this case, gettering can be further conducted after the subsequent heat treatment. Furthermore, in this case, it is desirable that a mask allowing a rare gas element to be added to ends of all the semiconductor layers is used in the second doping treatment.

Figure 31B:
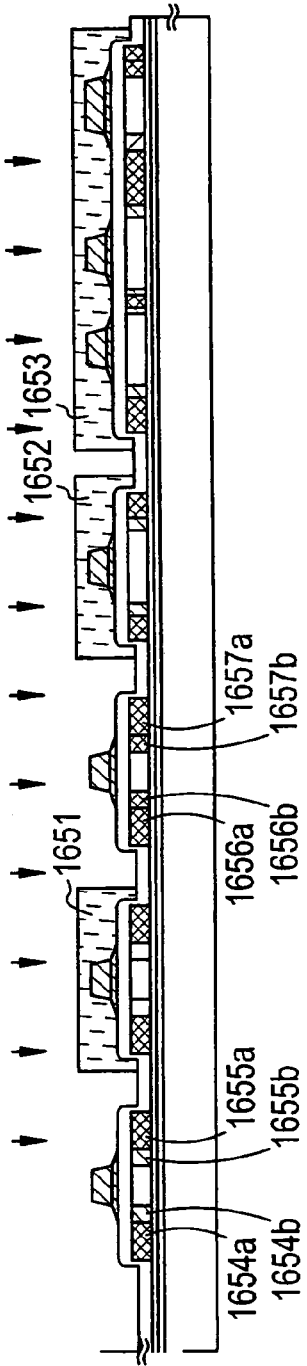

After removing the masks 1629 to 1632, the semiconductor layers to be active layers of n-channel TFTs are covered with resist masks 1651 to 1653, whereby a third doping treatment is conducted (FIG. 31B). A p-type impurity element is added by passing through the taper portions, whereby regions (COLD regions 1654b to 1657b overlapping gate electrodes) containing a p-type impurity element in a low concentration are formed. Because of the third doping treatment, regions 1654a to 1657a containing an n-type impurity element in a low concentration and containing p-type impurity element in a high concentration are formed. The regions 1654a to 1657a contain a low concentration of phosphorus. However, by conducting a doping treatment so that the concentration of boron becomes $6\times10^{19}$ to $6\times10^{20}$/cm³, these regions function as source regions and drain regions of p-channel TFTs. Therefore, there is no problem.

In the present embodiment, the first doping treatment, the second doping treatment, and the third doping treatment are conducted in this order. However, the present invention is not particularly limited thereto. The order of processes may be altered freely.

Then, the resist masks 1651 to 1653 are removed, and a first interlayer insulating film 1658 is formed. The first interlayer insulating film 1658 is formed of an insulating film containing silicon having a thickness of 10 to 200 nm by plasma CVD or sputtering.

Figure 31C:
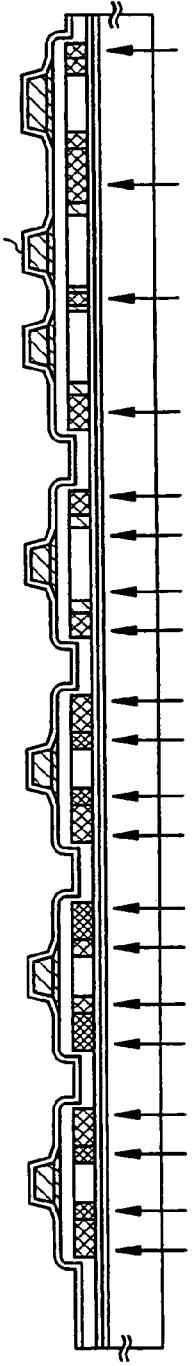

Then, as shown in FIG. 31C, the impurity elements added to the respective semiconductor layers are activated. This activation is conducted by irradiation with a YAG laser or an excimer laser from the reverse surface. By irradiation from the reverse surface, impurity regions overlapping the gate electrodes via the insulating film can be activated.

Furthermore, in the present embodiment, the case has been shown in which the first interlayer insulating film is formed before the above-mentioned activation. However, the first interlayer insulating film may be formed after the above-mentioned activation.

Then, a second interlayer insulating film 1659 made of a silicon nitride film is formed, and heat treatment is conducted at 300° C. to 550° C. for 1 to 12 hours, whereby the semiconductor layers are hydrogenated. In the present embodiment, heat treatment was conducted at 410° C. for 1 hour in a nitrogen atmosphere. In this process, dangling bonds of the semiconductor layers are terminated with hydrogen contained in the second interlayer insulating film 1659. Irrespective of the presence of the first interlayer insulating film, the semiconductor layers can be hydrogenated. As another means for hydrogenation, plasma hydrogenation (using hydrogen excited with plasma) may be conducted.

Then, a third interlayer insulating film 1660 made of an organic insulating material is formed on the second interlayer insulating film 1659. In the present embodiment, an acrylic resin film having a thickness of 1.6 μm was formed. Then, patterning is conducted so as to form contact holes reaching each high-concentration impurity region. In the present embodiment, a plurality of etching treatments were conducted. In the present embodiment, the third interlayer insulating film was etched using the second interlayer insulating film as an etching stopper, the second interlayer insulating film was etched using the first interlayer insulating film as an etching stopper, and the first interlayer insulating film was etched.

Then, electrodes 1661 to 1669 electrically connected to the high-concentration impurity regions, respectively and a pixel electrode 1670 electrically connected to the high-concentration impurity region 1649 are formed. A material excellent in reflectivity such as a film containing Al or Ag as its main component, a layered film thereof, or the like is used for these electrodes and pixel electrodes.

Figure 32:
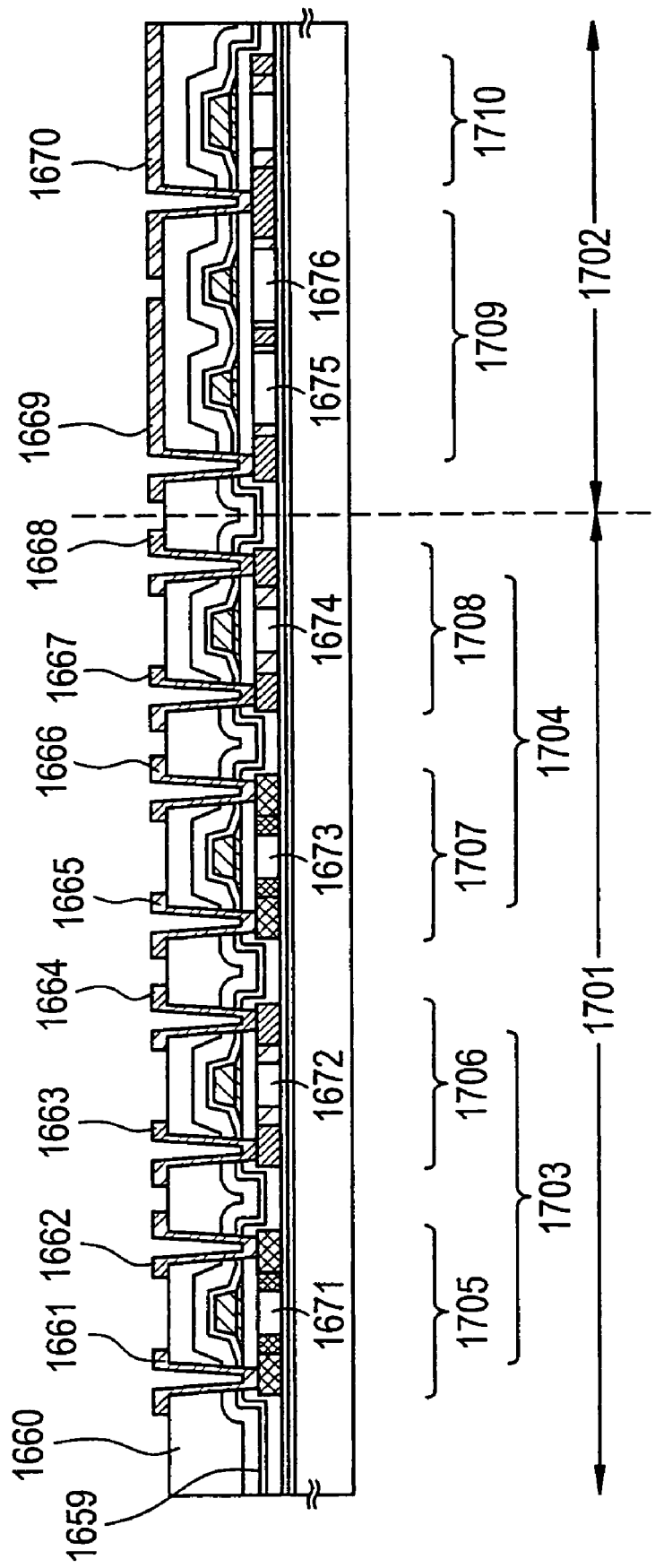
FIG. 32 shows processes of manufacturing an active matrix type liquid crystal display.

As described above, a driving circuit 1701 including a logic circuit portion 1703 composed of an n-channel TFT 1706 and a p-channel TFT 1705 and a sampling circuit portion 1704 composed of an n-channel TFT 1708 and a p-channel TFT 1707, and a pixel portion 1702 having a pixel TFT made of an n-channel TFT 1709 and a storage capacitor 1710 can be formed on the same substrate (FIG. 32)

In the present embodiment, the n-channel TFT 1709 has a double gate structure in which two channel formation regions are formed between a source region and a drain region. However, the present embodiment is not limited to a double gate structure. A single gate structure in which one channel formation region is formed or a triple gate structure in which three channel formation regions are formed may be used.

In the present embodiment, because of the second doping treatment, high-concentration impurity regions can be varied so as to be suitable for each circuit in a self-alignment manner or with a mask. The n-channel TFTs 1706, 1708, and 1709 have an LDD (Lightly Doped Drain) structure. In this structure, a region with an impurity element added thereto in a low concentration is provided between a channel formation region and a source/drain region formed by adding an impurity element in a high concentration. This region is called an LDD region. Furthermore, the n-channel TFT 1706 has a so-called GOLD (Gate-drain Overlapped LDD) structure in which an LDD region is disposed overlapping a gate electrode via a gate insulating film. Furthermore, the n-channel TFTs 1708 and 1709 are provided with only a region (LDD region) not overlapping a gate electrode. In the present specification, a low-concentration impurity region (n⁻ region) overlapping a gate electrode via an insulating film is called a GOLD region, and a low-concentration impurity region (n⁻ region) not overlapping a gate electrode is called an LDD region. The width of the region (LDD region) not overlapping a gate electrode in a channel direction can be arbitrarily set by appropriately changing a mask used for the second doping treatment. Furthermore, if the condition of the first doping treatment is changed so that an impurity element is added to regions below taper portions as well, the n-channel TFTs 1708 and 1709 can be provided with both a region (GOLD region) overlapping a gate electrode and a region (LDD region) not overlapping a gate electrode.

The present embodiment can be combined with either one of Embodiments 1 to 12.

Embodiment 13

The driver circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 33A-33F, 34A-34D and 35A-35C.

Figure 33A:
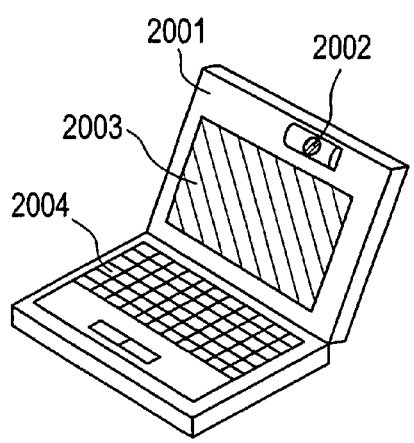
FIGS. 33A to 33F show examples of electronic equipment.

FIG. 33A is a personal computer which comprises: a main body 2001; an image input section 2002; a display section 2003; and a key board 2004.

Figure 33B:
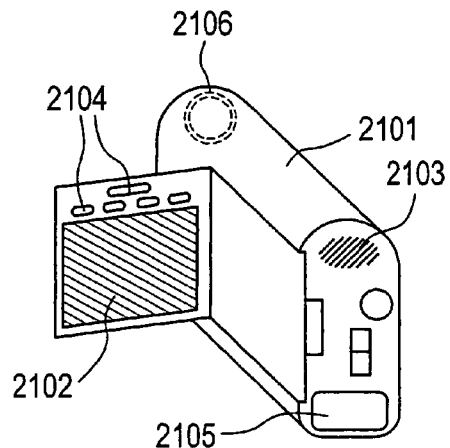

FIG. 33B is a video camera which comprises: a main body 2101; a display section 2102; a voice input section 2103; operation switches 2104; a battery 2105 and an image receiving section 2106.

Figure 33C:
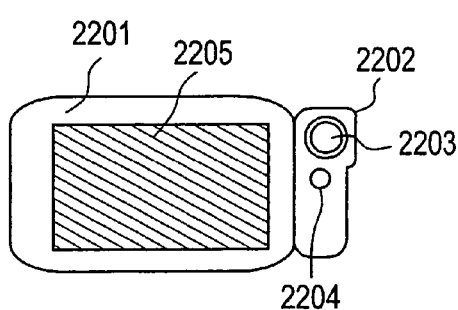

FIG. 33C is a mobile computer which comprises: a main body 2201; a camera section 2202; an image receiving section 2203; operation switches 2204 and a display section 2205.

Figure 33D:
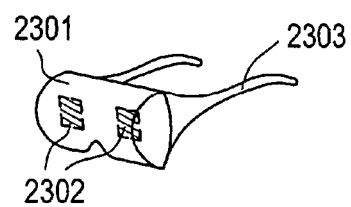

FIG. 33D is a goggle type display which comprises: a main body 2301; a display section 2302; and an arm section 2303.

Figure 33E:
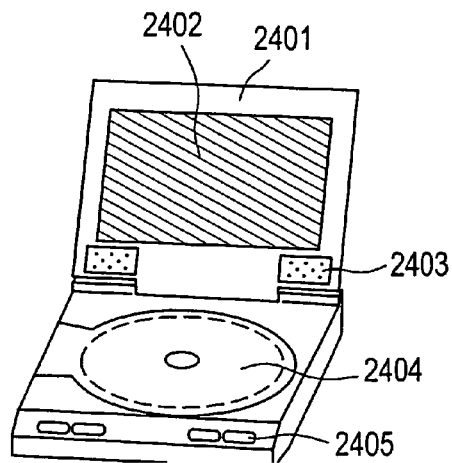

FIG. 33E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet.

Figure 33F:
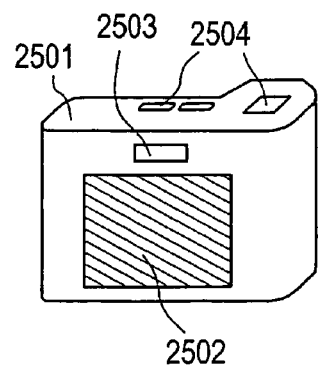

FIG. 33F is a digital camera which comprises: a main body 2501; a display portion 2502; a view finder 2503; operation switches 2504; and an image receiving section (not shown in the figure).

Figure 34A:
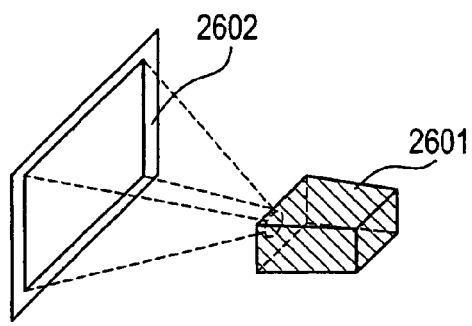
FIGS. 34A to 34D show examples of electronic equipment.

FIG. 34A is a front type projector which comprises: a projection system 2601; and a screen 2602. The present invention can be applied to the liquid crystal module 2808 which forms a part of the projection system 2601 to complete the whole system.

Figure 34B:
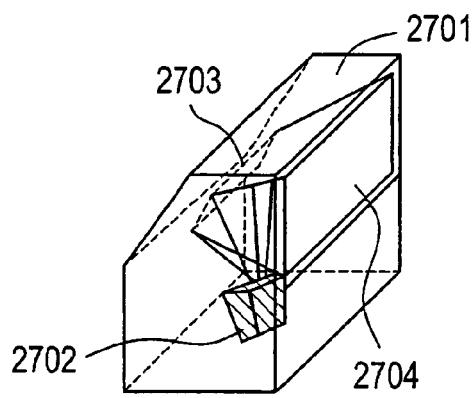

FIG. 34B is a rear type projector which comprises: a main body 2701; a projection system 2702; a mirror 2703; and a screen 2704. The present invention can be applied to the liquid crystal module 2808 which forms a part of the projection system 2702 to complete the whole system.

Figure 34C:
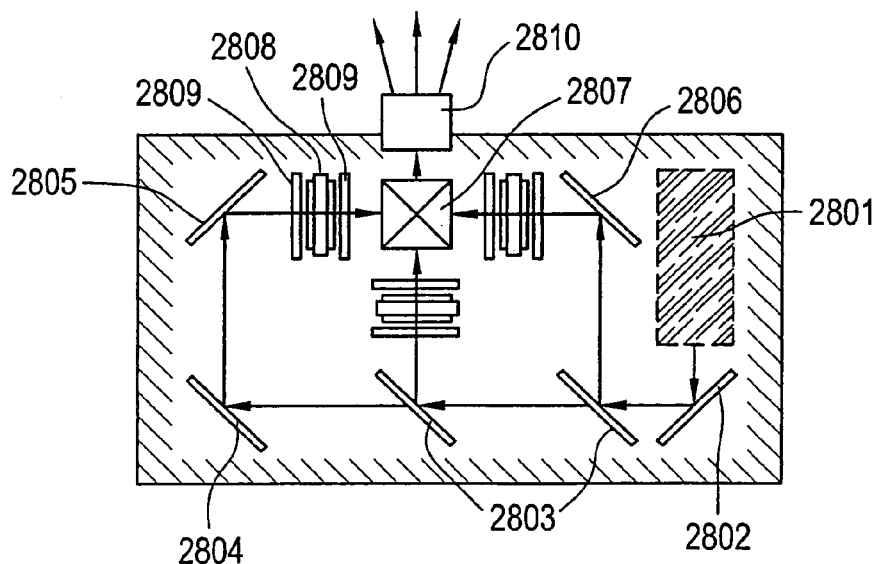

FIG. 34C is a diagram which shows an example of the structure of a projection system 2601 and 2702 in FIGS. 34A and 34B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though the present example shows an example of 3-plate type, this is not to limit to this example and a single plate type may be used for instance. Further, an operator may appropriately dispose an optical lens, a film which has a function to polarize light, a film which adjusts a phase difference or an IR film, etc. in the optical path shown by an arrow in FIG. 34C.

Figure 34D:
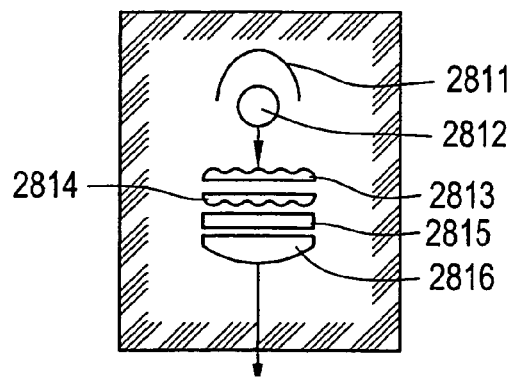

FIG. 34D is a diagram showing an example of a structure of an optical light source system 2801 in FIG. 34C. In the present example the optical light source system 2801 comprises: a reflector 2811; a light source 2812; lens arrays 2813 and 2814; a polarizer conversion element 2815; and a collimator lens 2816. Note that the optical light source system shown in FIG. 34D is merely an example and the structure is not limited to this example. For instance, an operator may appropriately dispose an optical lens, a film which has a function to polarize light, a film which adjusts a phase difference or an IR film, etc.

Note that the projectors shown FIGS. 34A-34D are the cases of using a transmission type electro-optical devices, and applicable examples of a reflection type electro-optical device and an EL module are not shown.

Figure 35A:
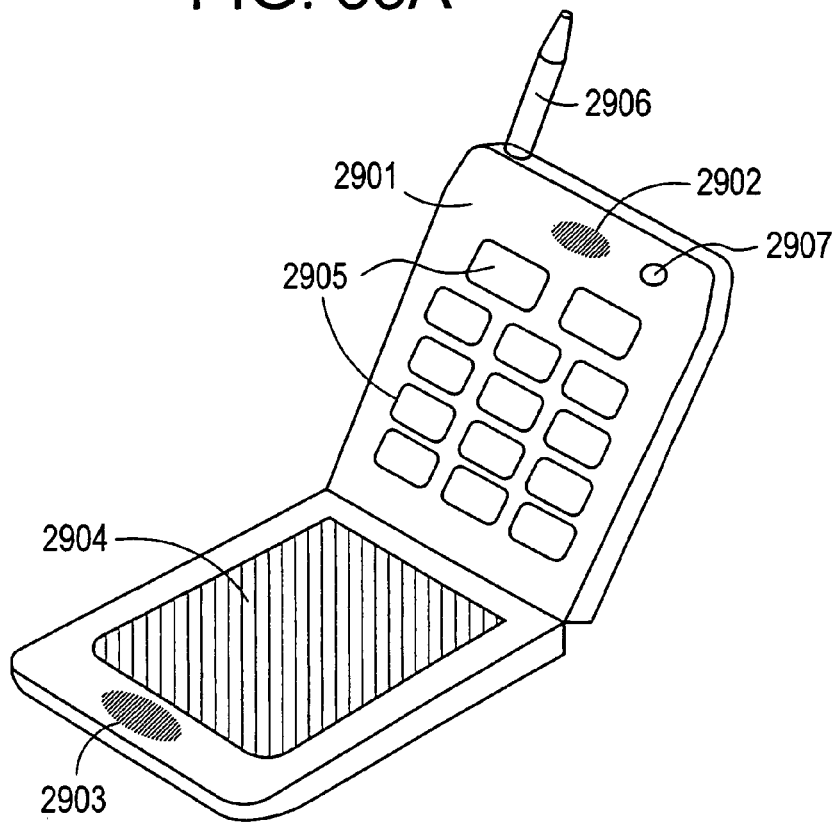
FIGS. 35A to 35C show examples of electronic equipment.

FIG. 35A is a mobile phone which comprises: a main body 2901; a voice output section 2902; a voice input section 2903;

a display section 2904; operation switches 2905; an antenna 2906; and an image input section (CCD, image sensor, etc.) 2907 etc.

Figure 35B:
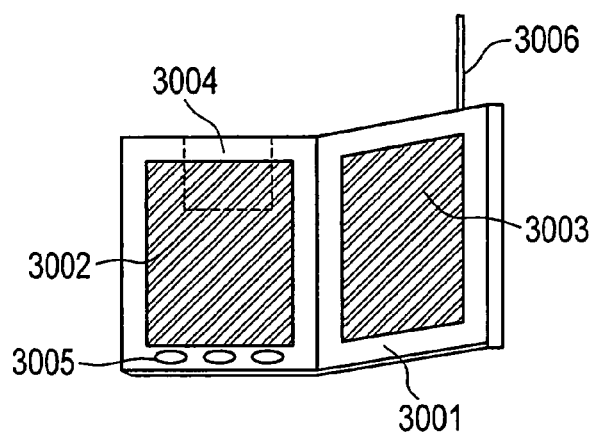

FIG. 35B is a portable book (electronic book) which comprises: a main body 3001; display sections 3002 and 3003; a recording medium 3004; operation switches 3005 and an antenna 3006 etc.

Figure 35C:
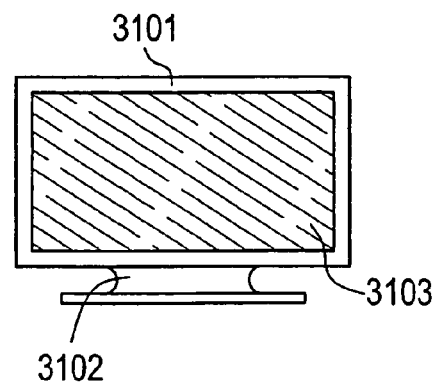

FIG. 35C is a display which comprises: a main body 3101; a supporting section 3102; and a display section 3103 etc.

As described above, the applicable range of the present invention is very large, and the invention can be applied to electronic apparatuses of various areas. Note that the electronic devices of the present example can be achieved by utilizing any combination of constitutions in Embodiments 1 to 12.

According to the present invention, in the case where crystallization is conducted by heat treatment and activation is conducted by a method other than heat treatment, the number of times of heat treatments at a high temperature can be twice (crystallization and gettering). In the case where crystallization is conducted by irradiation with strong light, and activation is conducted by a method other than heat treatment, the number of times of heat treatments at a high temperature can be once (gettering).

Furthermore, a high concentration of a rare gas element can be added to a semiconductor film in a short period of time (about one or two minutes). Therefore, compared with gettering using phosphorus, throughput is enhanced remarkably.

Furthermore, compared with gettering using phosphorus, a gettering ability of the present invention by addition of a rare gas element is high, and a rare gas element can be added in a high concentration (e.g., $1\times10^{20}$ to $5\times10^{21}/cm^3$). Therefore, the adding amount of a metal element used for crystallization can be increased. More specifically, by increasing the adding amount of a metal element used for crystallization, crystallization can be conducted in a shorter time. Furthermore, in the case where a crystallization time is not changed, by increasing the adding amount of a metal element used for crystallization, crystallization can be conducted at a lower temperature. Furthermore, by increasing the adding amount of a metal element used for crystallization, natural cores can be reduced, whereby a crystalline semiconductor film of good quality can be formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of manufacturing a semiconductor device comprising:
   forming an insulating layer over a substrate;
   forming a semiconductor film comprising amorphous silicon over the insulating layer;
   providing said semiconductor film with a material for promoting crystallization of silicon, said material comprising a metal element;
   crystallizing said semiconductor film provided with said material by irradiating said semiconductor film with first light;
   forming a film over the crystallized semiconductor film;
   forming a resist mask on the film;
   opening a selected region of the film by removing the film with the resist mask;
   introducing a rare gas element into the selected region while the resist mask remains; and
   heating the crystallized semiconductor film by irradiating the crystallized semiconductor film with second light so that the metal element contained in the crystallized semiconductor film is horizontally gettered to said selected region,
   wherein the rare gas element is added to the insulating layer.

2. The method according to claim 1 further comprising a step of removing said selected region.

3. The method according to claim 1 wherein each of said first light and said second light is emitted from a lamp selected from the group consisting of a halogen lamp, a metal halide lamp, a xenon arc lamp, a carbon arc lamp, a high-pressure sodium lamp, and a high-pressure mercury lamp.

4. The method according to claim 1 wherein said metal element is selected from the group consisting of Fe, Ni, Co, Ru, Rh, Pd, Os, Ir, Pt, Cu, and Au.

5. The method according to claim 1,
   wherein the film is a resist film.

6. The method according to claim 1,
   wherein the film is an insulating film.

7. A method of manufacturing a semiconductor device comprising:
   forming a blocking layer over a substrate;
   forming a semiconductor film comprising amorphous silicon over the blocking layer;
   providing said semiconductor film with a material for promoting crystallization of silicon, said material comprising a metal element;
   crystallizing said semiconductor film provided with said material by irradiating said semiconductor film with first light;
   forming a film over the crystallized semiconductor film;
   forming a resist mask on the film;
   opening a selected region of the film by removing the film with the resist mask;
   introducing a rare gas element into the selected region while the resist mask remains; and
   heating the crystallized semiconductor film by irradiating the crystallized semiconductor film with second light so that the metal element contained in the crystallized semiconductor film is horizontally gettered to said selected region,
   wherein the rare gas element is added to the blocking layer.

8. The method according to claim 7 further comprising a step of removing said selected region.

9. The method according to claim 7 wherein each of said first light and said second light is emitted from a lamp selected from the group consisting of a halogen lamp, a metal halide lamp, a xenon arc lamp, a carbon arc lamp, a high-pressure sodium lamp, and a high-pressure mercury lamp.

10. The method according to claim 7 wherein said metal element is selected from the group consisting of Fe, Ni, Co, Ru, Rh, Pd, Os, Ir, Pt, Cu, and Au.

11. The method according to claim 7,
    wherein the film is a resist film.

12. The method according to claim 7,
    wherein the film is an insulating film.

13. A method of manufacturing a semiconductor device comprising:
    forming an insulating layer over a substrate;
    forming a semiconductor film comprising amorphous silicon over the insulating layer;
    providing said semiconductor film with a material for promoting crystallization of silicon, said material comprising a metal element;

crystallizing said semiconductor film provided with said material by irradiating said semiconductor film with first light;

increasing crystallinity of the crystallized semiconductor film by irradiating the crystallized semiconductor film with second light;

forming a film over the crystallized semiconductor film;

forming a resist mask on the film;

opening a selected region of the film by removing the film with the resist mask;

introducing a rare gas element into the selected region while the resist mask remains; and heating the crystallized semiconductor film by irradiating the crystallized semiconductor film with third light so that the metal element contained in the crystallized semiconductor film is horizontally gettered to said selected region, wherein the rare gas element is added to the insulating layer.

14. The method according to claim 13 further comprising a step of removing said selected region.

15. The method according to claim 13 wherein each of said first light and said third light is emitted from a lamp selected from the group consisting of a halogen lamp, a metal halide lamp, a xenon arc lamp, a carbon arc lamp, a high-pressure sodium lamp, and a high-pressure mercury lamp.

16. The method according to claim 13 wherein said metal element is selected from the group consisting of Fe, Ni, Co, Ru, Rh, Pd, Os, Ir, Pt, Cu, and Au.

17. The method according to claim 13,
wherein the film is a resist film.

18. The method according to claim 13,
wherein the film is an insulating film.

* * * * *